(12) United States Patent
Agazzi

(10) Patent No.: US 7,336,729 B2
(45) Date of Patent: Feb. 26, 2008

(54) DIGITAL SIGNAL PROCESSING BASED DE-SERIALIZER

(75) Inventor: Oscar E. Agazzi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 997 days.

(21) Appl. No.: 10/086,267

(22) Filed: Mar. 1, 2002

(65) Prior Publication Data

US 2002/0122503 A1    Sep. 5, 2002

Related U.S. Application Data

(60) Provisional application No. 60/290,263, filed on May 11, 2001, provisional application No. 60/273,215, filed on Mar. 1, 2001.

(51) Int. Cl.
*H04L 27/06*    (2006.01)
(52) U.S. Cl. ........................................ 375/316; 341/118
(58) Field of Classification Search ................ 375/316; 341/118, 120
See application file for complete search history.

(56) References Cited

U.S. PATENT DOCUMENTS

| | | | | |
|---|---|---|---|---|
| 4,968,988 | A * | 11/1990 | Miki et al. | 341/141 |
| 5,239,299 | A * | 8/1993 | Apple et al. | 341/118 |
| 5,294,926 | A * | 3/1994 | Corcoran | 341/120 |
| 5,590,659 | A * | 1/1997 | Hamilton et al. | 600/447 |
| 5,671,253 | A * | 9/1997 | Stewart | 375/316 |
| 5,705,949 | A * | 1/1998 | Alelyunas et al. | 329/304 |
| 5,965,819 | A * | 10/1999 | Piety et al. | 73/660 |
| 5,982,819 | A * | 11/1999 | Womack et al. | 375/316 |
| 6,009,120 | A * | 12/1999 | Nobakht | 375/229 |

(Continued)

FOREIGN PATENT DOCUMENTS

EP    0 617 521 A2    9/1994

(Continued)

OTHER PUBLICATIONS

High-speed VLSI implementation of reduced complexity sequence estimation algorithms with application to Gigabit Ethernet 1000Base-T; Haratsch, E.F.; VLSI Technology, Systems, and Applications, 1999. Int'l Symposium on Jun. 8-10, 1999 pp. 171-174.*

(Continued)

*Primary Examiner*—Temesghen Ghebretinsae
(74) *Attorney, Agent, or Firm*—Garlick Harrison & Markison; Shayne X. Short

(57) ABSTRACT

A DSP based SERDES performs compensation operations to support high speed de-serialization. A receiver section of the DSP based SERDES includes one or more ADCs and DSPs. The ADC operates to sample (modulated) analog serial data and to produce digitized serial data (digital representation of the modulated analog serial data). The DSP communicatively couples to the ADC and receives the digitized serial data. Based upon the known characteristics of the digitized serial data and the digitized serial data itself, the DSP determines compensation operations to be performed upon the serial data to compensate for inadequacies of the receiver and/or channel response. These compensation operations may be (1) performed on the analog serial data before digitization by the ADC; (2) applied to the ADC to modify the operation of the ADC; and/or (3) performed on the digitized serial data by the DSP or another device.

184 Claims, 26 Drawing Sheets

U.S. PATENT DOCUMENTS

| | | | |
|---|---|---|---|
| 6,075,814 A | 6/2000 | Yamano et al. | |
| 6,081,215 A * | 6/2000 | Kost et al. | 341/120 |
| 6,198,416 B1 * | 3/2001 | Velazquez | 341/118 |
| 6,330,290 B1 * | 12/2001 | Glas | 375/324 |
| 6,363,112 B1 * | 3/2002 | Azadet et al. | 375/233 |
| 6,377,640 B2 * | 4/2002 | Trans | 375/354 |
| 6,438,163 B1 * | 8/2002 | Raghavan et al. | 375/233 |
| 6,621,862 B1 * | 9/2003 | Dabell | 375/229 |
| 6,678,319 B1 * | 1/2004 | Jamali | 375/234 |
| 6,731,683 B1 * | 5/2004 | Fiedler et al. | 375/232 |
| 6,795,494 B1 * | 9/2004 | Phanse et al. | 375/219 |
| 6,859,508 B1 * | 2/2005 | Koyama et al. | 375/348 |
| 6,894,630 B1 * | 5/2005 | Massie et al. | 341/118 |
| 6,934,387 B1 * | 8/2005 | Kim | 379/406.08 |

FOREIGN PATENT DOCUMENTS

| | | |
|---|---|---|
| EP | 1 006 697 A2 | 6/2000 |

OTHER PUBLICATIONS

A 1-Gb/s joint equalizer and trellis decoder for 1000BASE-T Gigabit Ethernet; Azadet, K. et al; Solid-State Circuits, IEEE Journal of vol. 36, Issue 3, Mar. 2001 pp. 374-384.*

Low-power equalizer architectures for high speed modems Azadet, K. et al; Communications Magazine, IEEE vol. 36, Issue 10, Oct. 1998 pp. 118-126.*

A gigabit transceiver chip set for UTP CAT-6 cables in digital CMOS technology Azadet, K. et al; Solid-State Circuits Conference, 2000 Digest of Technical Papers. ISSCC. 2000 IEEE International Feb. 7-9, 2000 pp. 306-307.*

Gigabit Ethernet over unshielded twisted pair cables Azadet, K.; VLSI Technology, Systems and Applications, 1999. International Symposium on Jun. 8-10, 1999 pp. 167-170.*

A DSP based receiver for 1000BASE-T PHY; Runsheng He; Nazari, N.; Sutardja, S.; Solid-State Circuits Conference, 2001. Digest of Technical Papers. ISSCC. 2001 IEEE International Feb. 5-7, 2001 pp. 308-309, 458.*

A CMOS transceiver analog front-end for gigabit ethernet over CAT-5 cables Roo, P.et al; Solid-State Circuits Conference, 2001. Digest of Technical Papers. ISSCC. 2001 IEEE International Feb. 5-7, 2001 pp. 310-311, 458.*

W. Ellersick, C. K. Yang, M. Horowitz, and W. Dally, "GAD: A 12GS/s CMOS 4-bit A/D Converter for an Equalized Multi-Level Link," 1999 Symposium on VLSI Circuits, pp. 49-52.

W. Ellersick, C. K. Yang, V. Stojanovic, S. Modjtahedi, and M. A. Horowitz, "A Serial-Link Transceiver Based on 8Gsample/s A/D and D/A Converters in 0.25 um CMOS," 2001 IEEE International Solid-State Circuits Conference, San Francisco, Feb. 2001, 3 pages.

C. K. Yang, V. Stojanovic, S. Modjtahedi, M. A. Horowitz, and W. F. Ellersick, "A Serial-Link Transceiver Based on 8Gsample/s A/D and D/A Converters in 0.25 um CMOS," IEEE Journal of Solid-State Circuits, vol. 36, No. 11, Nov. 2001, pp. 1684-1692.

C. S. G. Conroy, D. W. Cline, and P. R. Gray, "An 8-b 85MS/s Parallel Pipeline AID Converter in 1 um CMOS," IEEE Journal of Solid-State Circuits, vol. 28, No. 4, Apr. 1993, pp. 447-454.

J-E. Eklund and F. Gustafsson, "Digital Offset Compensation of Time-Interleaved ADC Using Random Chopper Sampling," International Symposium on Circuits and Systems, May 28-31, 2000, Geneva, Switzerland, pp. III-447-III-450.

Y-C. Jeng, "Digital Spectra of Nonuniformly Sampled Signals: A Robust Sampling Time Offset Estimation Algorithm for Ultra High-Speed Waveform Digitizers Using Interleaving." IEEE Transactions on Instrumentation and Measurements, vol. 39, No. 1, Feb. 1990, pp. 71-75.

D. Fu, K. C. Dyer, S. H. Lewis, and P. J. Hurst, "A Digital Background Calibration Technique for Time-Interleaved Analog-to-Digital Converters," IEEE Journal of Solid-State Circuits, vol. 33, No. 12, Dec. 1998, pp. 1904-1911.

C. K. Yang, "Design Techniques for High-Speed Chip-to-Chip Links," http://web.doe.carleton.ca/courses/97578/topic5/Tutorial_SerialLink.pdf, 31 pages.

W. J. Dally and J. Poulton, "Transmitter Equalization for 4Gb/s Signalling," Proceedings of Hot Interconnects IV, Palo Alto, 1996, 10 pages.

W. C. Black and D. A. Hodges, "Time Interleaved Converter Arrays," IEEE Journal of Solid-State Circuits, vol. SC-15,No. 6, Dec. 1980, pp. 1022-1029.

A. Petraglia and S. K. Mitra, "Analysis of Mismatch Effects Among A/D Converters in a Time-Interleaved Waveform Digitizer," IEEE Transactions on Instrumentations and Measurements, vol. 40, No. 5, Oct. 1991, pp. 831-835.

S. Kasturia and J. H. Winters, "Techniques for High-Speed Implementation of Nonlinear Cancellation," IEEE Journal on Selected Areas in Communications, vol. 9, No. 5, Jun. 1991, pp. 711-717.

* cited by examiner

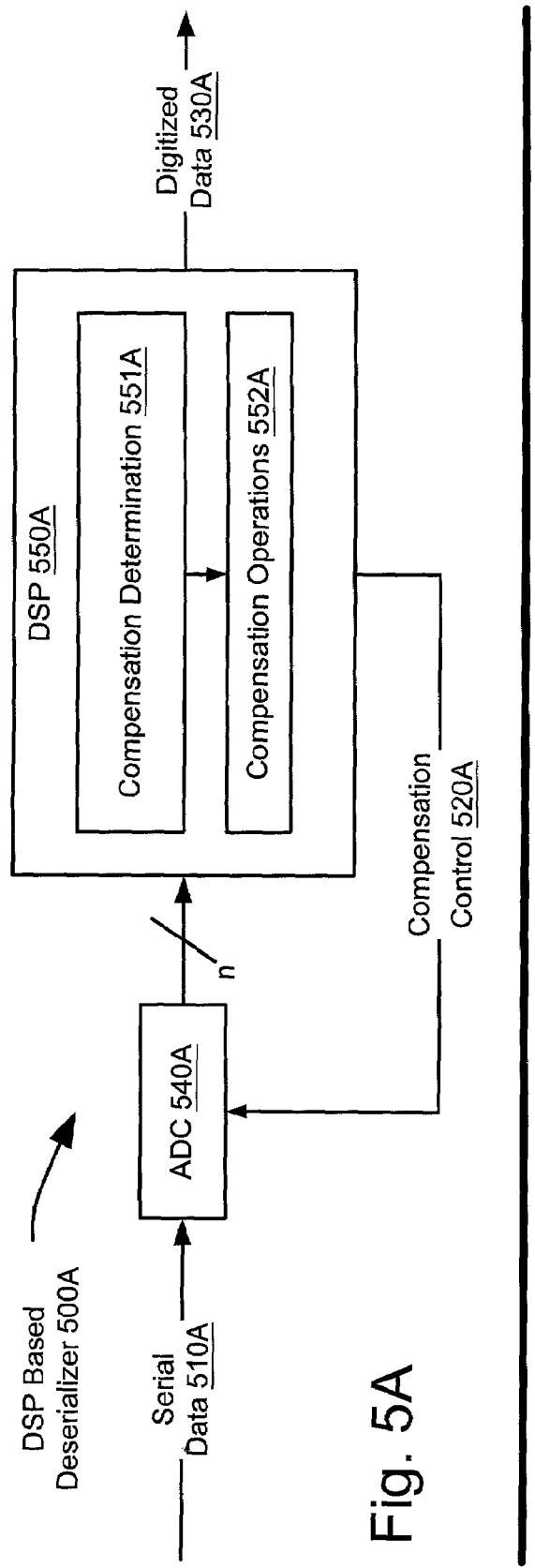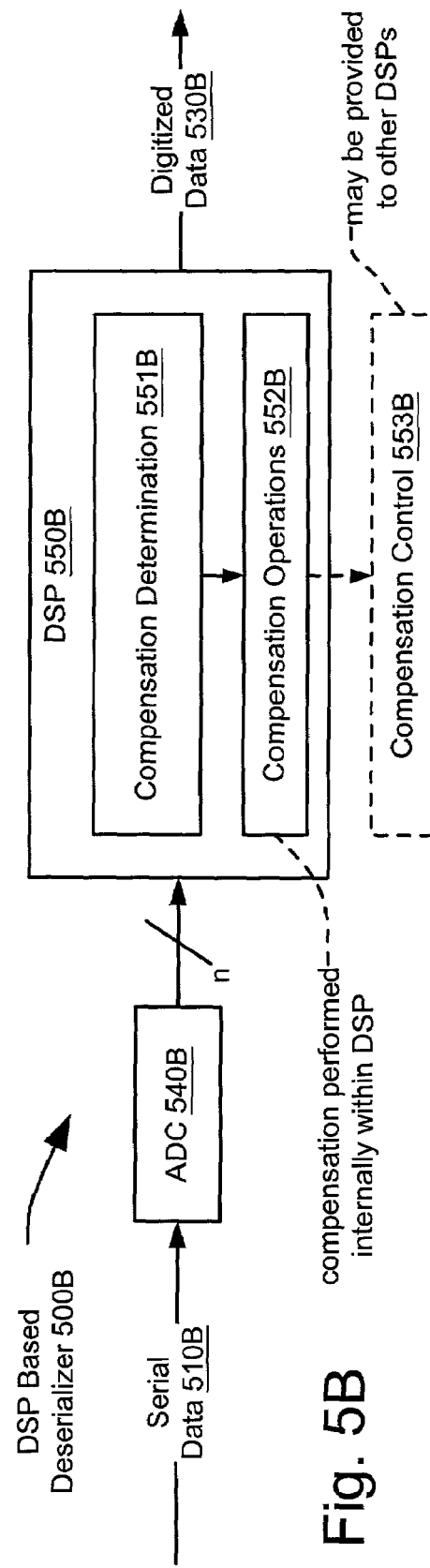

DIGITAL SIGNAL PROCESSING BASED DE-SERIALIZER

CROSS REFERENCE TO RELATED APPLICATIONS

The present application claims priority pursuant to 35 U.S.C. § 119(e) to U.S. Provisional Patent Application Ser. No. 60/273,215, filed Mar. 1, 2001, pending, which is hereby incorporated herein by reference in its entirety and is made part of the present U.S. Patent Application for all purposes.

The present application also claims priority pursuant to 35 U.S.C. § 119(e) to U.S. Provisional Patent Application Ser. No. 60/290,263, filed May 11, 2001, pending, which is hereby incorporated herein by reference in its entirety and is made part of the present U.S. Patent Application for all purposes.

The following U.S. Patent Applications are hereby incorporated herein by reference in their entirety and made part of the present U.S. Patent Application for all purposes:

1. U.S. Utility patent application Ser. No. 09/844,441, entitled, "HIGH-SPEED SERIAL DATA TRANSCEIVER AND RELATED METHODS," filed Apr. 30, 2001.

2. U.S. Utility patent application Ser. No. 10/085,071, entitled "METHODS AND SYSTEMS FOR DSP-BASED RECEIVERS," filed Mar. 1, 2002.

TECHNICAL FIELD OF THE INVENTION

The invention relates generally to de-serialization of serial data streams; and, more particularly, it relates to digital signal processing based de-serialization.

BACKGROUND OF THE INVENTION

A conventional trend within communications technologies towards trying to achieve higher and higher operating rates has largely been geared towards employing wide parallel bus architectures. These implementations inherently consume a great deal of real estate. In chip-to-chip applications, one of the greatest consumers of real estate includes the wide parallel interconnections themselves that enable the communication and interconnection between the various devices. The constant increases in complexity and speed of digital hardware has turned the problems of interconnecting components increasingly difficult in contexts such as chip-to-chip, connections between multiple circuit boards across back planes, and other connections having a need for high speed communication while also being constrained by real estate and space.

Moreover, aside from the higher data rates desired in the industry, as the complexity of chips continues to increase, there is also commonly an associated requirement to provide a larger number of interconnections. Again, to ensure higher data communication rates, there is often the trend towards providing broad bus width interconnections between the devices.

One conventional approach to arrive at these high communication rates while also trying to address the design considerations of conserving space and real estate is to employ high-speed serial interconnections. A single high-speed serial interconnection may replace a large number of lower speed interconnections. As a result, a high-speed serial interconnection is largely more space and real estate conserving than parallel type interconnections. For this reason, many industries, including the computer and communications industries, have begun the use of high-speed serial transceivers for many applications including chip-to-chip and board-to-board applications. These transceivers, that may be referred to as SERDES (serializer-de-serializer) run at speeds of several hundred Mega-bits per second (Mb/s) to Giga-bits per second (Gb/s). Some products recently introduced run at data rates of 3.125 Gb/s. These SERDES interconnections are commonly implemented using analog based technology. All of the modulation/demodulation in these conventional SERDES is performed in the analog domain. A most common approach to modulation is to perform the modulation/demodulation using baseband signal processing.

However, these conventional developments fail to provide designs that operate at rates sufficiently high for many customer needs and desires. As the data rates increase, the impairments of the transmission medium become more and more important. For example, in the case of a micro-strip transmission line in a printed circuit (PC) board, dispersion (caused by the bandwidth limitations of the transmission line) causes inter-symbol interference (ISI); discontinuities in the transmission line cause reflections which also result in ISI; capacitive coupling between neighboring traces on the PC board causes crosstalk, and other deficiencies as well. Advanced signal processing techniques such as equalization and crosstalk cancellation have been applied for several decades to control similar impairments in communications systems such as voice-band modems, transceivers for the digital subscriber loop, Ethernet transceivers, and so on. However, with the only exception of the most straightforward situations, these techniques are too complex to be implemented using analog circuit design.

In addition, the analog implementation of SERDES may not be easily scaled to integrated circuit (IC) manufacturing technology of smaller dimensions. For example, a recent trend in Complementary Metal Oxide Semiconductor (CMOS) technology has been from a minimum feature size of 0.18 μm to 0.13 μm. Design engineers find the analog implementation of analog based SERDES extremely difficult. As the processing dimensions continue to decrease this situation will only get worse. The inherent non-scalability of analog based SERDES is a major limitation of the existing SERDES art.

The inability of analog based SERDES technology to enable advanced modulation, error correction and signal processing creates a situation where the fundamental limits of data rate that may be supported in backplane interconnections and other SERDES applications may never fully be realized. An analog based SERDES simply does not offer enough capabilities to enable such high data transfer rates.

Further limitations and disadvantages of conventional and traditional systems will become apparent to one of skill in the art through comparison of such systems with the invention as set forth in the remainder of the present application with reference to the drawings.

BRIEF SUMMARY OF THE INVENTION

In order to overcome the above-described and other shortcomings of prior devices, a digital signal processing (DSP) based SERDES performs compensation operations so that it can support high speed deserialization. A receiver section of the DSP based SERDES includes an analog to digital converter (ADC) and a DSP. The ADC operates to sample (modulated) analog serial data and to produce digitized serial data (digital representation of the modulated analog serial data). The DSP communicatively couples to the ADC and receives the digitized serial data. Based upon the known characteristics of the digitized serial data and the digitized serial data itself, the DSP determines compensation operations that are to be performed upon the serial data to compensate for inadequacies of the receiver and/or channel response. These compensation operations may be (1) performed on the analog serial data before being digitized by the ADC; (2) applied to the analog to digital converter to modify the operation of the analog to digital converter; and/or (3) performed on the digitized serial data by the DSP or another device.

The DSP based SERDES of the present invention may be applied to any serial interface. For example, the DSP based SERDES may interface circuit boards to one another. Further, the DSP based SERDES may interface ICs to one another. These ICs may or may not reside on the same circuit board. Thus, the DSP based SERDES of the present invention has wide applicability across a variety of applications and contexts.

The DSP within the DSP based SERDES is able to compensate adaptively for non-uniformities among various interleaves of an ADC array, or possible non-uniformities among various other elements within an analog front-end (AFE). As an input signal enters into the various interleaves of the present invention, various offsets mismatches of the different interleaved paths may need compensation. The use of DSP techniques to compensate for these various offsets, that may be generated by the non-uniformities of the various interleaves, enable an extremely fast operating DSP based SERDES. The DSP compensation techniques allow for adaptive compensation of these interleave generated offset mismatches. The ADC and AFE may have such impairments, in the case of an interleaved array, that may cooperatively generate fixed pattern noise. While this fixed pattern noise will not be existent within the input signal to the DSP based SERDES, the interleaved implementation that makes possible the use of such higher speed operation SERDES, may undesirably create this fixed pattern noise. However, the use of DSP correction techniques is operable to overcome these effects. The DSP compensation techniques are able to compensate for gain, sampling phase and offset errors in the interleaved array that may lead to the fixed pattern noise.

Again, the DSP implemented compensation according to the present invention is typically implemented in an adaptive embodiment. There need be no prior knowledge of the specific values of impairments to the interleaves (being ADCs, other portions of the AFE, and/or channel impairments). The DSP techniques are able to identify the appropriate compensation and to perform that compensation adaptively. The adaptive DSP compensation implementation is applicable for both channel impairments and impairments of the ADCs and/or other portions of the AFE.

In some other cases, the DSP functions of the DSP based SERDES may be to compensate for the impairments that have been induced by the communication channel. The present invention is able to compensate for effects of channel impairment in the form of crosstalk. The present invention is able to compensate for near-end crosstalk (NEXT) and far-end crosstalk (FEXT). That is to say, the present invention is able to compensate for NEXT (which is signal transfer level at the near, close end of the communication link) of the DSP based SERDES and also for FEXT (which is crosstalk of the signal at the far end of the communication link) of the DSP based SERDES.

In many SERDES applications the communication channel is a trace on a PC board; however, there may be other possibilities in which at least two devices may be communicatively coupled that may benefit from the present invention. For example, two devices may be communicatively coupled via twisted pair cabling, coaxial cabling, and/or twin-ax cabling, among others. As mentioned before, these impairments may include ISI, crosstalk (that may include FEXT and/or NEXT), and noise among other deficiencies. ISI can be compensated using a digital equalizer, which could be, for example, a feed-forward equalizer (FFE), a decision-feedback equalizer (DFE), a Viterbi equalizer, etc. Crosstalk can be compensated using a crosstalk canceller. In order to provide a low bit error rate in situations where the channel is very noisy, it may be necessary to incorporate convolutional, trellis or block coding. Then the receiver may incorporate a convolutional, trellis, or block decoder. These decoders can be implemented effectively using digital processing techniques.

While the use of a DSP based receiver brings enormous advantages to SERDES technology, it also brings a major challenge in the need to provide for analog to digital conversion at very high speeds. Thus far, it has not been possible to implement ADCs that operate at sampling rates in the GHz range, particularly within cost-effective technologies such as CMOS. The present invention provides for techniques to enable the implementation of such high-rate ADCs. The high-speed operation of the ADC is a key enabler for DSP based SERDES technology. The present invention uses a DSP to compensate for impairments of the ADC. While it is not possible with current technology to implement a stand-alone high-speed ADC with adequate performance to be used as the front-end for a DSP based SERDES, the present invention provides techniques to digitally compensate for the impairments of ADCs of the type that can be implemented in current technology. Therefore, the DSP-based compensation of ADC impairments, performed according to the present invention, enables the implementation of DSP based SERDES technology.

One possible technique that may be used to implement high-speed analog to digital conversion is to employ a number of ADCs in an interleaving arrangement. To achieve a high effective sampling rate, an array of lower speed ADCs may be used. Each ADC in the array samples and digitizes the input signal sequentially, with a time interval between two consecutive ADCs being equal to the period of the high sampling frequency. Although interleaved arrays of ADCs can in theory achieve arbitrarily high effective sampling rates, they are in practice limited by what is known as fixed pattern noise.

Fixed pattern noise is the result of mismatches in the properties of the ADCs that form the interleaved array. For example, different ADCs may have slightly different gains. In a non-interleaved ADC, a gain error is generally acceptable, and this is particularly true in communications applications. However, in an interleaved ADC array, independent gain errors for different ADCs in the array result in an amplitude modulation of the input signal with a periodic waveform whose frequency is equal to the sampling rate divided by the number of ADCs in the array. This amplitude modulation can have severe detrimental effects on the performance of the receiver.

Another form of fixed pattern noise is caused by random sampling phase errors for the different ADCs in the array. These errors result in a periodic sampling jitter, whose frequency is again equal to the sampling rate divided by the number of ADCs in the array. In an entirely similar way, mismatched offsets in the individual ADCs can also cause yet another form of fixed pattern noise.

One purpose of the DSP-performed compensation operations of the DSP based SERDES is to remove fixed pattern noise from the modulated serial data. The DSP determines compensation operations that substantially eliminate all of the introduced fixed pattern noise.

The DSP based SERDES may also include a programmable gain amplifier (PGA) that communicatively couples to the ADC and that operates upon the modulated serial data in its analog format prior to its digitization by the ADC. In such case, the DSP determines compensation that is applied to the PGA. In the case of an interleaved ADC array, there may be a single PGA controlling the gain for all the interleaves, or there may be a separate PGA for each interleave. In the latter case, if the gain of each PGA is controlled independently, it is possible to compensate for mismatches in the gains of the different ADCs in the interleaved array. The DSP must be able to determine the correct amount of compensation to be applied to each ADC, and apply the appropriate compensation control signal to the associated PGA.

Although the individual ADCs may still have a gain error, the combination of the PGA and the ADC does not. The key idea that makes this compensation possible is the use of independent automatic gain control (AGC) loops for each interleave in the array. The DSP computes a different gain error for each interleave, and the independent AGC loops force all gain errors to zero. This would not be possible if a single gain error were computed for all interleaves, since in this case the (single) AGC loop would at most be able to force the average of all gain errors to zero, but not each one of them individually. In a similar way, it is possible to compensate for sampling phase errors of the individual ADCs by applying an independent phase control to the sampling clock of each interleave, instead of a common control. The sampling clock in a communications receiver is typically controlled by the Timing Recovery subsystem. If instead of a single Timing Recovery subsystem whose control is applied to all ADCs, the receiver has independent Timing Recovery loops for each interleave, it is possible to control separately and independently the sampling clocks associated with each ADC in the array, and independently compensate for sampling phase errors which may be different for each interleave.

To accomplish this, different phase errors must be computed by the DSP for each interleave, and these phase errors must be applied to separate Timing Recovery loops. These independent loops can therefore force all phase errors to zero. This would not be possible if a single phase error were computed and applied to a single Timing Recovery subsystem, since a single loop would at most be able to force the average phase error to zero, but not the phase error for each interleave individually. In an entirely similar way, it is possible to use independent offset cancellation loops for each ADC in the array to compensate for offset mismatches in the ADCs. These techniques allow fixed pattern noise to be compensated. Notice that these techniques take advantage of the fact that gain, phase, and offset have to be controlled in a communications receiver, regardless of what type of ADC is used. By using separate control loops it is possible to take advantage of functions that already exist in a communications receiver to compensate for impairments of the ADC. These compensation techniques make the implementation of very high sampling rate ADCs possible. Although in the examples presented before we have described compensation techniques that are implemented partly in the analog domain and partly in the digital domain, it is also possible to compensate the impairments of the ADC entirely in the digital domain. Examples of techniques implemented entirely in the digital domain will be presented later. With these operations available, the DSP selects at least one compensation option from the plurality of compensation options to compensate the serial data. These compensation options may be compensation operations performed by the DSP and/or compensation controls to be applied to the ADC, the PGA, or another device that operates upon the serial data.

In one particular operation, the DSP components within the DSP based SERDES produce a compensation control that is applied to the ADC. In operating to determine the compensation to be applied, the DSP based SERDES characterizes the digital data according to one or more of gain, phase, and offset. Based upon these characteristics, the DSP determines at least one of an error in gain, an error in phase, or an error in offset. These errors are used to produce compensation that is applied to the ADC to adjust its operation.

In one embodiment of the ADC, a single ADC converts the modulated serial data to digitized modulated serial data. However, in other embodiments, a plurality of ADCs performs this conversion process. Each ADC within the plurality of ADCs performs digital sampling at a different sampling instant. The compensation determined by the DSP may include a compensation operation that involves adjusting a first operational parameter of a first ADC and a second operational parameter of a second ADC. The first operational parameter and the second operational parameter may be a common operational parameter or different operational parameters. Either one or both of the first operational parameter and the second operational parameter includes at least one of a gain, a phase, and an offset.

In another embodiment of the ADC that includes a plurality of ADCs, the analog serial data is partitioned into a number of channels such that each channel of a number of channels communicatively couples to one ADC. The DSP based SERDES may also include a number of PGAs where the analog serial data is simultaneously fed to each PGA within the number of PGAs, and the outputs of the number of PGAs form the plurality of channels.

The DSP based SERDES may also include one or more of a FFE, a feedback equalizer (FBE), and a DFE. The DSP based SERDES may also include a decoder. The decoder may include one of more or a Viterbi decoder, a convolutional decoder, a block code decoder, and a trellis decoder.

The present invention overcomes the deficiencies in the existing art that has prevented the implementation of DSP circuitry within the context of SERDES. The existing art of ADCs has prevented their use in high-speed applications such as SERDES. The design of SERDES has, until now, been largely dependent on the speed at which analog based technologies can presently operate. There has, until now, been an inability to operate ADCs at speeds sufficient for integration into SERDES applications. The present invention is operable to interleave a number of ADCs in parallel, thereby providing very high effective bit rates for data transfer. In addition, in the context of data communications applications, various parameters (including signal types, channel responses, and coding methods) may be ascertained with a high degree of accuracy, which provides for a very effective solution.

For example, in one embodiment, an effective sampling rate of 10 GHz can be achieved with 8 interleaved ADCs each running at 1.25 GHz. In addition, due to the process variations (e.g., non-uniformities) in fabricating the ADCs, a single ADC (even if it could operate at a very high sampling rate) or a bank of ADCs, would not work very well without the addition of the compensation functionality according to the present invention to effectuate its operation.

The present invention also solves many of the difficulties in integrating the ADC array, in light of the mismatches in gain, offset, and sampling phases for each interleaved ADC that can create fixed pattern noise. Before the present invention, these mismatch problems often degraded the performance of the overall ADC so greatly that its application was practically useless. From certain perspectives, the manner of implementation of such an ADC, borrowing upon DSP techniques, and also within the context of data communications receivers, allows for special advantages in combating this fixed pattern noise associated problems. In one embodiment, certain AGC, offset cancellation, and timing recovery feedback loops are used for each ADC in the interleaved array. Particular advantage may be made to perform the adaptation/compensation feedback control in the context of data communications receivers, again borrowing on the foreknowledge of many of the parameters affecting the signals coming into each ADC in the interleaved array. The present invention enables and makes feasible, for the first time, the implementation of DSP based transceivers for high-speed data communications rates that approach multiple Gbit/s.

Other aspects of the present invention are operable to overcome yet another problem existent in the prior art of the mere inability to employ DSP functionality, including equalization and synchronization among other DSP techniques, within high-speed transceivers. The present invention employs parallel processing techniques to solve many of these problems. This parallel processing allows very high-speed transceivers to be implemented using relatively moderate clock speeds.

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

A better understanding of the invention can be obtained when the following detailed description of various exemplary embodiments is considered in conjunction with the following drawings.

FIG. 5A is a system diagram illustrating another embodiment of a DSP based de-serializer that is built according to the present invention.

FIG. 5B is a system diagram illustrating another embodiment of a DSP based de-serializer that is built according to the present invention.

DETAILED DESCRIPTION OF THE INVENTION

Great effort has been made in the arena of parallel processing implementations of DSP. The present invention particularly employs adaptive DSP compensation techniques to enable very high-speed SERDES operation.

Figure 1:
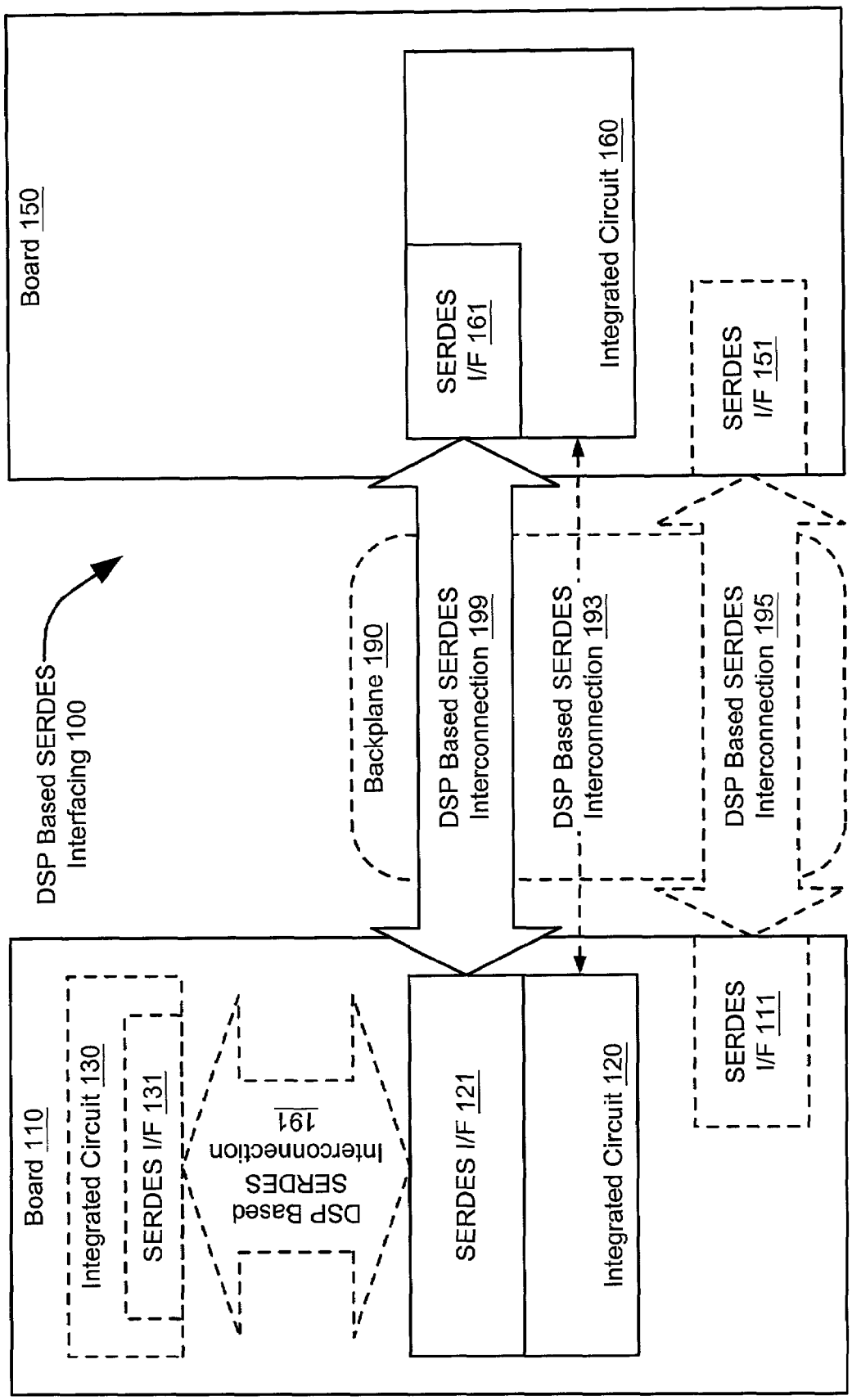
FIG. 1 is a system diagram illustrating various embodiments of DSP based SERDES that is built according to the present invention.

FIG. 1 is a system diagram illustrating an embodiment of DSP based SERDES interfacing 100 that is built according to the present invention. The DSP based SERDES interfacing 100 is operable to perform chip to chip interfacing on a single board, chip to chip interfacing between multiple boards, and also board to board interfacing in various embodiments. In one instance, a board 100 and a board 150 communicatively couple via a DSP based SERDES interconnection 195 that is employed according to the present invention. This DSP based SERDES interconnection 195 may very well be implemented through a back plane 190 to which each of the boards 110 and 150 are connected. Each of the boards 110 and 150 has a SERDES interface circuitry 111 and 151, respectively. The SERDES interface circuitries 111 and 151 on the boards 110 and 150 are operable to interconnect to any other devices on the boards 111 and 151, including various ICs on the boards. Moreover, the applicability of the DSP based SERDES interfacing 100 may equally be performed in connecting twisted pair cabling, coaxial cabling, and/or twin-ax cable without departing from the scope and spirit of the invention. The present invention is generically envisioned within any communication interface between at least two elements.

Alternatively, a DSP based SERDES interconnection 199, that may also be implemented through the back plane 190, may communicatively couple two different ICs 120 and 160 on the boards 110 and 150. Each of the ICs 120 and 160 are operable to interface to the DSP based SERDES interconnection 199 using SERDES interface circuitry 121 and 161, respectively. The SERDES interfacing circuitry 121 is placed very closely to the IC 120, and the SERDES interfacing circuitry 161 is resident as part of the IC 160.

Moreover, a DSP based SERDES interconnection 193 may be used to interface directly between two ICs, such as the ICs 120 and 160. In this situation, the ICs 120 and 160 themselves include the proper interfacing functionality. This is often the case is many IC application, where the interfacing is embedded in the IC, requiring only an interconnection and the DSP based functionality is provided within the IC having the receiver to receive data via the DSP based SERDES interconnection 193.

Moreover, the present invention is operable to provide for interconnection between multiple various ICs on a single board as well. For example, the IC 120 is operable to communicatively couple to an IC 130 via a DSP based SERDES interconnection 191 on the board 110. In this example, a SERDES interface circuitry 131 is resident on the IC 130; the DSP based SERDES interconnection 191 communicatively couples to the SERDES interface circuitry 131 (that communicatively couples to the IC 130) and the SERDES interface circuitry 121 (that communicatively couples to the IC 120).

Those having skill in the art will recognize that the DSP based SERDES interconnections, built in accordance with the present invention, are operable to perform high-speed interfacing between a whole host of devices, boards, and circuitries.

Figure 2:
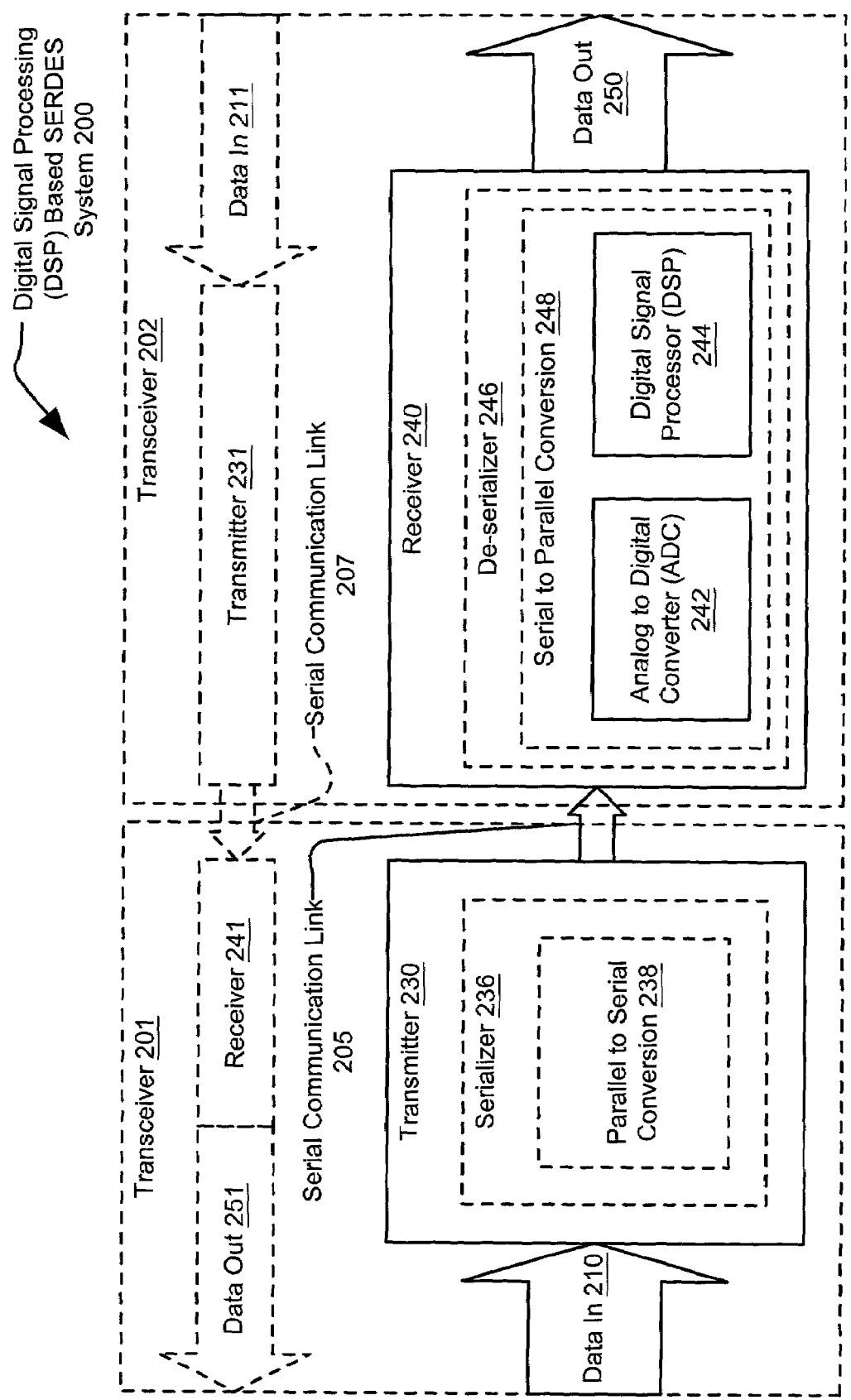
FIG. 2 is a system diagram illustrating an embodiment of a DSP based SERDES system that is built according to the present invention.

FIG. 2 is a system diagram illustrating an embodiment of a DSP based SERDES system 200 that is built according to the present invention. The DSP based SERDES system 200 is operable to perform communication between a transceiver 201 and a transceiver 202; each of the transceivers 201 and 202 includes a transmitter and a receiver. More specifically, the DSP based SERDES system 200 is operable to perform communication between a transmitter 230 and a receiver 240 via a serial communication link 205. The transmitter 230 is operable to receive data in 210, and if necessary, to perform a parallel to serial conversion (as shown in a functional block 238) of the data in 210 using a serializer 236. The receiver 240 is operable to receive the serialized data and to perform de-serialization using the de-serializer 246. The de-serializer 246 is operable to perform serial to parallel conversion, as shown in a functional block 248. The receiver 240 employs an ADC 242 and a DSP 244 to perform the de-serialization of the data to generate data out 250. The ADC 242 and the DSP 244 operate cooperatively. In certain embodiments, several ADCs perform the analog to digital conversion of the data received via the serial communication link 205. In addition, multiple DSPs may be employed to perform DSP functionality and related mathematical processing on the digital data without departing from the scope and spirit of the invention.

The DSP 244 is able to perform adaptive compensation for non-uniformities among various interleaves of the ADC 242 (that may include an ADC array), or possible non-uniformities among various other elements within an analog front-end (AFE) of the receiver 240. As an input signal enters into the various interleaves of the present invention, various offsets mismatches of the different interleaved paths may need compensation. The use of DSP 244 to perform compensation for these various offsets, that may be generated by the non-uniformities of the various interleaves, to enable an extremely fast operating DSP based SERDES. The DSP compensation techniques allow for adaptive compensation of these interleave generated offset mismatches. The ADC 242 and an AFE may have such impairments, in the case of an interleaved array, that may cooperatively generate fixed pattern noise. While this fixed pattern noise will not be existent within the input signal to the DSP based SERDES, the interleaved implementation that makes possible the use of such higher speed operation SERDES, may undesirably create this fixed pattern noise. However, the use of DSP correction techniques is operable to overcome these effects. The DSP compensation techniques are able to compensate for gain, sampling phase and offset errors in the interleaved array that may lead to the fixed pattern noise.

Again, the DSP 244 is implemented to perform compensation according to the present invention in an adaptive embodiment. There need be no prior knowledge of the specific values of impairments to the interleaves (being ADCs, other portions of the AFE, and/or channel impairments). The DSP techniques are able to identify the appropriate compensation and to perform that compensation adaptively. The adaptive DSP compensation implementation is applicable for both channel impairments and impairments of the ADCs and/or other portions of the AFE.

Analogously, the DSP based SERDES system 200 is operable to perform communication between a transmitter 231 and a receiver 241 via a serial communication link 207. The transmitter 231 is operable to receive data in 211, and if necessary, to perform a parallel to serial conversion of the data in 211. The receiver 241 is operable to receive the serialized data and to perform de-serialization. The receiver 241 generates data out 251. The reverse path (from right to left including the transmitter 231 and the receiver 241), as shown in the FIG. 2, is also operable to perform all of the associated functionality of the processing shown in the forward path (from left to right including the transmitter 230 and the receiver 240) in certain embodiments. Usually, to provide for common operations in both receive and transmit paths within a DSP based SERDES, both of the paths are analogous to one another in operation.

Figure 3:
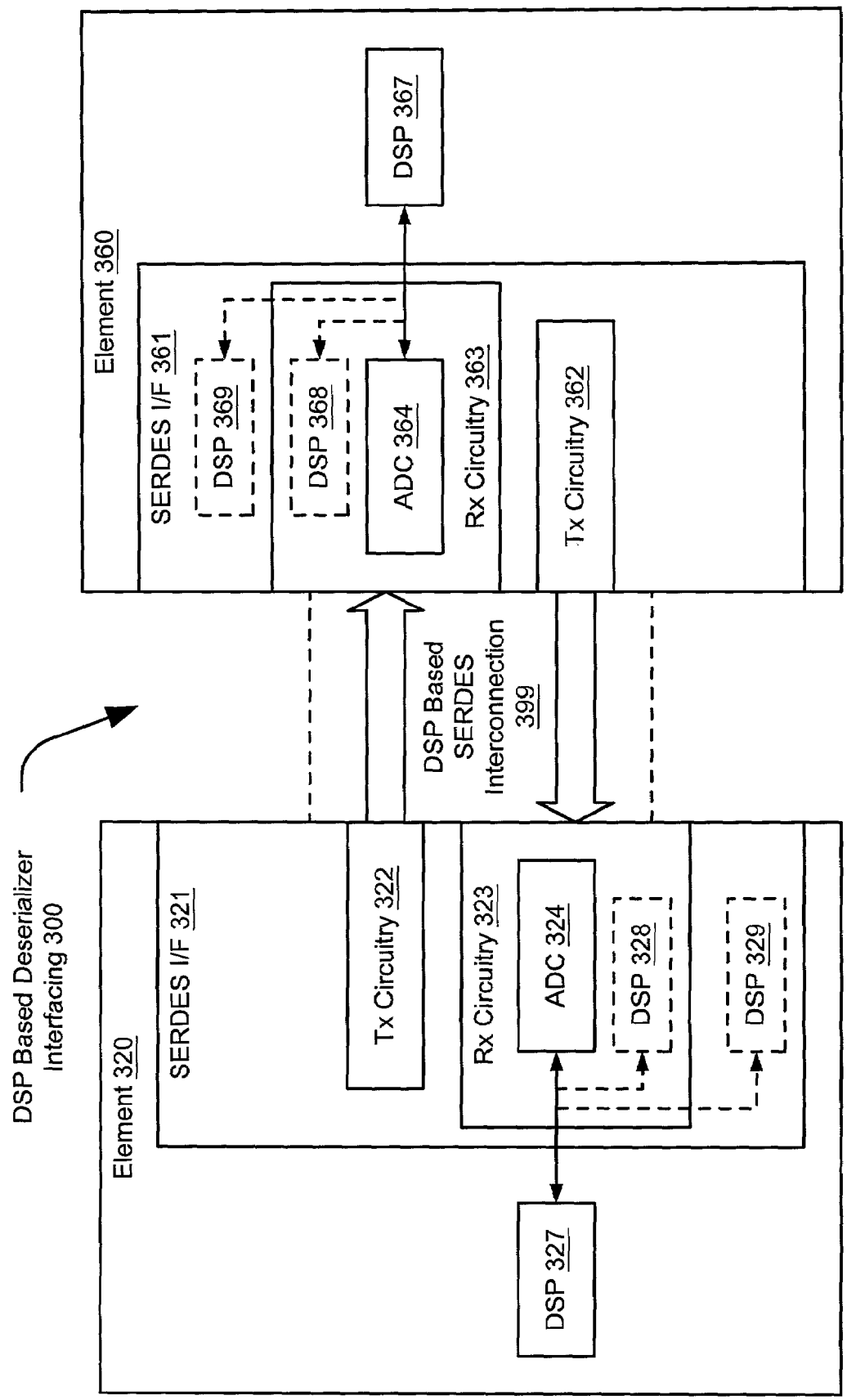
FIG. 3 is a system diagram illustrating an embodiment of a DSP based de-serializer interfacing that is built according to the present invention.

FIG. 3 is a system diagram illustrating an embodiment of DSP based de-serializer interfacing 300 that is built according to the present invention. The DSP based de-serializer interfacing 300 is operable to perform interfacing between any two elements, shown as elements 320 and 360 in the FIG. 3. It is understood that the elements 320 and 360 may each be ICs that may be located on a single board or on different boards without departing from the scope and spirit of the invention. The elements 320 and 360 are operable to communicate via a DSP based SERDES interconnection 399. The DSP based SERDES interconnection 399 is bi-directional in nature, allowing communication in both directions between the elements 320 and 360.

The element 320 contains a SERDES interface circuitry 321, and the element 360 contains a SERDES interface circuitry 361. Both SERDES interface circuitries 321 and 360 are operable to transmit and receive data via the DSP based SERDES interconnection 399. The SERDES interface circuitry 321 includes both transmitter circuitry 322 and receiver circuitry 323. The receiver circuitry 323 includes at least one ADC 324. The ADC 324 could also be multiple ADCs, implemented in an interleaved array. A signal received by the receiver circuitry 323, and after having passed through the ADC 324, is passed to a DSP 327 resident on the element 320. If desired, a DSP 328 may alternatively be employed within the receiver circuitry 323, or a DSP 329 may be implemented on the SERDES interface circuitry 321 itself. The ADC 324 and one, or multiple, of the ADCs 327, 328, and/or 329 operate cooperatively according to the present invention to perform high-speed de-serialization of data received via the DSP based SERDES interconnection 399.

Similarly, the SERDES interface circuitry 361 includes both transmitter circuitry 362 and receiver circuitry 363. The receiver circuitry 363 includes at least one ADC 364. The ADC 364 could also be multiple ADCs, implemented in an interleaved array. A signal received by the receiver circuitry 363, and after having passed through the ADC 364, is passed to a DSP 367 resident on the element 360. If desired, a DSP 368 may alternatively be employed within the receiver circuitry 363, or a DSP 369 may be implemented on the SERDES interface circuitry 361 itself. The ADC 364 and one, or multiple, of the DSPs 367, 368, and/or 369 operate cooperatively according to the present invention to perform high-speed de-serialization of data received via the DSP based SERDES interconnection 399.

Figure 4:
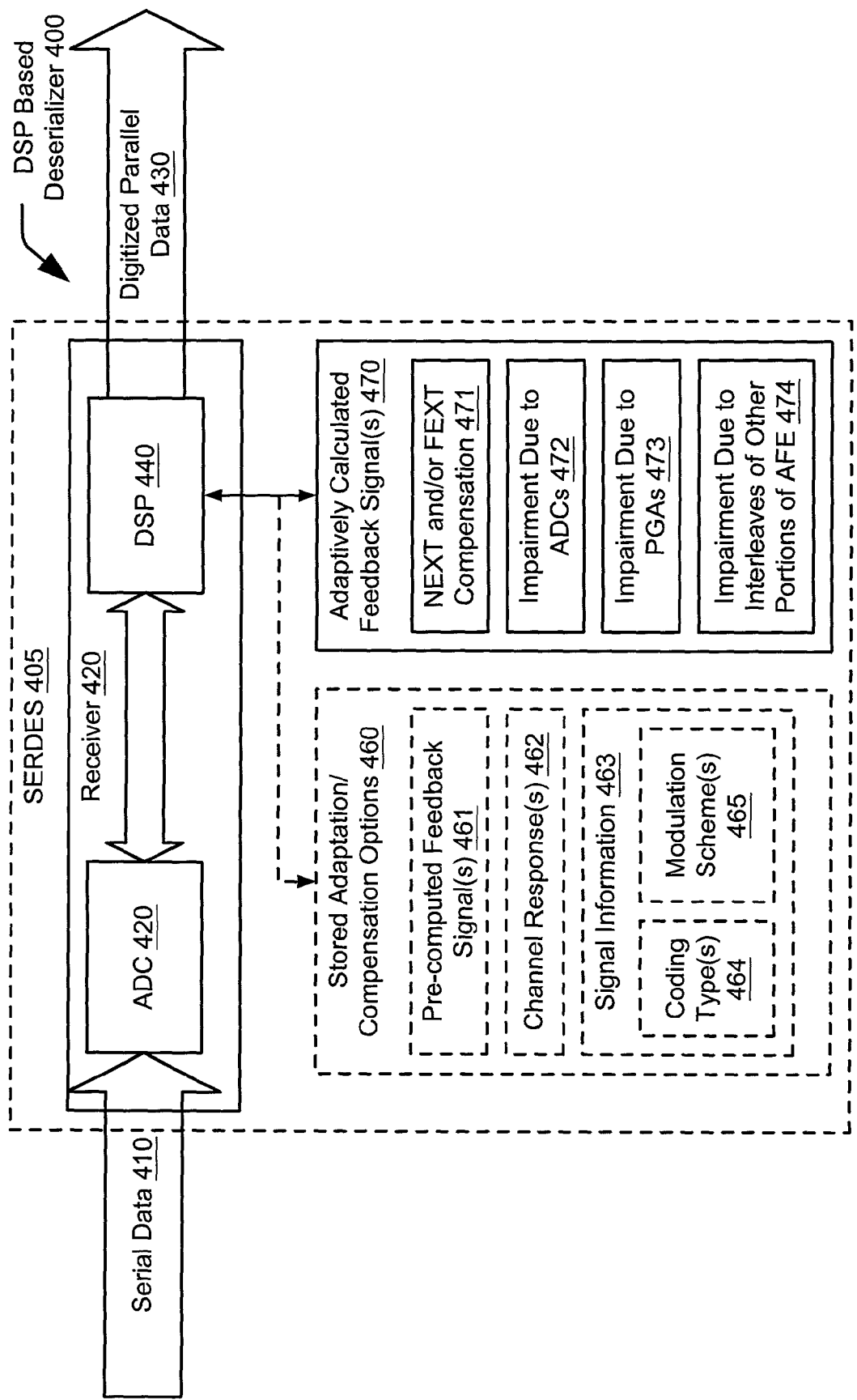
FIG. 4 is a system diagram illustrating an embodiment of a DSP based de-serializer that is built according to the present invention.

FIG. 4 is a system diagram illustrating an embodiment of a DSP based de-serializer 400 that is built according to the present invention. The DSP based de-serializer 400 may be viewed as being in the context of a SERDES 405. Serial data 410 (modulated analog waveform carrying digital data) is provided to an ADC 420 within a receiver 420 of the DSP based de-serializer 400. The output of the ADC 420 (referred to as digitized serial data, digital serial data, or digital samples of the serial data) is fed to a DSP 440 that extracts the digital data from the serial data 410 and outputs parallel data 430 that should fully correspond to the digital data.

The DSP 440 is operable to perform a variety of various digital signal processing operations on the digital samples of the serial data 410 (that are output from the ADC 420). Further, the DSP 440 may also produce compensation controls that are provided to other devices that operate upon the serial data, either in its analog format or after it has been digitally sampled. In performing these operations, the DSP 440 may utilize any of a number of stored adaptation/compensation options 460. These stored adaptation/compensation options 460 may be calculated offline and provided to the DSP 440 for subsequent use in compensating for non-uniformities in the various interleaves of the DSP based de-serializer 400. These stored adaptation/compensation options 460 may include compensation of the channel impairments, such as ISI, and compensation of the impairments of the ADC and possibly other blocks in the analog front-end, such as gain, sampling phase, or offset mismatch among the ADCs of an interleaved ADC array. The stored adaptation/compensation options 460 may include one or more pre-computed compensation operation(s)/compensation control(s) 461, one or more channel responses 462, signal information 463 (that may include any number of types of coding types 464 and modulation schemes 465).

The stored adaptation/compensation options 460 may be calculated and then stored in a memory 450 that is accessible by the DSP 440. The memory 450 may be any number of memory types known to those persons having skill in the art, including random access memory (RAM), read only memory (ROM), erasable programmable read only memory (EPROM), electronically erasable programmable read only memory (EEPROM/E2PROM), Ultraviolet electrically programmable read only memory (UVEPROM), re-programmable PROM (RPPROM), and any other memory types as well. In addition, the stored adaptation/compensation options 460 may alternatively be stored on the receiver 420 of the SERDES 405.

However, the DSP 440 is able to perform real time adaptation to adaptively calculate one or more appropriate feedback signals, shown as the adaptively calculated feedback signal(s) 470. There is typically only one trace through which the serial date 410 (input signal) will propagates at any time. This is inherent in the serial nature of the communication link over which the serial data 410 comes. The DSP is operable to compensate for mismatches among the interleaves of an ADC array (that may be viewed as the ADC 420 in the FIG. 4). Therefore, the DSP is able to compensate for impairments due to ADCs, as shown in a functional block 472. In addition, the DSP 440 is also operable to compensate for impairments due to gain errors of PGAs, as shown in a functional block 473, that may be existent in an AFE that first receives the serial data 410 and converts it into digital data. The use of PGAs may be employed here when there is attenuation over the communication channel over which the serial data 410 has been transmitted to the receiver 420.

In addition and generically speaking, the DSP 440 is operable to compensate for impairment due to the interleaves of any other portions of the AFE, as shown in a functional block 474. The non-uniformities of the various interleaves into which the serial data 410 is placed may require compensation to deal with their inherent variation, that may result from imperfections in processing and fabrication of the devices.

Moreover, the DSP 440 is operable to compensate for NEXT and/or FEXT as shown in a functional block 471. The FIG. 4 shows the generic applicability of the DSP 440 operating to compensate, adaptively in real time, for a variety of impairments that may result from the inherent interleaving, channel nature of DSP based de-serializing according to the present invention. In addition, the stored adaptation/compensation options 460 show how the DSP 440 may also use some pre-stored/pre-calculated compensation options in certain situations.

In the context of data communications applications, the DSP 440 is operable to compare the digital data received from the ADC 420 against at least the signal information 463. Additionally, the ADC 420 may compare the digital data received from the ADC 420 against the channel responses 462, or a combination of the signal information 463 and the channel responses 462. In one embodiment of making this determination, the DSP 440 first determines the modulation scheme employed by a coupled SERDES transmitter that produced the serial data. Various modulation schemes 465 may be employed including on-off keying (or 2-level pulse amplitude modulation, PAM-2), multilevel PAM (for example, 4-PAM that encodes 2 bits per symbol and therefore double the data rate achievable for a given symbol rate), among other modulation schemes known by persons having skill in the art. In addition, more elaborate modulation schemes, including single carrier quadrature amplitude modulation (QAM: such as 16 QAM, 64 QAM, 256 QAM, and/or 1024 QAM) or multi-carrier modulation are possible, as understood by those persons having skill in the art. Based upon this determination, the DSP 440 adapts its operations to expect a particular modulation scheme, and optionally, a particular channel response. Such adaptation is performed based upon known characteristics of the serial data 410 as provided by the signal information 463 and optionally the channel information.

The DSP 440 is also operable to discern the data coding type of the serial data 410. Similarly, the present invention is operable to adapt to a variety of input coding types 464 known by those persons having skill in the art. For example, the present invention may be used in combination with techniques such as Viterbi decoding, convolutional coding, block coding, trellis coding, and any other form of modulation coding or error correction coding. In addition, turbo coding may be employed as well as various types of precoding without departing from the scope and spirit of the invention, including Tomlinson-Harashima pre-coding and Dynamics Limited Pre-coding.

With the DSP 440 adapted to a particular modulation type (and optionally coding type and channel response), the DSP 440 has foreknowledge that it may use to compare the digitized serial data against correct signal information (the signal information 463) stored in the stored adaptation/compensation options 460 (during a training sequence or during normal operations). Based upon this comparison, the DSP 440 determines necessary compensation operations that it will perform on the digitized serial data and/or compensation control operations that it uses to control other components that perform compensation operations on the serial data. With these compensation operations performed, the receiver may then accurately extract digital information from the serial data 410.

If desired, and as will be shown in various embodiments, the adaptation/compensation performed by the DSP 440 may be performed using parallel processing techniques on a number of channels into which the now digital form of the serial data 410 has been channeled. The DSP 440 may then determine the proper compensation controls required, if any, from the one or more pre-computed compensation controls 461 that are stored in the stored adaptation/compensation options 460 and to apply such feedback signal(s) in compensation control operations.

FIG. 5A is a system diagram illustrating another embodiment of a DSP based de-serializer 500A that is built according to the present invention. Serial data 500A is fed to an ADC 540A. The output of the ADC 540A is digital data having a word width of n. The now digital data is fed to a DSP 550A. The DSP 550A is operable to perform compensation determination 551A and to identify any compensation operations 552A that need to be performed concerning the serial data 510A, in light of the analog to digital conversion that it undergoes in the ADC 540A. Compensation control 520A is fed back to the ADC 540A as required to accommodate the now digital form of the serial data 510A. The ADC 540A is adjusted, as required to ensure a properly sampled digital signal. Fixed pattern noise is typically repetitive based on the degree of mismatch in system parameters including gain mismatch, phase mismatch, offset mismatch, and other mismatches. By adjusting the ADC 540A, fixed pattern noise is significantly reduced or eliminated. If desired, one or all of these various parameters are dealt with by adjusting the digital sampling of the serial data 510A.

Again, the DSP 550A is operable not only to determine which necessary compensation is desirable to achieve a properly sampled signal (compensation determination 551A), but the DSP 550A is also operable to determined those compensation operations 552A, when provided to the ADC 540A, would effectuate a properly sampled signal. These compensation operations 552A are passed to the ADC 540A via a feedback signal shown as compensation control 520A. As described in other of the various embodiments, the particular context of data communications applications, where a vast amount of information is discernible concerning the serial data 510A, and the communication channel over which the serial data 510A has come, one or both of the compensation determination 551A and the compensation operations 552A may be identified using a predetermined number of stored feedback compensation options. This foreknowledge of the incoming serial data 510A allows very effective compensation to curb the effects of fixed pattern noise in the context of data communications applications and other applications where fixed pattern noise arises. The digital correction techniques are very well adapted to performing compensation to the fixed pattern noise problem, again, based on this knowledge of the incoming signal to the ADC 540A and also based on the knowledge of the type of channel over which the incoming signal has come.

From some perspectives, the DSP 550A is able to perform adaptive compensation for non-uniformities among various interleaves of the ADC 540A (that may include an ADC array), or possible non-uniformities among various other elements within an analog front-end (AFE) of the DSP base de-serializer 500A. As an input signal enters into the various interleaves of the present invention, various offsets mismatches of the different interleaved paths may need compensation. The use of DSP 550A to perform compensation for these various offsets, that may be generated by the non-uniformities of the various interleaves, to enable an extremely fast operating DSP based de-serializer 500A. The DSP compensation techniques allow for adaptive compensation of these interleave generated offset mismatches. The ADC 540A and an AFE may have such impairments, in the case of an interleaved array, that may cooperatively generate fixed pattern noise. While this fixed pattern noise will not be existent within the input signal to the DSP based de-serializer 500A, the interleaved implementation may undesirably create this fixed pattern noise. However, the use of DSP correction techniques is operable to overcome these effects. The DSP compensation techniques are able to compensate for gain, sampling phase and offset errors in the interleaved array that may lead to the fixed pattern noise.

Again, the DSP 550A is implemented to perform compensation according to the present invention in an adaptive embodiment. There need be no prior knowledge of the specific values of impairments to the interleaves (being ADCs, other portions of the AFE, and/or channel impairments). The DSP techniques are able to identify the appropriate compensation and to perform that compensation adaptively. The adaptive DSP compensation implementation is applicable for both channel impairments and impairments of the ADCs and/or other portions of the AFE.

Moreover, it is also noted that the adaptive DSP compensation implementation may be performed for NEXT and FEXT crosstalk problems within a communication channel that provides the serial data 510A to the ADC 540A. The embodiment of the FIG. 5A specifically shows the embodiment where this adaptive compensation is performed via the compensation control 520A that is provided from the DSP 550A to the ADC 540A. The following FIG. 5B will show how this adaptive compensation may be performed within a DSP itself.

FIG. 5B is a system diagram illustrating another embodiment of a DSP based de-serializer 500B that is built according to the present invention. Serial data 500B is fed to an ADC 540B. The output of the ADC 540B is parallel digital data having a word width of n. The now digital data is fed to a DSP 550B. The DSP 550B is operable to perform compensation determination 551B and to identify any compensation operations 552B that needs to be performed concerning the serial data 510B, in light of the analog to digital conversion that it undergoes in the ADC 540B. Compensation control 520B is fed external to DSP 550B, as shown in the embodiment of the FIG. 5B, as required to accommodate the now digital form of the serial data 510B. The DSP 550B performed mathematical processing on the now digital form of the serial data 510B, as required to ensure that the now digital data is in a form that would be achieved were the operation of the ADC 540B substantially ideal. This digital signal processing of the now digital form of the serial data 510B, as performed by the DSP 50B, ensures that there is a properly sampled digital signal. The concerns of fixed pattern noise, that is typically repetitive based on the degree of mismatch in system parameters including gain mismatch, phase mismatch, offset mismatch, and other mismatches, are minimized performing digital signal processing to effectuate what appears to be an adjustment of the ADC 540B; the digital output signal from the ADC 540B is mathematically modified to generate a digital signal that has all the proper characteristics of a properly sampled signal, as if the ADC 540B performed a proper sampling of the serial data 510B. If desired, one or all of these various parameters are dealt with by performing digital signal processing on the digital data using the DSP 550B.

In this embodiment, the DSP 550B is operable not only to determine which necessary compensation is desirable to achieve a properly sampled signal (compensation determination 551B), but the DSP 550B is also operable to determine those compensation operations 552B, and to actually perform the compensation control 553B itself as to effectuate a digital signal having the characteristics of a properly sampled signal. As described in other of the various embodiments, the particular context of data communications applications, where a vast amount of information is discernible concerning the serial data 510B, and the communication channel over which the serial data 510B has come, one or both of the compensation determination 551B and the compensation operations 552B may be identified using a predetermined number of stored feedback compensation options. This foreknowledge of the incoming serial data 510B allows very effective compensation to curb the effects of fixed pattern noise in the context of data communications applications and other applications where fixed pattern noise arises. The digital correction techniques are very well adapted to performing compensation to the fixed pattern noise problem, again, based on this knowledge of the incoming signal to the ADC 540B and also based on the knowledge of the type of channel over which the incoming signal has come.

From some perspectives, the DSP 550B is able to perform adaptive compensation for non-uniformities among various interleaves of the ADC 540B (that may include an ADC array), or possible non-uniformities among various other elements within an analog front-end (AFE) of the DSP base de-serializer 500B. As an input signal enters into the various interleaves of the present invention, various offsets mismatches of the different interleaved paths may need compensation. The use of DSP 550B to perform compensation for these various offsets, that may be generated by the non-uniformities of the various interleaves, to enable an extremely fast operating DSP based de-serializer 500B. The DSP compensation techniques allow for adaptive compensation of these interleave generated offset mismatches. The ADC 540B and an AFE may have such impairments, in the case of an interleaved array, that may cooperatively generate fixed pattern noise. While this fixed pattern noise will not be existent within the input signal to the DSP based de-serializer 500B, the interleaved implementation may undesirably create this fixed pattern noise. However, the use of DSP correction techniques is operable to overcome these effects. The DSP compensation techniques are able to compensate for gain, sampling phase and offset errors in the interleaved array that may lead to the fixed pattern noise.

Again, the DSP 550B is implemented to perform compensation according to the present invention in an adaptive embodiment. There need be no prior knowledge of the specific values of impairments to the interleaves (being ADCs, other portions of the AFE, and/or channel impairments). The DSP techniques are able to identify the appropriate compensation and to perform that compensation adaptively. The adaptive DSP compensation implementation is applicable for both channel impairments and impairments of the ADCs and/or other portions of the AFE.

Moreover, it is also noted that the adaptive DSP compensation implementation may be performed for NEXT and FEXT crosstalk problems within a communication channel that provides the serial data 510B to the ADC 540B. The embodiment of the FIG. 5B specifically shows the embodiment where this adaptive compensation is performed within the DSP 550B itself.

Figure 6:
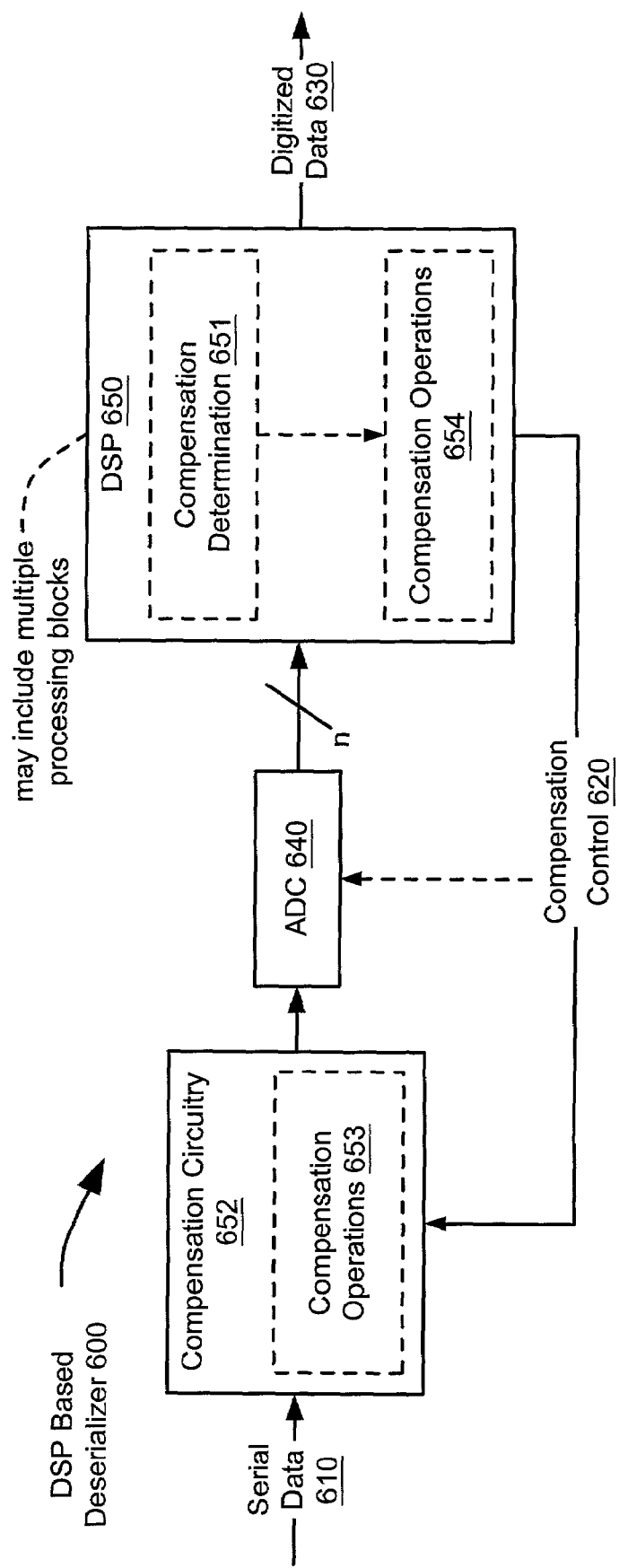
FIG. 6 is a system diagram illustrating another embodiment of a DSP based de-serializer that is built according to the present invention.

FIG. 6 is a system diagram illustrating another embodiment of a DSP based de-serializer 600 that is built according to the present invention. Serial data 610 is provided to compensation circuitry 652. The compensation circuitry 652 is operable to perform modification of the serial data 610 before an analog to digital conversion using an ADC 640. The compensation circuitry 652 is operable to perform various transfer function operations on the serial data 610, using analog based circuitry components, to pre-compensate for the impairments of the ADC 640. The output of the ADC 640 is parallel digital data having a word width of n. The now digital data is fed to a DSP 650. The DSP 650 is operable to identify what compensation determination 651 is required and also to identify compensation operations 654 in various embodiments.

From the DSP 650, compensation control 620 is fed back to one or both of the ADC 640 and the compensation circuitry 652. If desired, the compensation circuitry 652 is operable to receive information concerning the compensation determination 651 that is determined by the DSP 650, and then the compensation circuitry 652 may also have intelligence so that it may itself identify compensation operations 653 that should be performed to compensate for deficiencies in the ADC 640. In addition, it is also noted that the ADC 640 is also operable to be adjusted, in similar manner to other ADCs as described in various other embodiments of the present invention to deal with ADC-related non-uniformities. Any gain, phase, offset or other deleterious effects introduced by the analog to digital conversion within the ADC 640 may be addressed by proper adjustment of the ADC 640, as governed by the feedback signal shown as compensation control 620.

It is also noted that in this embodiment, as well as in other embodiments, the DSP block (shown as DSP 650 in the FIG. 6) may include a single DSP or multiple DSPs as well without departing from the scope and spirit of the invention. Those persons having skill in the art will appreciate that a number of co-DSPs may also be employed, or a number of mathematical logic processing circuitries, may also be employed to perform the digital signal processing of the now digital data to effectuate a digital signal having the characteristics of a properly sampled signal.

From certain perspectives, this embodiment shows the ability of the present invention to perform accommodation of fixed pattern noise related problems by dealing with these problems before any analog to digital conversion of the analog signal. Other embodiments have shown that the present invention is operable to deal with the fixed pattern noise problem by adjusting the operational parameters of the ADC itself, by performing mathematical processing of the digital data coming out of an ADC, and this embodiment shows the ability to deal with the fixed pattern noise problem by performing compensation of the analog signal using a compensation circuitry 652 that is situated before the ADC 640. In addition, this embodiment shows the ability to perform hybrid compensation as well, by performing some compensation in the compensation circuitry 652, and some compensation by adjusting the operational parameters of the ADC 640. Similarly, the present invention is also operable to perform hybrid compensation in other embodiments as well. For example, the present invention allows implementation of combinations of compensation to be performed in various sections of a system that is built according to the present invention. Compensation may be performed before the analog to digital conversion, within the ADC performing the analog to digital conversion, and also in a DSP situated after the ADC as well. The deleterious effects of fixed pattern noise and other recurring noise problems are aptly dealt with using these compensation aspects of the present invention.

Figure 7:
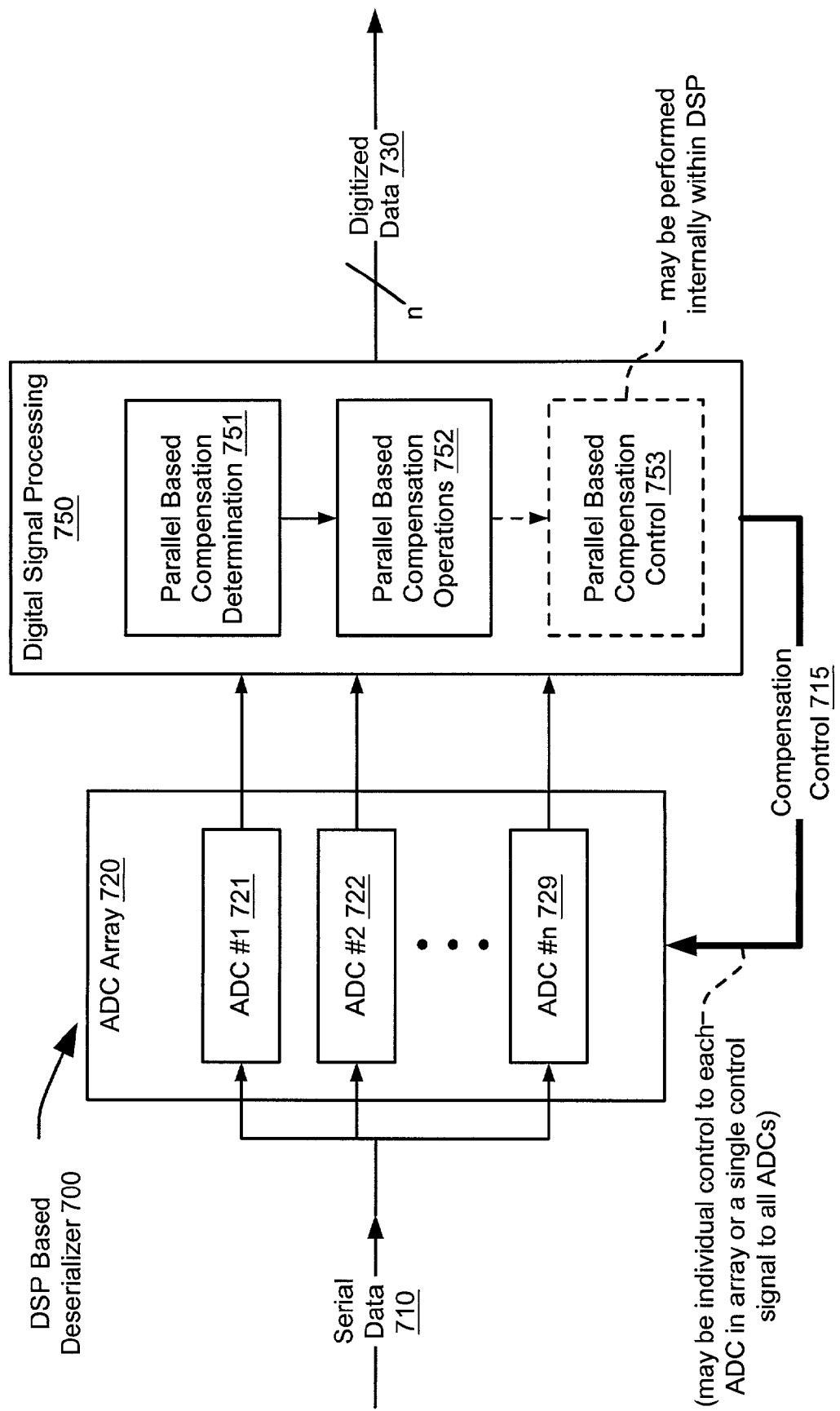
FIG. 7 is a system diagram illustrating another embodiment of a DSP based de-serializer that is built according to the present invention.

FIG. 7 is a system diagram illustrating another embodiment of a DSP based de-serializer 700 that is built according to the present invention. A serial data signal 710 is fed to an ADC array 720 that itself has a number of ADCs, shown as an ADC #1 721, an ADC #2 722, ..., and an ADC #n 729. The serial data 710 is fed simultaneously to each ADC within the ADC array 720. Each ADC within the ADC array 720 is operable to sample at a sampling rate lower than the total or effective sampling rate. The sampling of the ADCs within the ADC array 720 is performed so as to effectuate a higher sampling rate of any of the ADCs within the array. The effective sampling rate of the ADC array 720 may be viewed as being the total sampling rate of each of the sampling rates of the ADCs within the ADC array 720 when summed together. For example, in an embodiment where n=8, then an effective sampling rate of 10 GHz can be achieved with 8 interleaved ADCs each running at 1.25 GHz. Each of the ADCs within the ADC array 720 performs sampling at different times within a given cycle of the serial data 710.

In addition, each of the ADCs within the ADC array 720 may individually be controlled to effectuate a proper sampling of the serial data 710. For example, the gain, phase, offset, and other operational parameters of each of the ADCs within the ADC array 720 may be adjusted to ensure that the sampling of the various ADCs is performed uniformly and with proper phase and time delays between the samples, thereby ensuring that the digital data is a true rendition of the serial data 710. Each of the ADCs within the ADC array 720 may be viewed as generating a channel, properly spaced in time from the other channels, that is generated by the other ADCs within the ADC array 720. Each of these channels is fed to a DSP 750.

Again, it is also noted that in this embodiment, as well as in other embodiments, the DSP block (shown as DSP 750 in the FIG. 7) may include a single DSP or multiple DSPs as well without departing from the scope and spirit of the invention. Those persons having skill in the art will appreciate that a number of co-DSPs may also be employed, or a number of mathematical logic processing circuitries, may also be employed to perform the digital signal processing of the now digital data to effectuate a digital signal having the characteristics of a properly sampled signal.

The DSP 750 is operable to determine any parallel based compensation that may be required to transform the now digital, parallel form of the serial data 710, so as to generate digital data having the proper characteristics including proper gain, phase, offset, and other characteristics (as shown in the functional block 751). The parallel based compensation determination 751 creates compensation controls individually for each of the ADCs within the ADC array 750. That is to say, a parallel based feedback signal, shown as compensation control 715, may be fed back to the ADC array 720, such that different components of a digital word may be used to adjust the operational characteristics of the individual ADCs of the ADC array 720. The use of a digital word, having various bits or bit segments within the digital word, to adjust different ADCs within the ADC array 720 will be understood by those persons having skill in the art. In addition, if desired, the DSP 750 is operable not only to perform the parallel based compensation determination 751, but also to identify precisely those parallel based compensation operations 752 that will effectuate the desired operation of the ADC array 750.

Moreover, in even other embodiments, the DSP 750 is operable to identify and also operable to perform parallel based compensation control 753 within the DSP 750 itself. The DSP 750 is operable to perform the compensation control 753 alone, without feeding back and compensation control 715, yet it is also operable to perform compensation in cooperation with the ADC array 720 to which compensation control 715 is passed. Such an embodiment shows the ability of the present invention to perform hybrid type of compensation for the many deleterious effects present in the prior art that have, until now, prevented an effective implementation of a DSP-based de-serializer.

It is also noted that the parallel based compensation determination 751, the parallel based compensation operations 752, and the parallel based compensation control 753 may all be performed independently for various interleaves within the DSP based de-serializer 700. That is to say, the various interleaves may undergo independent determination, identification of operations, and control according to the present invention.

FIG. 7 shows a parallel implementation of a number of interleaved ADCs, in the ADC array 720, that enable a much higher sampling rate that the individual sampling rate of the individual ADCs within the ADC array 720. Those persons having skill in the art will also appreciate that any number of ADC arrays may be interleaved without departing from the scope and spirit of the invention. In a similar manner in which the individual ADCs within the ADC array 720 are interleaved, a number of ADC arrays may themselves be interleaved thereby providing a much higher effective sampling rate of the serial data 710; ADC arrays could be interleaved, with each ADC having a number of ADCs, to effectuate higher sampling rates as well.

Figure 8:
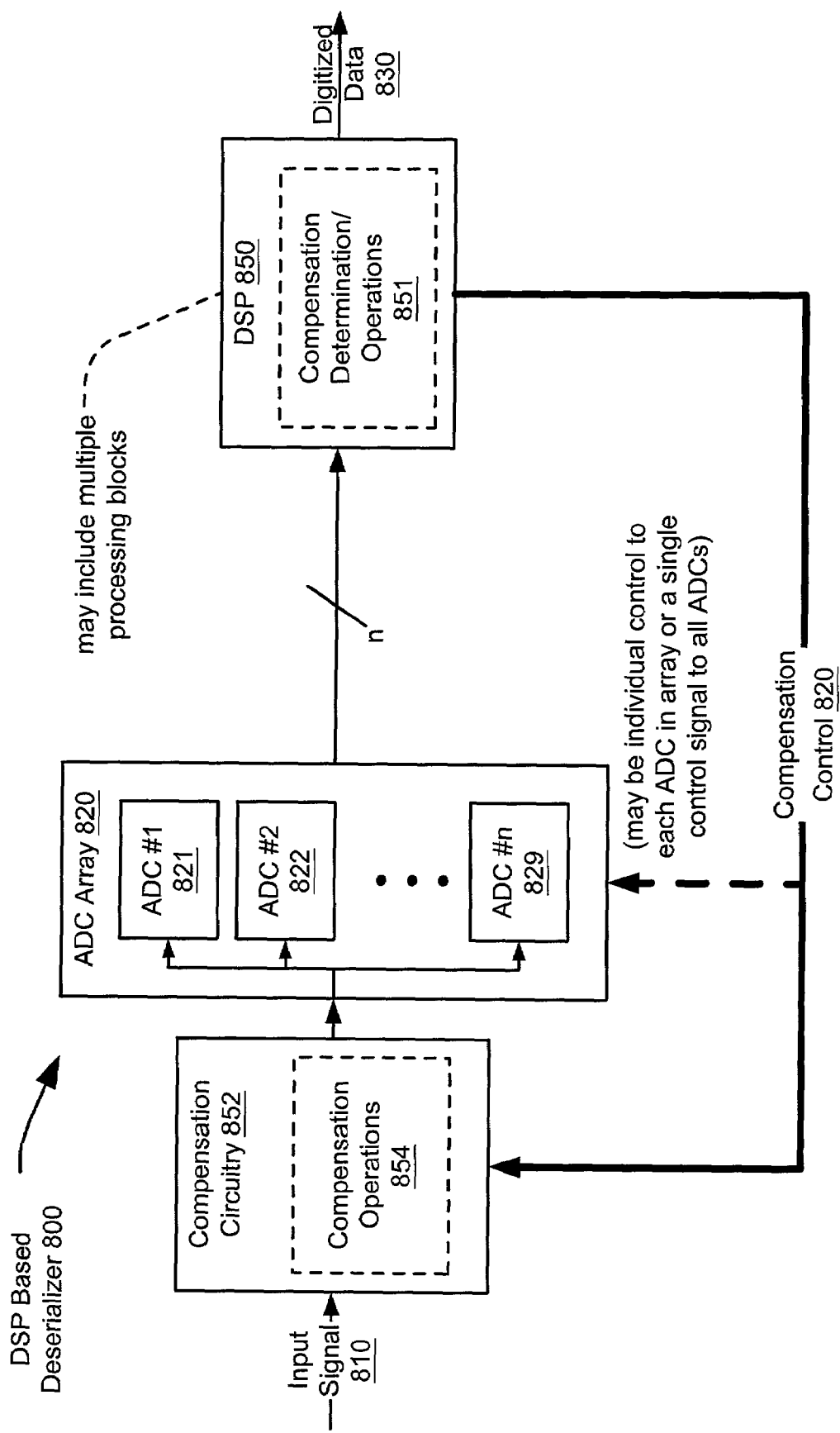
FIG. 8 is a system diagram illustrating another embodiment of a DSP based de-serializer that is built according to the present invention.

FIG. 8 is a system diagram illustrating another embodiment of a DSP based de-serializer 800 that is built according to the present invention. A serial data 810 is provided to compensation circuitry 852. This is an analog signal representing the serial data stream transmitted from the serializer after traversing the communication channel. It may be modulated using any modulation scheme, such as pulse amplitude modulation (PAM), quadrature amplitude modulation (QAM), multi-carrier modulation, etc. The compensation circuitry 852 is operable to perform modification of the signal 810 before an analog to digital conversion. The compensation circuitry 852 is operable to perform various transfer function operations on the signal 810, using analog based circuitry components, pre-compensate for the impairments of the ADC and other blocks of the analog front end. Within an actual system, various imperfections, including device imperfections may contribute to a signal having fixed pattern noise problems. The compensation circuitry 852 is operable to curb these effects so that the analog to digital conversion (digital sampling of the serial data 810) generates digital data that is truly representative of the serial data 810. After passing through the compensation circuitry 852, the now pre-compensated (if necessary) serial data 810 is presented to the ADC array 820. The output of the ADC array 820 is parallel digital data having a word width of n. The now digital data is fed to a DSP 850. In various embodiments, the DSP 850 is operable to identify what compensation would achieve what would be a properly sampled signal and also to identify compensation operations, as shown by combined functional block compensation/operations 851.

It is also noted that the combined functional block compensation/operations 851 may be performed independently for various interleaves within the DSP base de-serializer 800. That is to say, the various interleaves may undergo independent determination, identification of operations, and control according to the present invention.

From the DSP 850, compensation control 820 is fed back to one or both of the ADC array 820 and the compensation circuitry 852. The compensation control, when fed to the ADC array 820, is operable to perform adaptation of the entire ADC array 820, or alternatively, to each of the individual ADCs within the ADC array 820. If desired, the compensation circuitry 852 is operable to receive information concerning the compensation determination that is determined by the DSP 850, and then the compensation circuitry 852 may also have intelligence so that it may itself identify compensation operations 854 that should be performed to compensation for deficiencies in the incoming serial data 810. The compensation circuitry 852, when operable to identify the compensation operations 854, is able to identify the compensation operations 854 independently or in conjunction with the DSP 850. In addition, it is also noted that the ADC array 820 is also operable to be adjusted, in similar manner to other ADCs as described in various other embodiments of the present invention to deal with ADC-related non-uniformities. Any gain, phase, offset or other deleterious effects introduced by the analog to digital conversion performed within the ADC array 840 (or any of the individual ADCs within the ADC array 840), may be addressed by proper adjustment of the ADC 840, as governed by the feedback signal shown as compensation control 820.

It is also noted that in this embodiment, as well as in other embodiments, the DSP block (shown as DSP 850 in the FIG. 8) may include a single DSP or multiple DSPs as well without departing from the scope and spirit of the invention. Those persons having skill in the art will appreciate that a number of co-DSPs may also be employed, or a number of mathematical logic processing circuitries, may also be employed to perform the digital signal processing of the now digital data to effectuate a digital signal having the characteristics of a properly sampled signal.

FIG. 8 shows a parallel implementation of a number of interleaved ADCs, in the ADC array 820, that enable a much higher sampling rate that the individual sampling rate of the individual ADCs within the ADC array 820. Those persons having skill in the art will also appreciate that any number of ADC arrays may also be interleaved without departing from the scope and spirit of the invention. In a similar manner in which the ADCs within the ADC array are interleaved, thereby providing a much higher effective sampling rate of the serial data 810, a number of ADC arrays could also be interleaved, with each ADC having a number of ADCs, to effectuate higher sampling rates as well.

Figure 9:
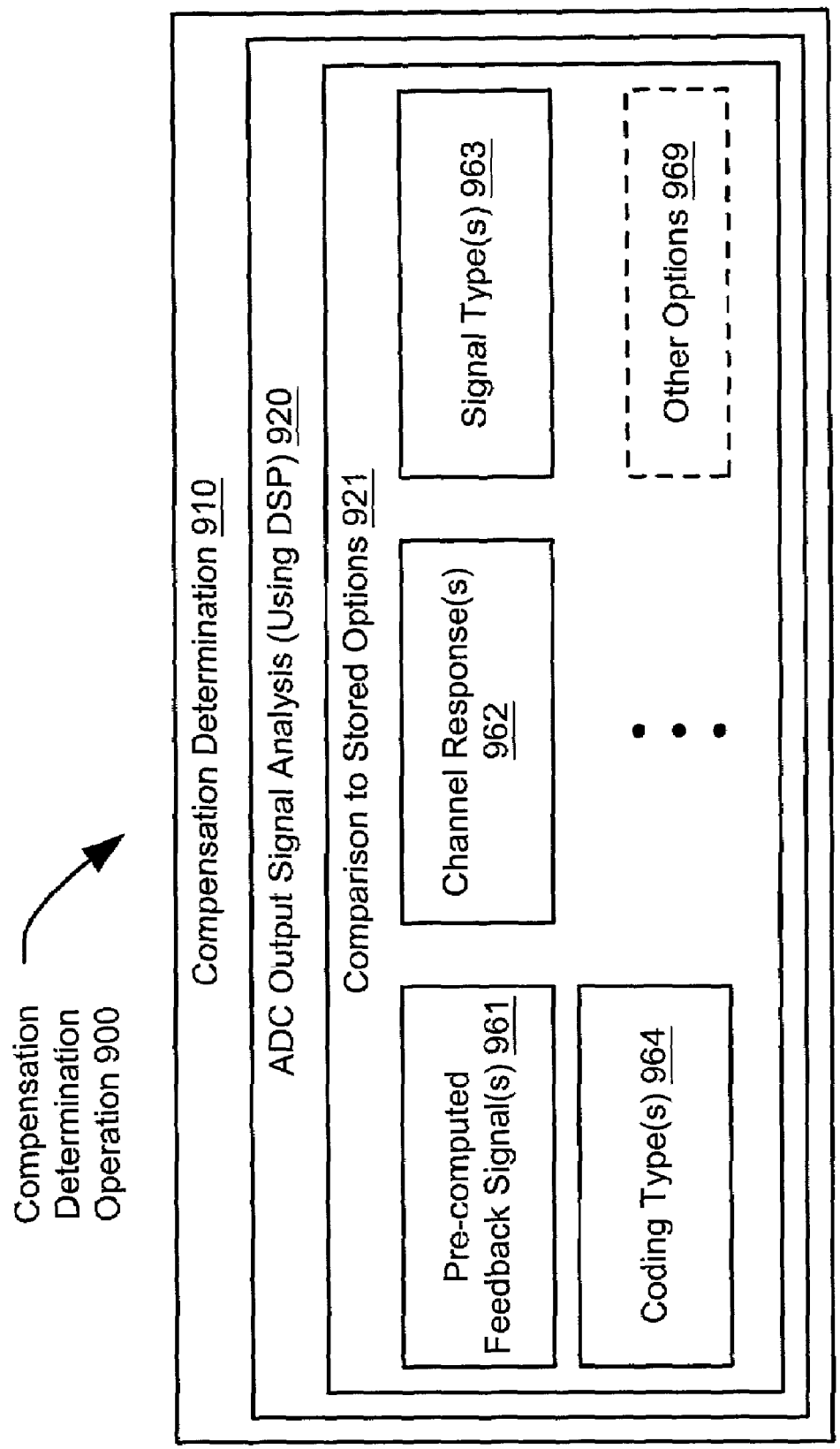
FIG. 9 is a functional block diagram illustrating an embodiment of compensation determination operation that may be performed in accordance with the present invention.

FIG. 9 is a functional block diagram illustrating an embodiment of compensation determination operation 900 that may be performed in accordance with the present invention. In FIG. 9, the various embodiments of the present invention are shown to be operable to perform compensation determination 910. In the compensation determination 910 functional block, the present invention is operable to perform analysis of an ADC output signal using a DSP, as shown as a functional block 920. In performing the analysis of an ADC output signal using a DSP, the present invention is operable to perform comparison to any number of stored options 9210, including one or more pre-computed feedback signals 961, one or more channel responses 962, one or more signal types 963, one or more coding types 964, . . . , and one or more other options 969.

As also described in other of the various embodiments of the present invention, the present invention is operable to ascertain various characteristics of an incoming analog signal, once it has been sampled and transformed into the digital realm. A DSP is operable to perform analysis of the digital signal against a number of stored parameters. In the context of data communications applications, a large degree of knowledge may be discerned concerning the channel response of a communication link over which an analog data signal has come before arriving at an ADC that performs analog to digital conversion of an analog signal. Given the context of data communications applications, a predetermined number of pre-computed feedback signal, shown as functional block 961, may be calculated based on the finite number of feedback options that would be required to compensate for problems of gain, phase, offset, and other deleterious effects that may arise from analog to digital conversion in an ADC, and also to other deficiencies that may be introduced within the system before the signal has made its way to the ADC.

Figure 10:
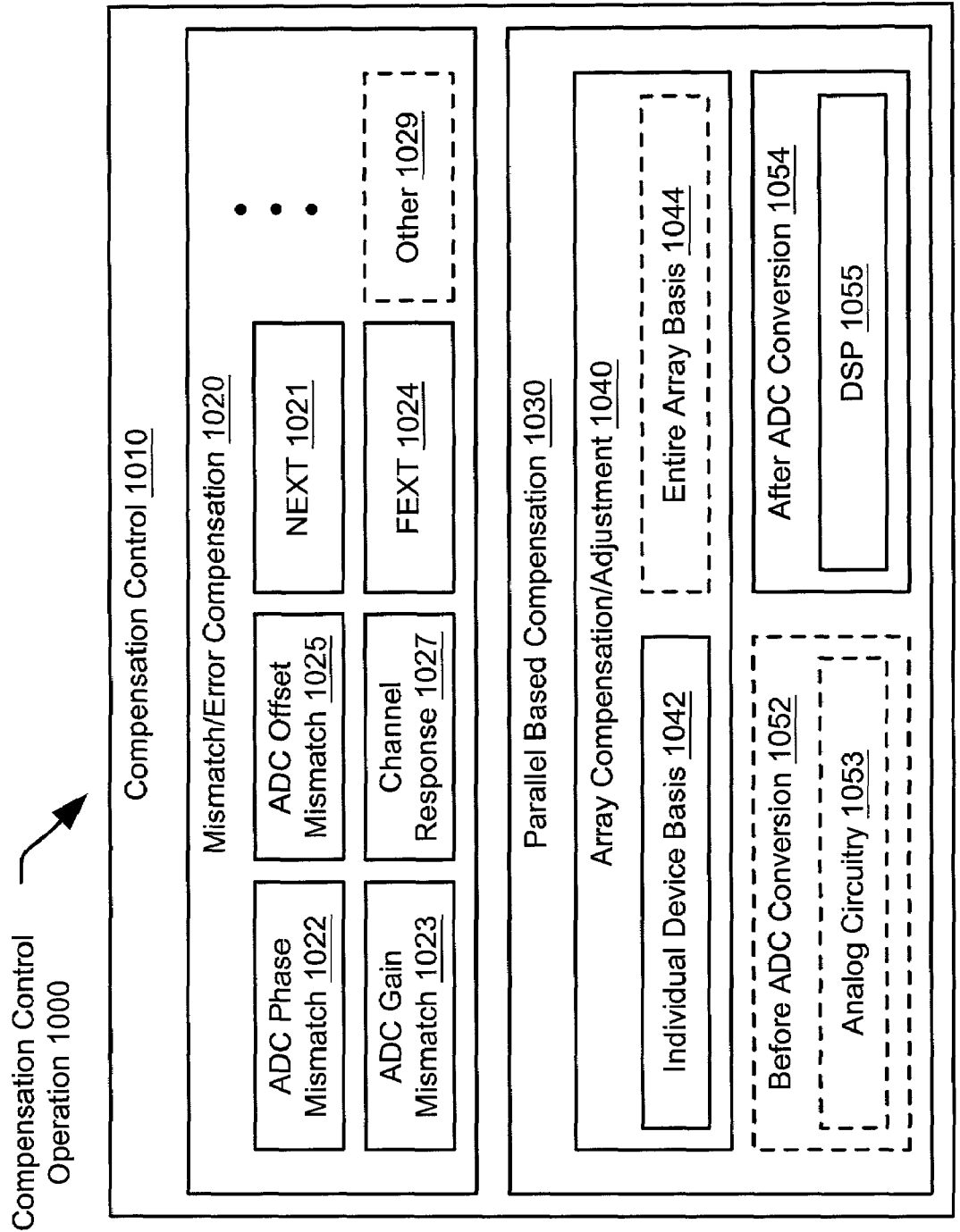
FIG. 10 is a functional block diagram illustrating an embodiment of compensation control operation that may be performed in accordance with the present invention.

FIG. 10 is a functional block diagram illustrating an embodiment of compensation control operation 1000 that may be performed in accordance with the present invention. The compensation control operation 1000 shows the various aspects of compensation control 1010 that may be performed in various embodiments. Mismatch/error compensation 1020 and parallel based compensation 1030 are two types of compensation control 1010 that may be performed in accordance with the present invention. In similar manner that the present invention can determine the compensation that would be suitable to transform a digitally sampled version of an analog signal into a signal that has proper characteristics of parameter including gain, phase, offset, the present invention is also operable to identify those adaptations and transformations that would ensure that the digitally sampled signal will contain the proper characteristics of a signal having the proper characteristics.

In some situations, when a signal is made up of various signal components that are combined into a single signal, some will arrive at an ADC having some fixed pattern noise related deficiencies. The present invention is operable to curb these effects. This particular ability of the present invention shows the ability of the present invention to compensate for deficiencies of fixed pattern noise that may be introduced in analog to digital conversion within an ADC, and also to compensate for fixed pattern noise related problems in the overall system itself.

In addition, the present invention is operable to perform compensation for deficiencies and non-uniformities within an ADC array. This is particularly applicable in the context of systems employing an ADC array, in which multiple ADCs perform sampling at different times, and the operation of all of the ADCs within the ADC array may be non-uniform. In addition, the various ADCs may introduce non-uniform differences of phase between the various channels serviced by the ADC array. The present invention is operable to compensate for this by adjusting the phase of the various channels appropriately, as shown in a functional block 1022. The phase of some channels may be advanced, and the phase of other channels in an ADC array may be delayed, to ensure that the channels each sample the incoming signal appropriately, with a proper spacing of time and phase between the various channels. One additional problem that may arise is when the various ADCs each introduce a non-uniform amount of offset into the signal during the analog to digital conversion; the various ADCs may have slightly different characteristics that generate this offset. The present invention is also operable to compensate for deficiencies in non-uniform offset (as shown in the functional block 1025), as well as eliminate any amount of offset at all, that may be introduced as an offset into the now-digital data that represents the incoming analog signal that is provided to an ADC. In addition, the present invention is operable to perform compensation of crosstalk in the form of NEXT 1021 and/or FEXT 1024. The present invention is also operable to perform compensation of ADC gain mismatch, as well as to accommodate any problems or deficiencies of channel response 1027 as well. Some problems may arise when the incoming signal, or at least portions of the incoming signal, arrives at the ADC across different signal paths. However, more common that that will be problems arising due to non-uniformities between the various ADCs within an ADC array that is employed according to the present invention.

The ADC gain mismatch 1023 may be generated in all, or in part, by the analog to digital conversion operation. The ADC gain mismatch 1023 may alternatively be generated in all, or in part, by the other parts of the system before the analog to digital conversion in an ADC. Similarly, the timing mismatch 1026 may be generated in all, or in part, by the analog to digital conversion operation. The present invention is operable to compensate for these deleterious effects using DSP-based compensation techniques, by performing mathematical processing of the digital data in the DSP domain, or alternatively, to perform analog-based signal processing by modifying certain analog circuitries before the ADC, as identified and determined, at least in part, by a DSP that is placed after the ADC (which may be an ADC array) that performs the analog to digital conversion. The DSP is the entity that is operable, at least, to identify the compensation (if any) to be performed. In certain embodiments, the DSP performs the compensation in the digital domain, performing mathematical processing on the digital data.

Again, the compensation of the present invention may be performed using parallel based compensation 1030 by performing array compensation/adjustment 1040 that is operable to be implemented on an individual device basis 1042. Alternatively, the array compensation/adjustment 1040 may also be performed on an entire array basis 1044. The array may very well be an ADC array, as described in various embodiments, but the array may be an alternative device. For example, an array of filters or an array of voltage scaling circuitry (to adjust gain) may be placed before the ADC that performs analog to digital conversion. The array may be selectively switched in and operated to perform modification of certain channels of an analog signals that are fed to various ADCs in an ADC array. These devices may be PGAs that may be adjusted and controlled using AGC. In addition, as described in various embodiments, the parallel based compensation 1030 may be performed after an analog to digital conversion 1054 where the parallel based compensation 1030 may be performed using digital signal processing 1055. Alternatively, the parallel based compensation 1030 may be performed before an analog to digital conversion 1052 where the parallel based compensation 1030 may be performed using analog circuitry 1053. Again, the direction and control of precisely how to configure the analog circuitry 1053 may also be determined and controlled using digital signal processing.

Figure 11:
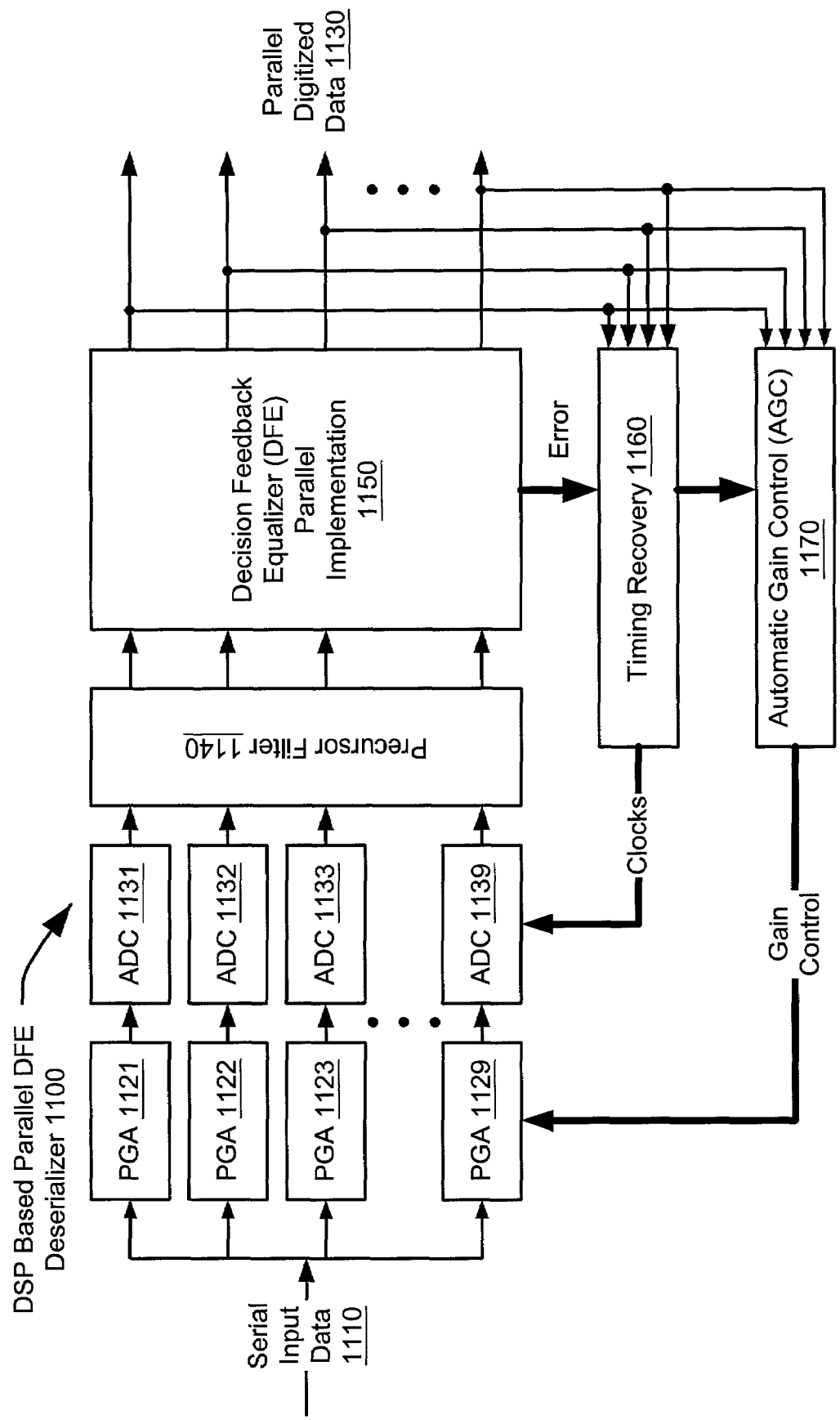
FIG. 11 is a system diagram illustrating an embodiment of a DSP based parallel decision feedback equalizer (DFE) de-serializer that is built according to the present invention.

FIG. 11 is a system diagram illustrating an embodiment of a DSP based parallel decision feedback equalizer (DFE) de-serializer 1100 that is built according to the present invention. Serial input data 1110 is fed simultaneously to a number of PGAs, shown as a PGA 1121, a PGA 1122, a PGA 1123, ..., and a PGA 1129. The outputs of each of the PGAs form channels for the serial input data 1110, after undergoing any gain adjustment using the PGAs 1121-1129. The output of each of these PGAs is fed to an ADC where the serial data is sampled using a number of ADCs, shown as an ADC 1131, an ADC 1132, an ADC 1133, ..., and an ADC 1139. Together, the ADCs 1131-1139 operate to achieve an effective sampling rate of the sum total of each of the sampling rates of the ADCs 1131-1139. Each of the ADCs 1131-1139 operates at substantially the same sampling rate. Additional intelligence may be employed in various embodiments to accommodate the situation where some of the ADCs operate at different sampling rates as the other of the ADCs. The outputs of each of the ADCs are fed to a precursor filter 1140. The precursor filter 1140 performs the operation of properly creating zero crossings in the now digital samples. The precursor filter 1140 also performs pulse shaping to ensure that the pulse is in the proper shape so as to enable timing recovery, as will be described below as well as in other various embodiments. The pulse is effectively transformed into a shape that allows effective operation of the timing recovery.

The outputs of the channels, after they have passed through the precursor filter 1140, are fed to a DFE 1150 that is implemented in a parallel manner. The output from the DFE 1150 is provided as parallel digitized data 1130. In addition, the parallel digitized data 1130 is also sampled and provided to two feedback functional blocks, namely, a timing recovery functional block 1160 and an AGC functional block 1170. The timing recovery functional block 1160 is operable to provide clock signals that are adapted as necessary, to each of the ADCs 1131-1139. In addition, the AGC functional block 1170 is operable to provide gain control signals to the PGAs 1121-1129.

The timing recovery functional block 1160 is operable to perform adjustment of the sampling times at which the various ADCs 1131-1139 may have sampled the incoming serial input data 1110. For example, the ADCs 1131-1139 may not operate ideally and may sample the serial input data 1110 at non-uniformly spaced times. To compensate and correct for this deficiency in a non-ideal array of ADCs, the timing recovery functional block 1160 is operable to adjust the time at which the ADCs effectively sample the serial input data 1110; more precise clock signals may be provided to the ADCs via the timing recovery functional block 1160. The AGC functional block 1170 is operable to provide input to the PGAs 1121-1129 to ensure that the gain of the serial input data 1110 is appropriate for the particular data type, channel response, and application context. The gain of the various channels into which the serial input data 1110 is partitioned, after having passed through the PGAs 1121-1129, may then be appropriately adjusted.

Figure 12:
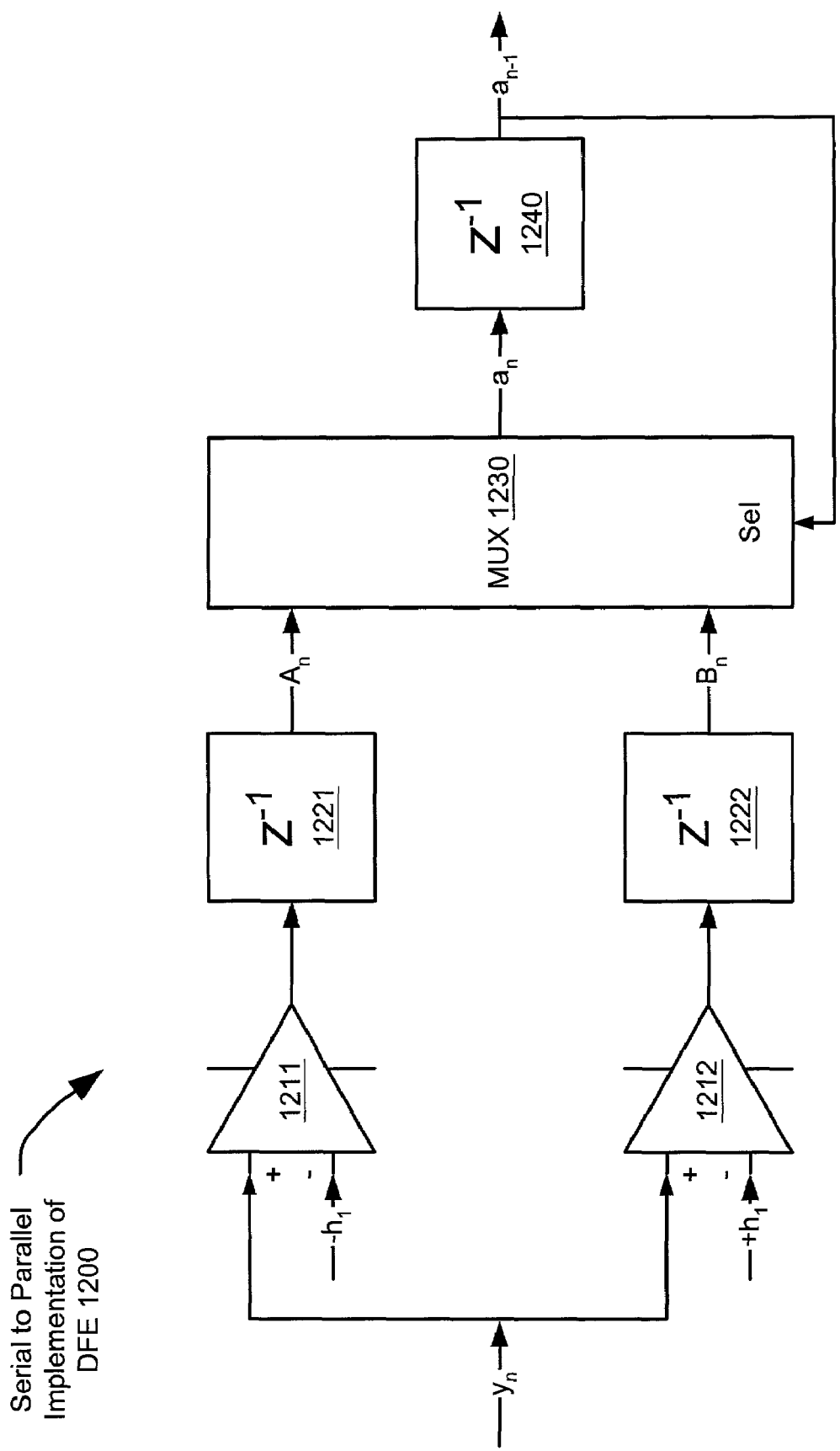
FIG. 12 is a system diagram illustrating an embodiment of a parallel implementation of a DFE that is built according to the present invention.
Figure 13:
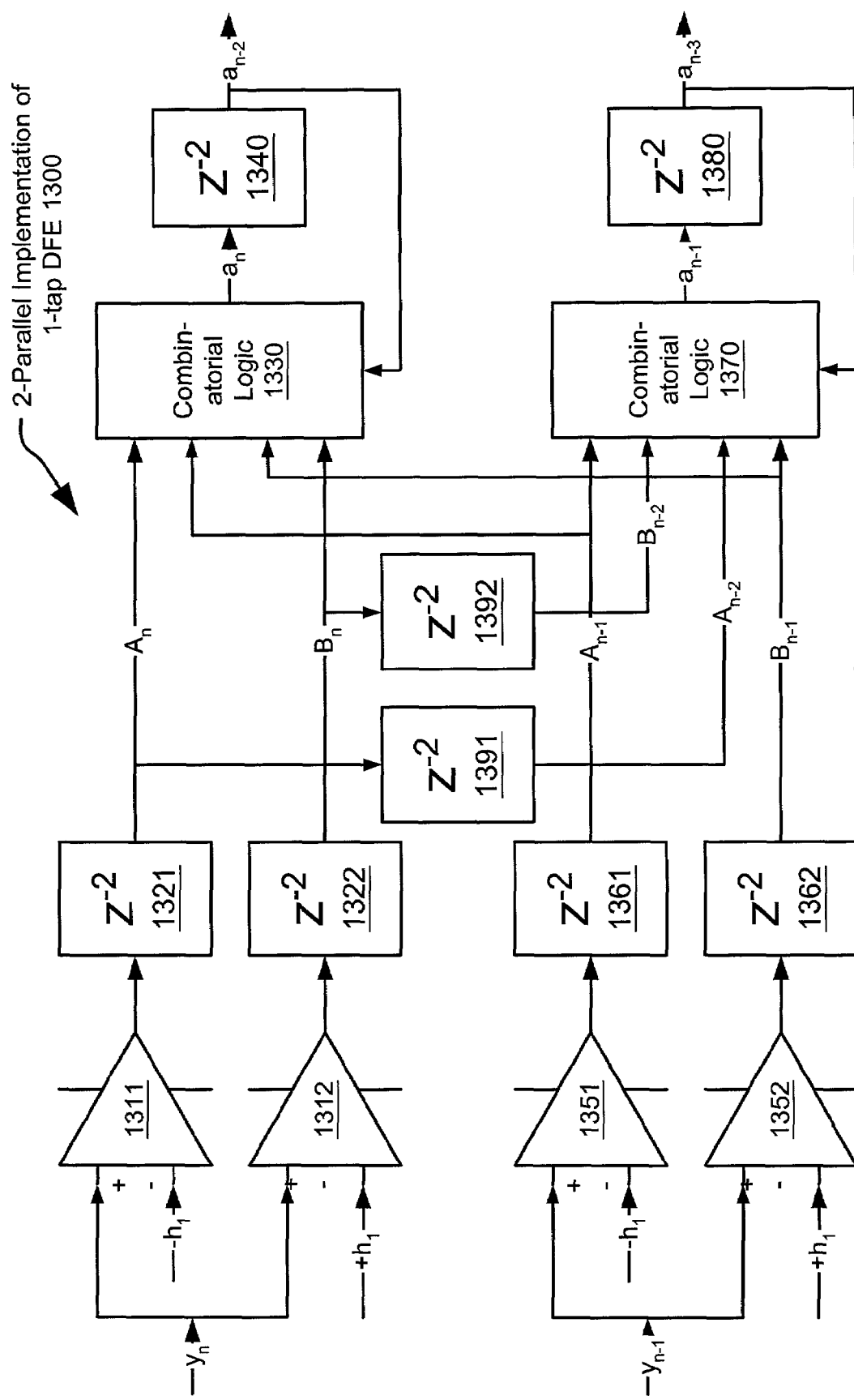
FIG. 13 is a system diagram illustrating an embodiment of a 2-parallel implementation of a 1-tap DFE that is built according to the present invention.

The following FIGS. 12 and 13 illustrate example embodiments of how parallel implementation of a DFE may be performed. These parallel implementations show just some examples of how a number of parallel paths may be generated. These parallel DFE architectures show just some of the broad range of parallel based embodiments in which the operations of the present invention may be performed. These parallel techniques and additional parallel techniques and details may be found in the following publication:

Sanjay Kasturia and Jack H. Winters, "Techniques for High-Speed Implementation of Nonlinear Cancellation," *IEEE Journal on Selected Areas in Communications*, vol. 9, no. 5, June 1991.

FIG. 12 is a system diagram illustrating an embodiment of a parallel implementation of a decision feedback equalizer (DFE) 1200 that is built according to the present invention. All the possible values of a feedback signal are pre-computed, and the selection of the appropriate feedback signal is selected using a multiplexor (MUX).

As shown in the 1-tap DFE embodiment of the FIG. 12, an input signal $y_n$ is fed simultaneously along two channels, one of which is a comparator 1211 and one of which is a comparator 1212. The comparator thresholds may be set to any desired values ($-h_1$ and $+h_1$) as required or desired for various applications. The output of the comparator 1211 is fed to a time delay $z^{-1}$ 1221, from which an output signal shown an $A_n$ is provided to a MUX 1230; the output of the comparator 1212 is fed to a time delay $z^{-1}$ 1222, from which an output signal shown an $B_n$ is provided to the MUX 1230.

The output from the MUX 1230, shown as $a_n$, is fed to a time delay $z^{-1}$ 1240, from which an output signal $a_{n-1}$ is ultimately output from the serial to parallel implementation of the DFE 1200.

The number of pre-computed feedback signals are stored in the MUX 1230, and the appropriate feedback signal is selected, as provided by the output signal $a_{n-1}$ that is fed back to select "Sel" from the MUX 1230. Rather that need to calculate the feedback signal, the present invention is operable to switch in the appropriate feedback signal based on information it may easily acquire including the input signal type and the channel response. In contradistinction to other implementations of a DFE, the present invention is operable to move the comparators 1211 and 1212 out of the feedback loop. The time delays 1221 and 1222 are added in to compensate and give time for the slowness of the comparators 1211 and 1212. For example, in some embodiments, the operational speed of the comparators 1211 and 1212 and the operational speed of the MUX 1230 may be of longer duration than a clock cycle. The present invention benefits greatly by the introduction of the time delays 1221 and 1222 to compensate for this possibility.

From certain perspectives, the FIG. 12 shows a first step of implementation of a DFE, where all of the possible feedback signals are pre-computed, and a slicer in the feedback loop is replaced by a MUX.

A second step is to perform the look-ahead transformation in doing the serial to parallel implementation of the DFE. The look-ahead transformation involves employing the following equations:

$$a_n = A_n a_{n-1} + B \bar{a}_{n-1}$$

$$a_{n-1} = A_{n-1} a_{n-2} + B_{n-1} \bar{a}_{n-2}$$

Then, the second expression is replaced into the first expression as follows:

$$a_n = (A_n A_{n-1} + B_n A_{n-1}) a_{n-2} + (A_n B_{n-1} + B_n \bar{B}_{n-1}) \bar{a}_{n-2}$$

Then, we have the following result:

$$a_{n-1} = (A_{n-1} A_{n-2} + B_{n-1} A_{n-2}) a_{n-3} + (A_{n-1} B_{n-2} + B_{n-1} \bar{B}_{n-2}) \bar{a}_{n-3}$$

The look-ahead transformation is understood in the context of parallel processing by those persons having skill in the art. By getting a in terms of $a_{n-2}$, the clock speed may effectively be slowed by a factor of 2. If desired, the look-ahead transformation may also be performed multiple times, getting a in terms of $a_{n-m}$, the clock speed may effectively be slowed by a factor of m. Those persons having skill in the art will understand the extendibility of such operations to effectively allow operation at slower clock frequencies while still maintaining performance.

FIG. 13 is a system diagram illustrating an embodiment of a 2-parallel implementation of a 1-tap decision feedback equalizer (DFE) 1300 that is built according to the present invention. From certain perspectives, FIG. 13 may be viewed as being a hardware implementation of the look-ahead transformation equations described above. The DFE is one example of an embodiment of how the present invention may be parallelized. Some equalization and compensation methods may not easily be parallelized, but the present invention is adaptable to take full advantage of any of those equalization and compensation methods that may be parallelized.

Here, the present invention shows its adaptability to operate with a clock signal that is reduced by a factor of 2. Two parallel paths of the DFE are used in the FIG. 13. As shown in the 1-tap DFE embodiment of the FIG. 13, an input signal $y_n$ is fed simultaneously along two channels, one of which is a comparator 1311 and one of which is a comparator 1312. The comparator thresholds may be set to any desired values ($-h_1$ and $+h_1$) as required or desired for various applications. The output of the comparator 1311 is fed to a time delay $z^{-2}$ 1321, from which an output signal shown an $A_n$ is provided to combinatorial logic 1330; the output of the comparator 1312 is fed to a time delay $z^{-2}$ 1322, from which an output signal shown an $B_n$ is provided to the combinatorial logic 1330. The output from the combinatorial logic 1330, shown as $a_n$, is fed to a time delay $z^{-2}$ 1340, from which an output signal $a_{n-2}$ is ultimately output as the first output from the 2-parallel implementation of a 1-tap DFE 1300.

Analogously, an input signal $y_{n-1}$ is fed simultaneously along two channels, one of which is a comparator 1351 and one of which is a comparator 1352. The comparator thresholds may be set to any desired values ($-h_1$ and $+h_1$) as required or desired for various applications. The output of the comparator 1351 is fed to a time delay $z^{-2}$ 1361, from which an output signal shown an $A_{n-1}$ is provided to combinatorial logic 1370; the output of the comparator 1352 is fed to a time delay $z^{-2}$ 1362, from which an output signal shown as $B_{n-1}$ is provided to the combinatorial logic 1370. The output from the combinatorial logic 1370, shown as $a_{n-1}$, is fed to a time delay $z^{-2}$ 1380, from which an output signal $a_{n-3}$ is ultimately output as the second output from the 2-parallel implementation of a 1-tap DFE 1300.

The operations of the combinatorial logics 1330 and 1370 are operable to perform the combination of the two parallel paths in this embodiment. As the number of parallel paths increases, as may be performed in alternative embodiments, the complexity of the combinatorial logics associated will also be increased. However, the increase in complexity of the combinatorial logic is slight when compared to advantages of enabling high-speed operation at significantly reduced clock rates. The combinatorial logics are operable to ensure proper implementation of the equations that enable the representation of a present sample in terms of samples 1 or 2 samples away. For example, the look-ahead transformation described above shows the implementation where a present sample may be made using samples that are at least two samples away. Those persons having skill in the art will appreciate that the present invention may be extended so as to permit the implementation of representing a present sample by a sample that is any number n samples away.

In addition, the two parallel paths of the 2-parallel implementation of a 1-tap DFE 1300 are coupled to one another. For example, the intermediate output signal $A_n$ from the time delay $z^{-2}$ 1321 is also fed through a time delay $z^{-2}$ 1391, from which an output signal $A_{n-2}$ is fed to the combinatorial logic 1370; the intermediate output signal $B_n$ from the time delay $z^{-2}$ 1322 is also fed through a time delay $z^{-2}$ 1392, from which an output signal $B_{n-2}$ is also fed to the combinatorial logic 1370.

In somewhat analogous manner, the intermediate output signal $A_{n-1}$ from the time delay $z^{-2}$ 1361 is fed as one of the inputs to the combinatorial logic 1330; the intermediate output signal $B_{n-1}$ from the time delay $z^{-2}$ 1362 is fed as one of the inputs to the combinatorial logic 1330.

It is also noted that the architecture of the embodiment shown in the FIG. 13 may be generalized to any number of taps K, and any arbitrary number of parallel processors M. The clock speed will then be reduces by the factor M, while maintaining operable performance, and the number of thresholds required will grow as $2^K$. Theoretically speaking, the clock speed may be reduced indefinitely by extending this particular parallel implementation. While the complexity of the combinatorial logics 1330 and 1370 may be somewhat more involved to implement the increased number of parallel paths, the benefits of allowing operation at significantly reduced clock rates will be appreciated by those persons having skill in the art. The complexity of the overall system grows roughly as $M2^K$. Again, it is also noted that the comparator thresholds may be set to any desired values as required or desired for various applications.

However, in one embodiment, if the thresholds are sorted in increased order, the operation done by the comparators may be viewed as being a "non-linear thermometer code" encoder. The non-linearity stems from the fact that, in general, the thresholds are not evenly spaced. To accomplish the non-linear mapping, a look up table storing the non-linear mapping, stored in memory that may be Random Access Memory (RAM), could be used. The output of the look up table would then need to be "reverse sorted" to compensate for the sorting operation performed on the thresholds. The combinatorial logics 1330 and 1370 may be employed that is operable to undo this sorting of the thresholds. The combined operation of this non-linear mapping, in conjunction with the operation of the combinatorial logic, by re-ordering the thresholds back to their original ordering, may be used in this and in other embodiments as well.

Figure 14:
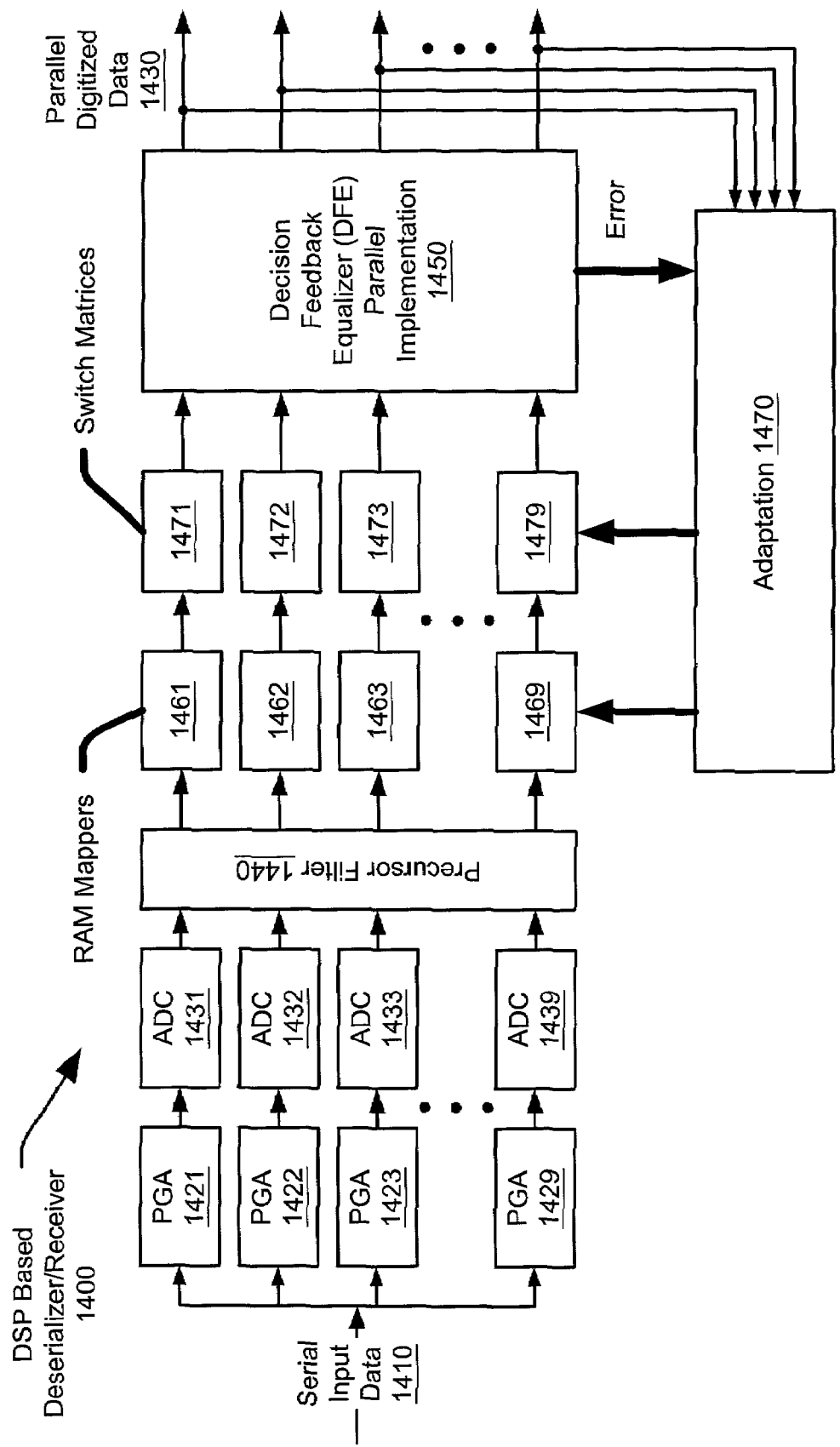
FIG. 14 is a system diagram illustrating an embodiment of a DSP based de-serializer/receiver that is built according to the present invention.

FIG. 14 is a system diagram illustrating an embodiment of a DSP based de-serializer/receiver 1400 that is built according to the present invention. Serial input data 1410 is fed simultaneously to a number of PGAs, shown as a PGA 1421, a PGA 1422, a PGA 1423, . . . , and a PGA 1429. The outputs of each of the PGAs form channels for the serial input data 1410, after undergoing any gain adjustment using the PGAs 1421-1429. The output of each of these PGAs is fed to an ADC where the serial data is sampled using a number of ADCs, shown as an ADC 1431, an ADC 1432, an ADC 1433, . . . , and an ADC 1439. Together, the ADCs 1431-1439 operate to achieve an effective sampling rate of the sum total of each of the sampling rates of the ADCs 1431-1439. Each of the ADCs 1431-1439 operates at substantially the same sampling rate. Additional intelligence may be employed in various embodiments to accommodate the situation where some of the ADCs operate at different sampling rates as the other of the ADCs. The outputs of each of the ADCs are fed to a precursor filter 1440. The precursor filter 1440 performs the operation of properly creating zero crossings in the now digital samples. The precursor filter 1440 also performs pulse shaping to ensure that the pulse is in the proper shape so as to enable timing recovery, as will be described below as well as in other various embodiments. The pulse is effectively transformed into a shape that allows effective operation of the timing recovery.

The outputs of the channels, after they have passed through the precursor filter 1440, are each fed to a RAM mapper, shown as a RAM mapper 1461, a RAM mapper 1462, a RAM mapper 1463, . . . , and a RAM mapper 1469. The RAM mappers 1461-1469 may include the non-linear mapping of a "non-linear thermometer code". Other non-linear mappings may also be implemented using the RAM mappers 1461-1469 as well without departing from the scope and spirit of the invention. The channeled output from the RAM mappers 1461-1469 are each fed to a switch matrix, shown as a switch matrix 1471, a switch matrix 1472, a switch matrix 1473, . . . , and a switch matrix 1479. The switch matrices 1471-1479 are each operable to perform the undoing of the mapping performed in the RAM mappers 1461-1469; that is to say, the switch matrices 1471-1479 are operable to reorder the sorting of the thresholds back to their original ordering for subsequent processing purposes.

The outputs of the switch matrices 1471-1479 are each provided to a decision feedback equalizer 1450 that is implemented in a parallel manner. The output from the decision feedback equalizer 1450 is provided as parallel digitized data 1430. In addition, the parallel digitized data 1430 is also sampled and provided to an adaptation functional block 1470. The adaptation functional block 1470, in this embodiment, is shown to provide correction to each of the RAM mappers 1461-1469 and to each of the switch matrices 1471 based on error information provided by the decision feedback equalizer 1450.

In addition, the embodiment shown in the FIG. 14 may also be adapted to provide for timing recovery and automatic gain control (AGC) based on the sampling of the parallel digitized data 1430, in similar manner as that shown in the FIG. 11. For example, timing recovery may be employed to provide clock signals that are adapted as necessary, to each of the ADCs 1431-1439. In addition, the AGC may be employed to provide gain control signals to the PGAs 1421-1429. Timing recovery may be used to perform adjustment of the sampling times at which the various ADCs 1431-1439 may have sampled the incoming serial input data 1410. For example, the ADCs 1431-1439 may not operate ideally and may sample the serial input data 1410 at non-uniformly spaced times. To compensate and correct for this deficiency in a non-ideal array of ADCs, timing recovery may be used to adjust the time at which the ADCs effectively sample the serial input data 1410; more precise clock signals may be provided to the ADCs via timing recovery as well. AGC would be operable to provide input to the PGAs 1421-1429 to ensure that the gain of the serial input data 1410 is appropriate for the particular data type, channel response, and application context. The gain of the various channels into which the serial input data 1410 is partitioned, after having passed through the PGAs 1421-1429, may then be appropriately adjusted.

Figure 15:
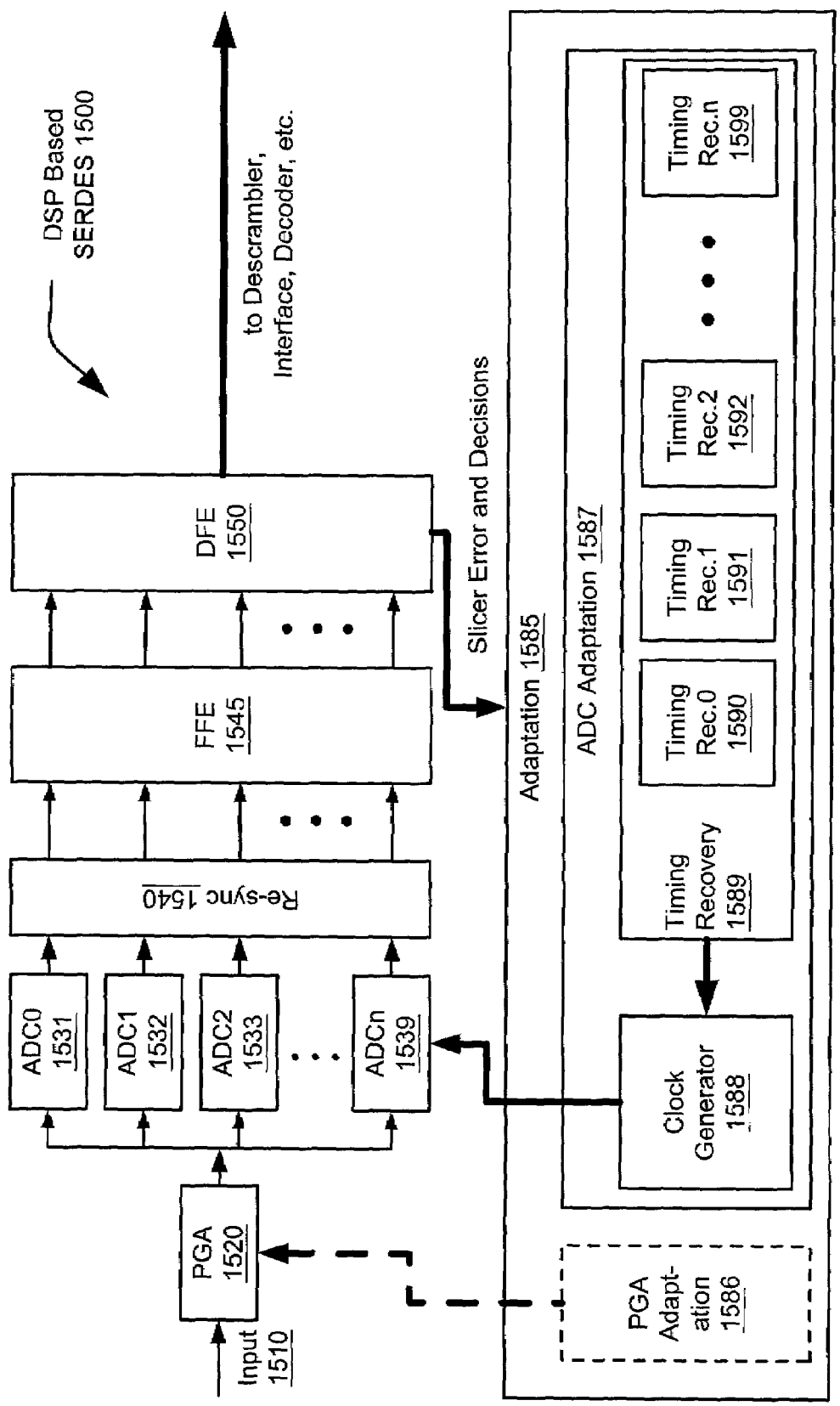
FIG. 15 is a system diagram illustrating another embodiment of a DSP based SERDES 1500 that is built according to the present invention.

FIG. 15 is a system diagram illustrating an embodiment of a DSP based SERDES 1500 that is built according to the present invention. The FIG. 15 shows a top-level block diagram of the operation of a SERDES according to the present invention.

Input data 1510 is fed to a single PGA 1510, where any necessary gain adjustment of the input data 1510 may be performed. In alternative embodiments, multiple PGAs may be employed in place of the PGA 1510, as described in many of the other various embodiments of the present invention. The output of the PGA 1510 is simultaneously fed to a number of ADCs, shown as an ADC0 1531, an ADC1 1532, an ADC2 1533, . . . , and an ADCn 1539, where it is digitally sampled. The outputs of each of the ADCs form channels for the serial input data 1510. The sampling of the ADCs 1531-1539 may be adapted to be performed at delayed times. If desired, each of the ADC 1531-1539 covers a different portion of a cycle of the input data 1510. Together, the ADCs 1531-1539 operate to achieve an effective sampling rate of the sum total of each of the sampling rates of the ADCs 1531-1539. Each of the ADCs 1531-1539 operates at substantially the same sampling rate. Additional intelligence may be employed in various embodiments to accommodate the situation where some of the ADCs operate at different sampling rates as the other of the ADCs.

The outputs of each of the ADCs are fed to a re-synchronization functional block 1540. The re-synchronization functional block 1540 is operable to synchronize the outputs of all the ADCs in the interleaved array so that the DSP can operate with a single clock. As a result of the interleaved operation, each ADC outputs its samples at a different time instant. The re-synchronization functional block 1540 outputs all samples at the transitions of a single clock, which is the same clock used to operate the DSP.

The channels coming out of the re-synchronization functional block 1540 are fed into a feed forward equalizer (FFE) 1545, from which the channeled outputs are fed to a decision feedback equalizer (DFE) 1550. The DFE 1550 provides information concerning slicer error and decision to an adaptation functional block 1585. The adaptation functional block 1585 is operable to perform PGA adaptation 1586 and ADC adaptation 1587. The PGA adaptation 1586 is operable to provide control to the PGA 1520. In addition, the ADC adaptation 1587 is operable to provide timing recovery 1589 to the ADCs 1531-1539. The timing recovery 1589 may be performed individually for each of the ADCs 1531-1539, as shown by the individual timing recovery functional blocks, including a timing recovery 0 functional block 1590, a timing recovery 1 functional block 1591, a timing recovery 2 functional block 1592, . . . , and a timing recovery n functional block 1599. The timing recovery 1589 is fed to a clock generator functional block 1588 whose output may be fed individually to the ADCs 1531-1539.

Figure 16:
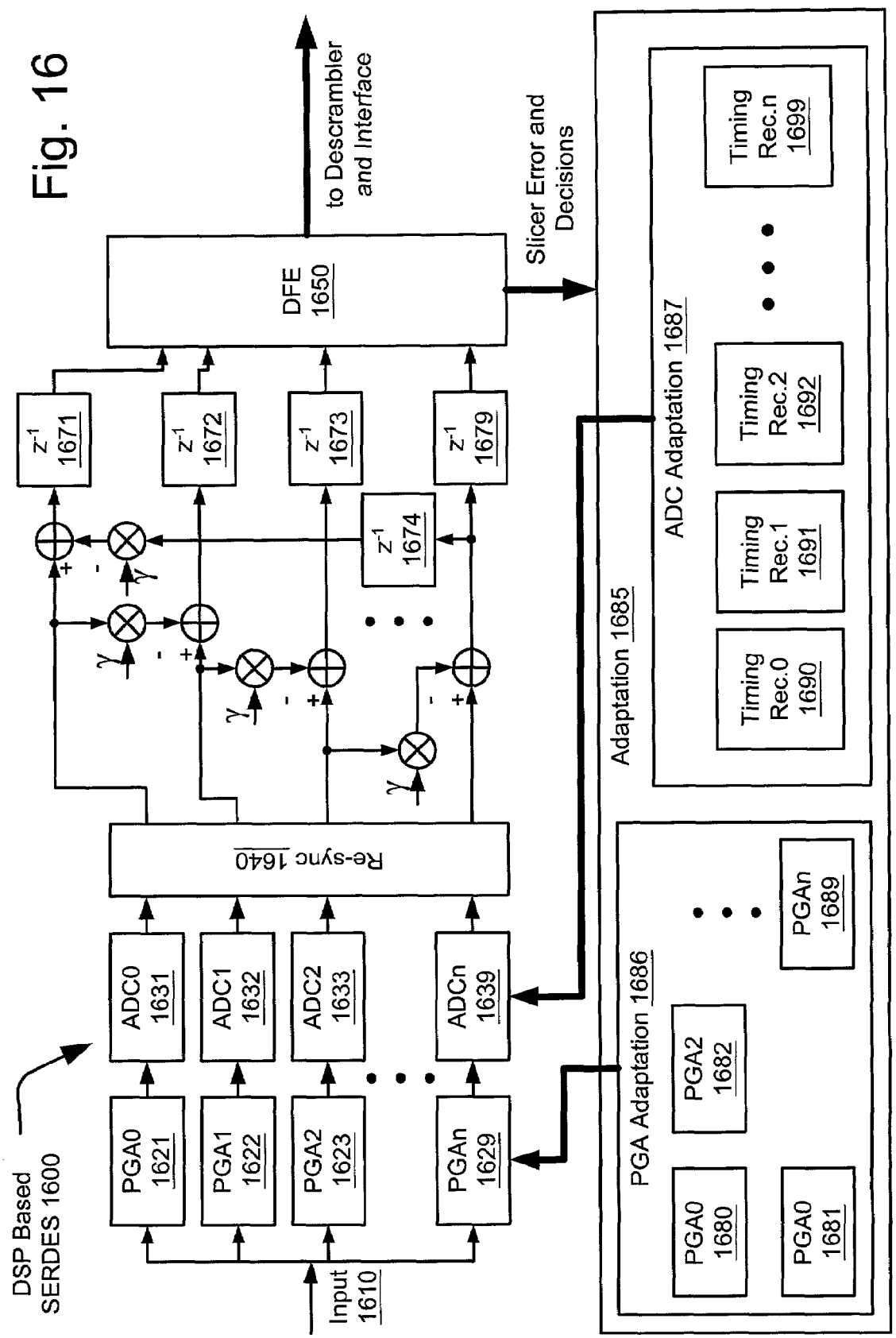
FIG. 16 is a system diagram illustrating another embodiment of a DSP based SERDES that is built according to the present invention.

FIG. 16 is a system diagram illustrating another embodiment of a DSP based SERDES 1600 that is built according to the present invention. The FIG. 16 also shows a top-level block diagram of the operation of a SERDES according to the present invention.

Input data 1610 is fed simultaneously to a number of programmable gain amplifiers (PGAs), shown as a PGA0 1621, a PGA1 1622, a PGA2 1623, . . . , and a PGAn 1629. The outputs of each of the PGAs form channels for the serial input data 1610, after undergoing any gain adjustment using the PGAs 1621-1629. The output of each of these PGAs is fed to an ADC where the serial data is sampled using a number of ADCs, shown as an ADC0 1631, an ADC1 1632, an ADC2 1633, . . . , and an ADCn 1639. The sampling of the ADCs 1631-1639 may be adapted to be performed at delayed times. If desired, each of the ADC 1631-1639 covers a different portion of a cycle of the input data 1610. Together, the ADCs 1631-1639 operate to achieve an effective sampling rate of the sum total of each of the sampling rates of the ADCs 1631-1639. If desired, each of the ADCs 1631-1639 operates at substantially the same sampling rate. Additional intelligence may be employed in various embodiments to accommodate the situation where some of the ADCs operate at different sampling rates as the other of the ADCs. The outputs of each of the ADCs are fed to a re-synchronization functional block 1640.

The channeled outputs of the re-synchronization functional block 1640 are fed along a path in which a summer is placed, followed by a time delay $z^{-1}$. In addition, each of the channeled paths is coupled to another of the channeled paths. A scaled version of each of the channeled paths is added in the summers to the channel below it, except for the bottom-most channel, whose scaled version is added to the top-most channel after having passed through a time delay $z^{-1}$ 1679. The scaling factor employed in this embodiment is shown as γ, and those persons having skill in the art will appreciate that any other factor may be used to scale the channels before they are added to another channel.

For example, the top-most channel is fed to a summer that receives a γ-scaled and delayed (via the time delay $z^{-1}$ 1679) version of the bottom-most channel, and it is then passed to a time delay $z^{-1}$ 1671, before being fed to a decision feedback equalizer 1650. The $2^{nd}$ channel from the top is fed to a summer that receives a γ-scaled version of the top channel, and it is then passed to a time delay $z^{-1}$ 1672, before it is fed to the decision feedback equalizer 1650; the $3^{rd}$ channel from the top is fed to a summer that receives a γ-scaled version of the $2^{nd}$ channel from the top, and it is then passed to a time delay $z^{-1}$ 1673, before it is fed to the decision feedback equalizer 1650, whose output is provided to a de-scrambler and interface. This continues for each of the channels within the embodiment shown in the FIG. 16.

The decision feedback equalizer 1650 provides information concerning slicer error and decision to an adaptation functional block 1685. The adaptation functional block 1685 is operable to perform PGA adaptation 1686 and ADC adaptation 1687. The PGA adaptation 1686 is operable to provide individual control to each of the PGAs 1621-1629, as shown by the individual PGA adaptation functional blocks, including a PGA0 functional block 1680, a PGA1 functional block 1681, a PGA2 functional block 1682, ..., and a PGAn functional block 1689. Analogously, the ADC adaptation 1687 is operable to provide individual control to each of the ADCs 1631-1639, as shown by the individual timing recovery functional blocks, including a timing recovery 0 functional block 1690, a timing recovery 1 functional block 1691, a timing recovery 2 functional block 1692, ..., and a timing recovery n functional block 1699.

Figure 17:
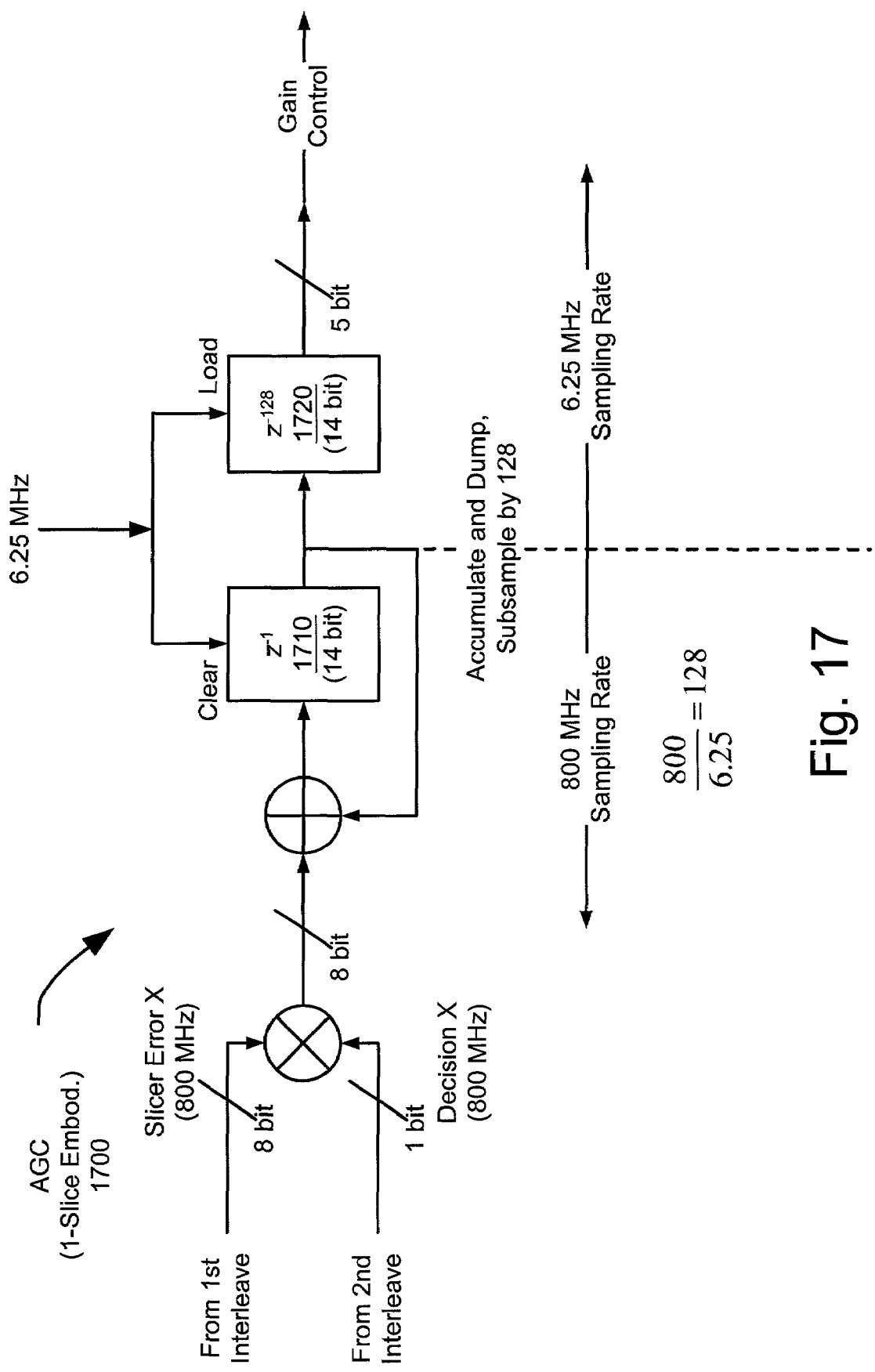
FIG. 17 is a system diagram illustrating a 1-slice embodiment of automatic gain control (AGC) that is implemented according to the present invention.

FIG. 17 is a system diagram illustrating a 1-slice embodiment of automatic gain control (AGC) 1700 that is implemented according to the present invention. In this embodiment, a slicer error for the slice X (8 bit precision) is provided to a multiplier, where it is combined also with a decision for the slicer error X (1 bit precision); both the slicer error and the decision are provided from the same interleave. Both the slicer error for the slice X and the decision for the slice X are both based on an 800 MHz clock frequency/sampling rate. The output of the multiplier is also 8 bit precision, and it is fed to a summer. The output of the summer if fed to a time delay $z^{-1}$ 1710 having a 14 bit precision. The output of the time delay $z^{-1}$ 1710 is fed back to the summer and also passed to time delay $z^{-128}$ 1720 having a 14 bit precision. The clock frequency/sampling rate of the time delay $z^{-128}$ 1720 is 6.25 MHz. The 6.25 MHz clock is fed to both the time delay $z^{-1}$ 1710 and the time delay $z^{-128}$ 1720. The ratio of the clock frequencies 800 MHz/6.25 MHz is 128, thereby requiring the time delay $z^{-128}$ 1720. Between the time delay $z^{-1}$ 1710 and the time delay $z^{-128}$ 1720, an accumulate and dump operation is performed where the signal in the time delay $z^{-1}$ 1710 is sub-sampled by 128. A 5 bit gain control signal is provided as output from the time delay $z^{-128}$ 1720.

The control signal, generated by the AGC 1700, may be employed in any of the various embodiments to perform adaptation/compensation of a single AGC, or an array of AGCs, according to the present invention. The FIG. 17 shows just one embodiment where such adaptation/compensation may be performed. Depending on the ratios of the two clock frequencies that are to be interfaced, the ratios of the time delays may be appropriately adjusted. The FIG. 17 shows a clock frequency ration of 128, but those persons having skill in the art will appreciate that other clock frequency ratios may also be employed. In addition, varying degrees of digital precision may also be employed without departing from the scope and spirit of the invention. From certain perspectives, FIG. 17 may be viewed as being an implementation of a least means square (LMS) equalizer using a 1-tap method.

Figure 18:
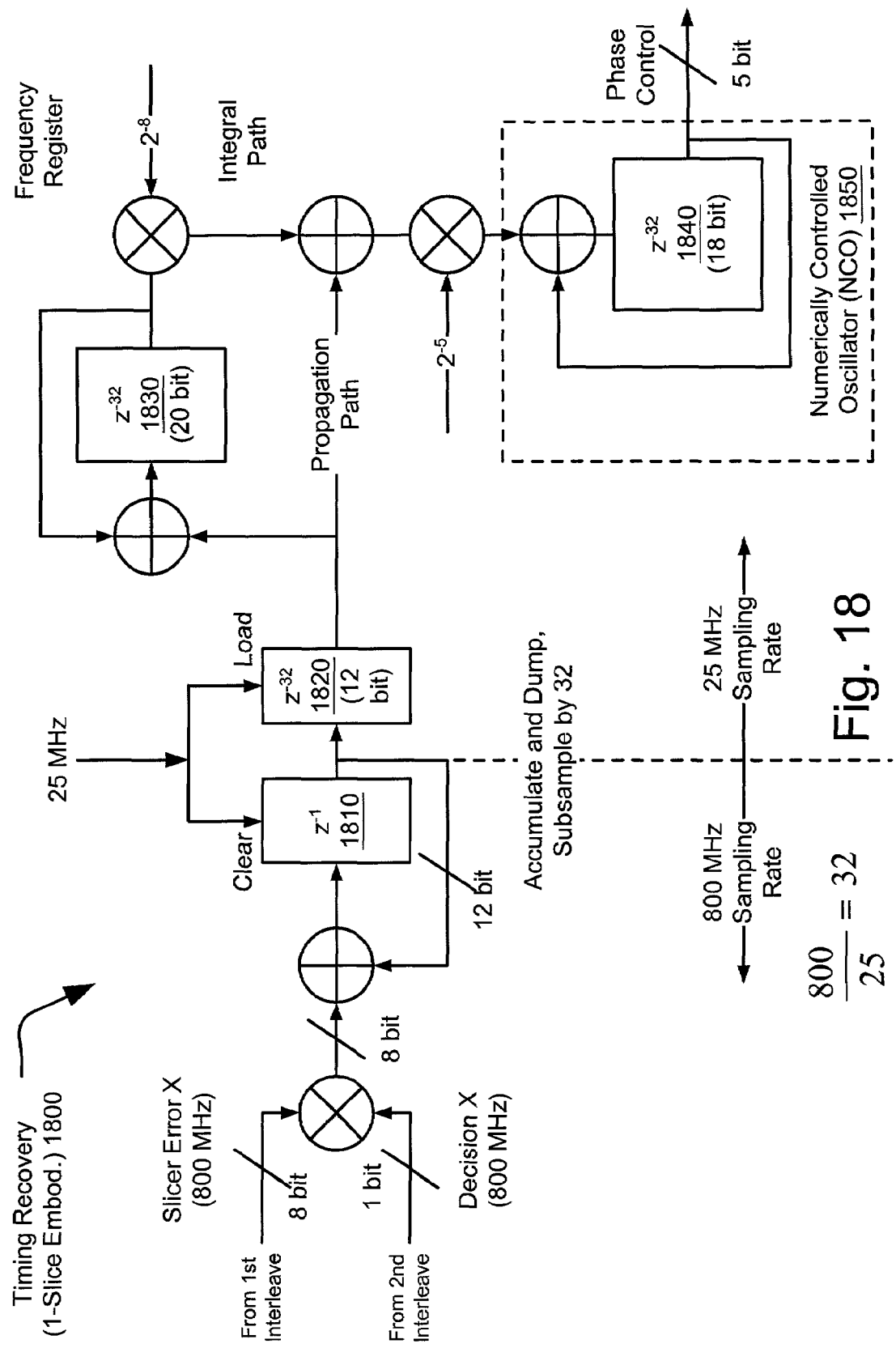
FIG. 18 is a system diagram illustrating a 1-slice embodiment of timing recovery that is implemented according to the present invention.

FIG. 18 is a system diagram illustrating a 1-slice embodiment of timing recovery 1800 that is implemented according to the present invention. In this embodiment, a slicer error for the slice X (8 bit precision) is provided to a multiplier, where it is combined also with a decision for the slicer error X (1 bit precision); both the slicer error and the decision are provided from different interleaves. It can be shown that the averaged value of the product of the decision and the delayed slicer error, as computed by this circuit, is an estimator of the precursor of the channel response. The phase locked loop of FIG. 18 forces the sampling phase to a value such that the precursor is zero, in other words, the sampling phase is determined by the zero crossing of the precursor of the channel response. Both the slicer error for the slice X and the decision for the slice X are both based on an 800 MHz clock frequency/sampling rate. The output of the multiplier is also 8 bit precision, and it is fed to a summer. The output of the summer if fed to a time delay $z^{-1}$ 1810 having a 12 bit precision. The output of the time delay $z^{-1}$ 1810 is fed back to the summer and also passed to time delay $z^{-32}$ 1820 having a 12 bit precision. The clock frequency/sampling rate of the time delay $z^{-32}$ 1820 is 25 MHz. The 25 MHz clock is fed to both the time delay $z^{-1}$ 1810 and the time delay $z^{-32}$ 1820. The ratio of the clock frequencies 800 MHz/25 MHz is 32, thereby requiring the time delay $z^{-32}$ 1820. Between the time delay $z^{-1}$ 1810 and the time delay $z^{-32}$ 1820, an accumulate and dump operation is performed where the signal in the time delay $z^{-1}$ 1810 is sub-sampled by 32. A proportional path signal is provided as output from the time delay $z^{-2}$ 1820 to a second summer.

The proportional path signal is also provided to a summer in an integral path as well (top right hand side of FIG. 18). The output from the summer is passed through a frequency register/time delay $z^{-32}$ 1830 having 20 bit precision. The output of the time delay $z^{-32}$ 1830 is fed back to the summer, where it is again combined with the proportional path signal, and it is also provided to a multiplier where it is scaled by an integral path signal shown as $2^{-8}$; the output of the multiplier is provided to the second summer whose output is fed down to a multiplier where it is scaled by a signal shown as $2^{-5}$; this top right hand corner of the FIG. 18 may be viewed as being a $2^{nd}$ order P+I (proportional+integral) phase locked loop (PLL). The proportional control is provided by the signal shown as $2^{-5}$. The output of this multiplier is fed to a numerically controlled oscillator (NCO) 1850. The NCO 1850 includes a summer whose output is fed to a time delay $z^{-32}$ 1840 having 18 bit precision. The output of the time delay $z^{-32}$ 1840 is also fed back to the summer within the NCO 1850, and the output of the time delay $z^{-32}$ 1840 also serves as the output of the NCO 1850. The bottom right hand corner of the FIG. 18, including the NCO 1850 may be viewed as including an integrator that is permitted to overflow to provide for timing recovery control. The output of the timing recovery 1800 is a phase control signal of 5 bit precision.

The phase control signal, generated by the timing recovery 1800, may be employed in any of the various embodiments to perform adaptation/compensation of a single ADC, or an array of ADCs, according to the present invention. The FIG. 18 shows just one embodiment where such adaptation/compensation may be performed. Depending on the ratios of the two clock frequencies that are to be interfaced, the ratios of the time delays may be appropriately adjusted. The FIG. 18 shows a clock frequency ratio of 32, but those persons having skill in the art will appreciate that other clock frequency ratios may also be employed. In addition, varying degrees of digital precision may also be employed without departing from the scope and spirit of the invention.

Figure 19:
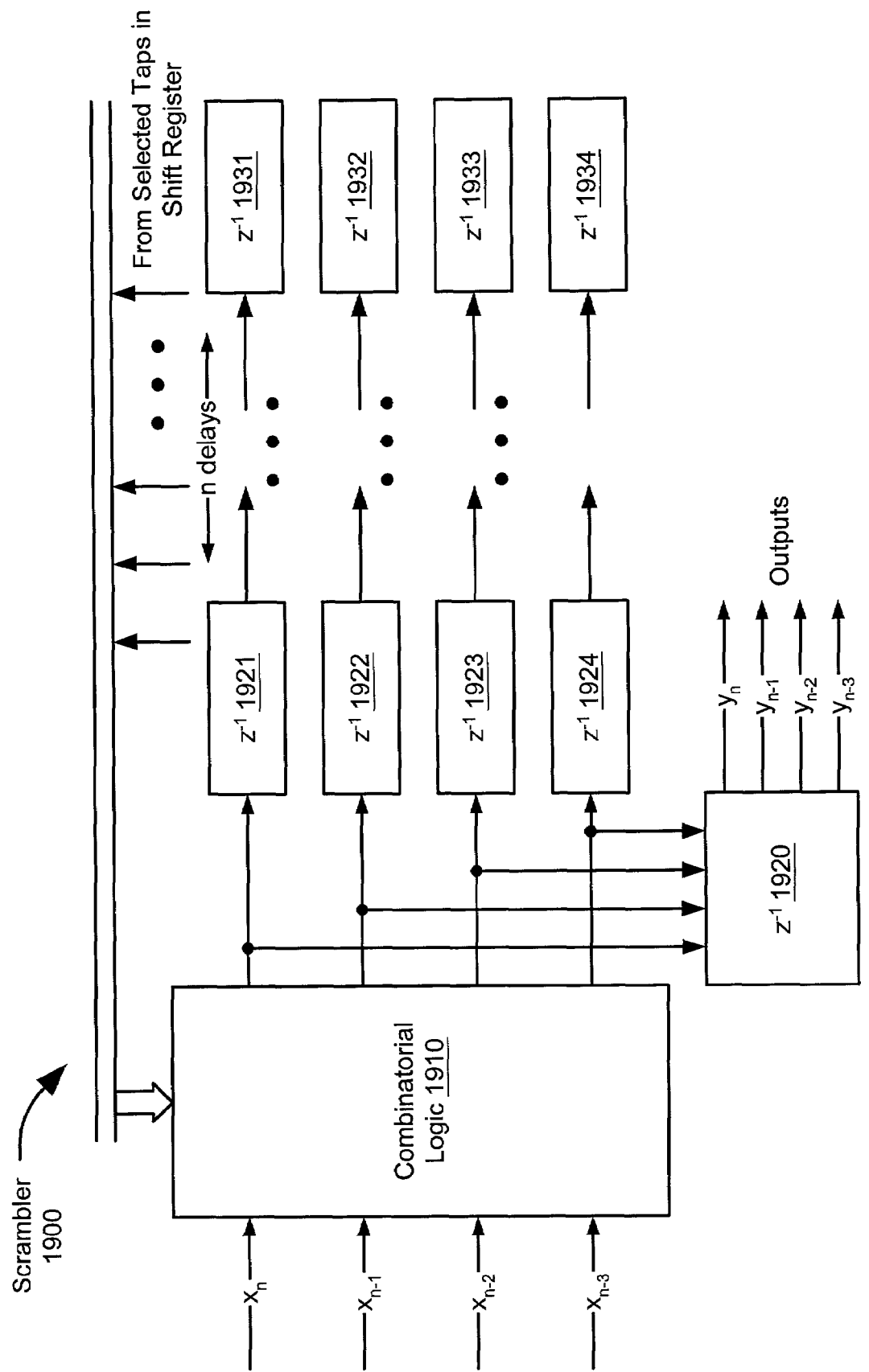
FIG. 19 is a system diagram illustrating an embodiment of a scrambler that is employed according to the present invention.

FIG. 19 is a system diagram illustrating an embodiment of a scrambler 1900 that is employed according to the present invention. The scrambler is operable to receive multiple inputs, shown generically as $x_n$, $x_{n-1}$, $x_{n-2}$, and $x_{n-3}$. Those persons having skill in the art will recognize that any number of inputs may be used, and not merely the four illustrated in the FIG. 19. The inputs are fed into combinatorial logic 1910, whose outputs are fed to a number n of time delays, shown at the top as a time delay $z^{-1}$ 1921, . . . , and a time delay $z^{-1}$ 1931. Similarly, there is a number n of time delays for the other three channels as well. A number of taps, as determined from information stored in a shift register, are selected and fed back to the combinatorial logic 1910. In addition, the output signals from the combinatorial logic 1910 are all fed to a time delay $z^{-1}$ 1920, from which the outputs $y_n$, $y_{n-1}$, $y_{n-2}$, and $y_{n-3}$ are generated. The clock rate is 800 MHz in this particular embodiment, but other clock rates may also be employed as understood by those persons having skill in the art.

The scrambler 1900 is employed to ensure a random looking data stream, as will be understood by those persons having skill in the art. If desired, the same polynomial as that used in 1000BaseT Ethernet may be employed, as used on the slave side as follows:

$$g_s(x)=1+x^{20}+x^{33}$$

For simplicity, this may be implemented as a self-synchronizing scrambler. The self-synchronizing scrambler may be viewed as being essentially a recursive filter (in modulo 2 arithmetic), and it can be parallelized using a number of transformations including a look-ahead transformation.

Figure 20:
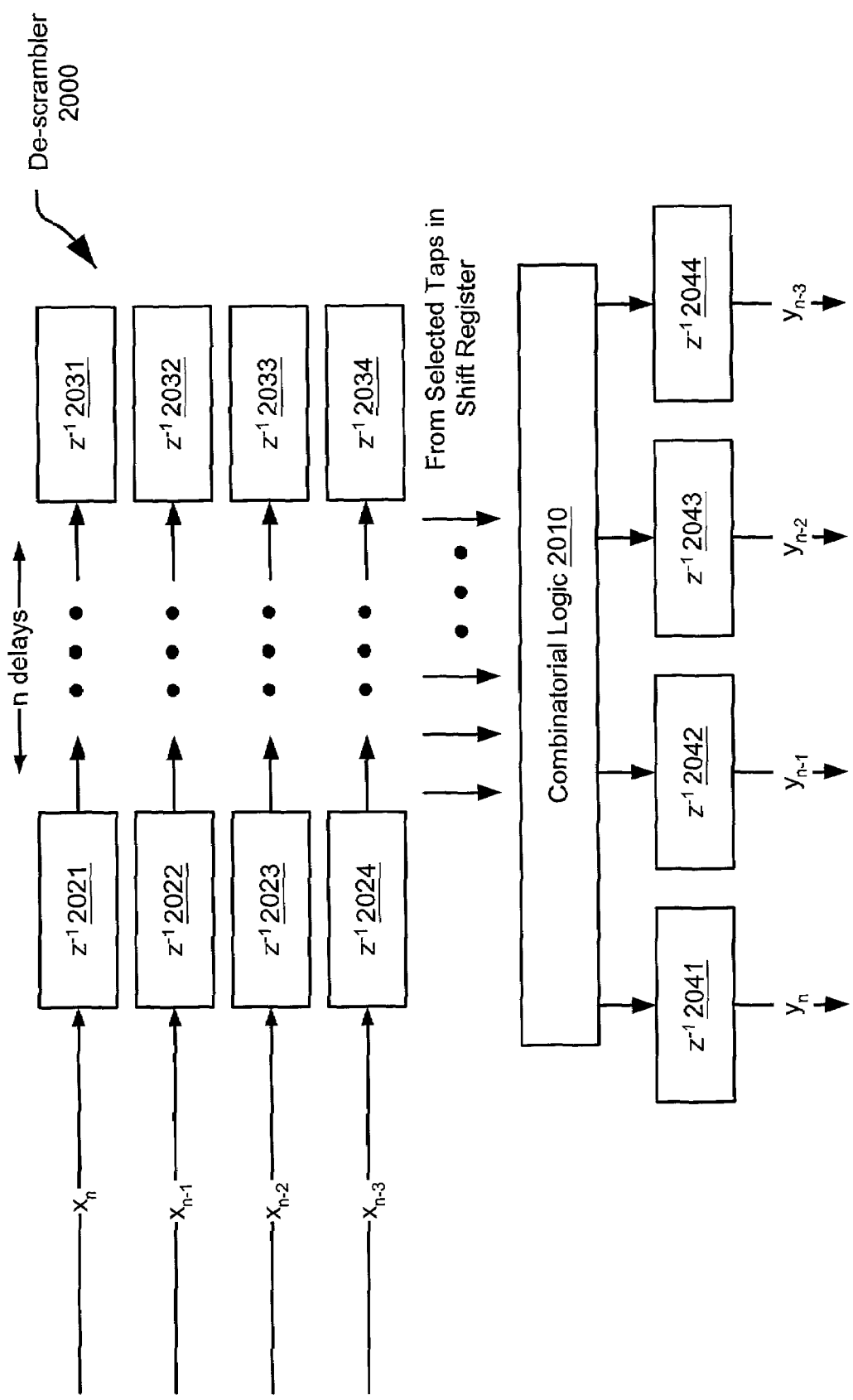
FIG. 20 is a system diagram illustrating an embodiment of a de-scrambler that is employed according to the present invention.

FIG. 20 is a system diagram illustrating an embodiment of a de-scrambler 2000 that is employed according to the present invention. The de-scrambler 2000 may be viewed as the entity that performs the de-scrambling of the scrambling performed by the scrambler 1900. The de-scrambler 2000 is operable to receive multiple inputs, shown generically as $x_n$, $x_{n-1}$, $x_{n-2}$, and $x_{n-3}$. Those persons having skill in the art will recognize that any number of inputs may be used, and not merely the four illustrated in the FIG. 20. The inputs are fed into channels having a number n of time delays. The top channel, for the input of $x_n$, is fed into a time delay $z^{-1}$ 2021, . . . , and a time delay $z^{-1}$ 2031. The other three channels in this embodiment are handled similarly. As determined from information stored in a shift register, the selected taps indicate which taps are to be fed into a combinatorial logic 2010. In addition, the output signals from the combinatorial logic 2010 are each fed to individual time delays, shown as a time delay $z^{-1}$ 2041, a time delay $z^{-1}$ 2042, a time delay $z^{-1}$ 2043, and a time delay $z^{-1}$ 2044, from which the outputs $y_n$, $y_{n-1}$, $y_{n-2}$, and $y_{n-3}$ are generated. The clock rate is 800 MHz in this particular embodiment, but other clock rates may also be employed as understood by those persons having skill in the art. The outputs $y_n$, $y_{n-1}$, $y_{n-2}$, and $y_{n-3}$ in the FIG. 20 represent the unscrambled version of the inputs outputs $x_n$, $x_{n-1}$, $x_{n-2}$, and $x_{n-3}$ of the FIG. 19.

In addition, the present invention is operable to employ a start-up controller in various embodiments. A start-up controller is a state machine that sequences the control signals during start-up to facilitate convergence of various components including DFE, AGC, and timing recovery. The start-up controller is operable to run at relatively low clock speeds, so as not to contribute significantly to power dissipation in the overall system. For example, a nominal clock rate of less than 1 MHz would be sufficient in most instances.

Figure 21:
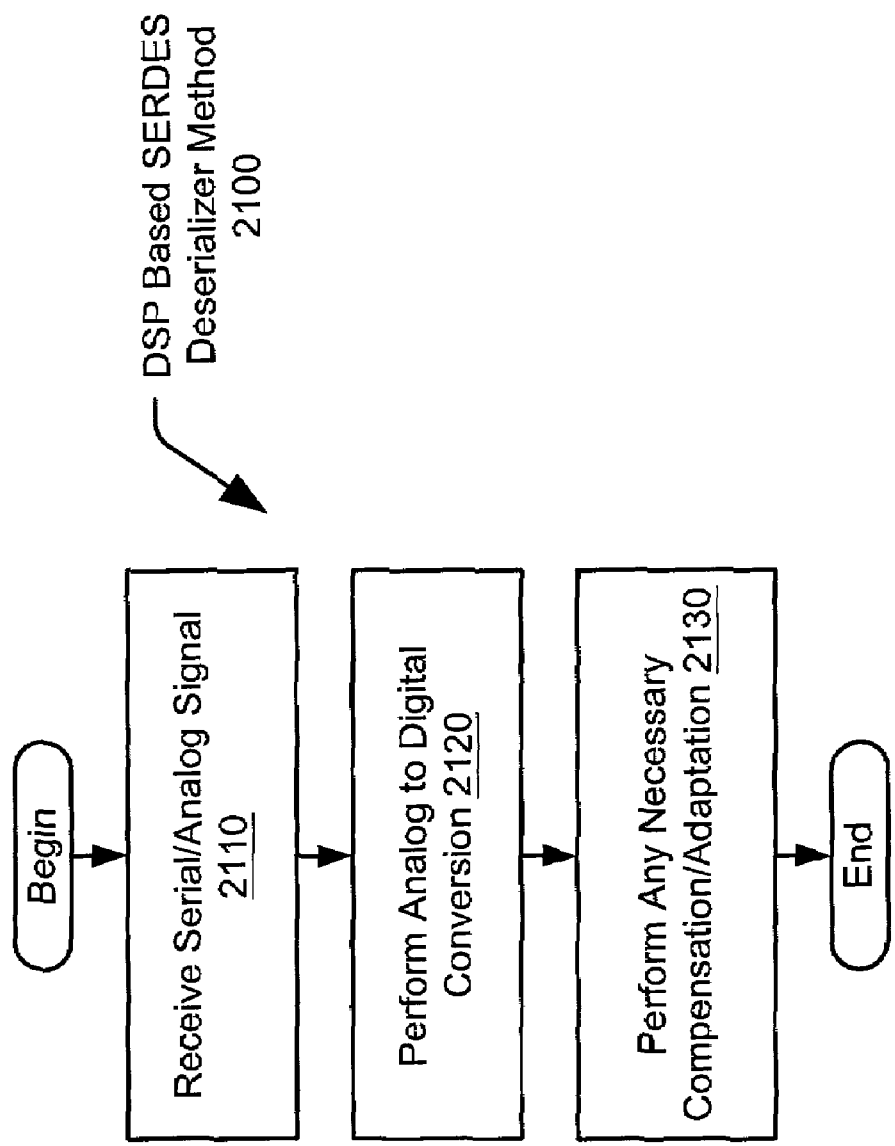
FIG. 21 is a functional block diagram illustrating an embodiment of a DSP based SERDES de-serializer method that is performed according to the present invention.

FIG. 21 is a functional block diagram illustrating an embodiment of a DSP based SERDES de-serializer method 2100 that is performed according to the present invention. In a block 2110, a serial/analog signal is received. Then, in a block 2120, analog to digital conversion is performed on the serial/analog signal that is received in the block 2110. After any analysis of the now-digitized signal, any necessary adaptation/compensation is performed in a block 2130. Before performing any necessary adaptation/compensation, as shown in the block 2130, it is first determined whether any adaptation/compensation needs to be performed at all. It may be that no adaptation/compensation need be performed at all, and the present invention is operable to accommodate this contingency as well.

Figure 22:
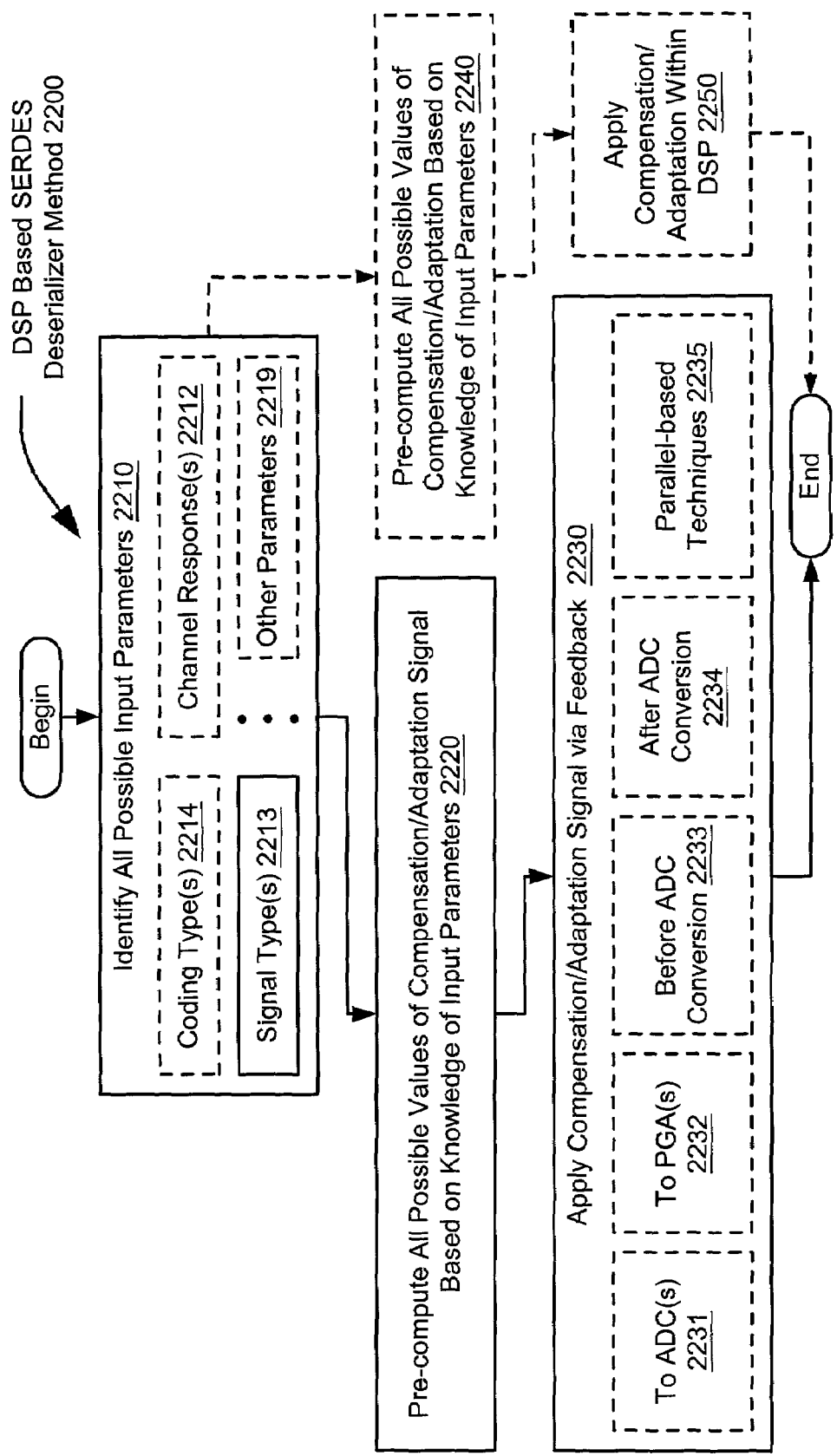
FIG. 22 is a functional block diagram illustrating another embodiment of a DSP based SERDES de-serializer method that is performed according to the present invention.

FIG. 22 is a functional block diagram illustrating another embodiment of a DSP based SERDES de-serializer method 2200 that is performed according to the present invention. In a block 2210, all possible input parameters that may affect an incoming serial analog data signal are identified. The identification of the possible input parameters 2210 includes identification of the input signal type 2213. In some embodiments, the identification of the possible input parameters 2210 includes identifying the coding types 2214 by which an input signal was encoded, the channel response 2212 of a communication link over which the input signal has come, as well as any other parameters 2219. Again, within the context of data communications applications, certain DSP-based techniques may be optimized to discern various information concerning the input signal and the communication channel over which the input signal has been transmitted.

Then, based upon this knowledge or foreknowledge of the input signal, and the communication channel over which the input signal has come, all possible values of feedback signal (that provides adaptation/compensation) are pre-computed in a block 2220. Then, in a block 2230, the adaptation/compensation is applied to the appropriate blocks via a feedback signal. The feedback signal may be applied to one or more ADCs (say to an ADC array) as shown in a functional block 2231, to one or more PGAs as shown in a functional block 2232. The feedback signal may be fed to a device residing before an ADC that performs analog to digital conversion 2233, or to a device residing after the ADC that performs analog to digital conversion 2234. Moreover, parallel based techniques may be employed according to the present invention to deliver this feedback signal, as shown in a functional block 2235.

Then, based upon this knowledge or foreknowledge of the input signal, and the communication channel over which the input signal has come, all possible values of adaptation/compensation may be pre-computed in a block 2240. Then, the adaptation/compensation is performed directly using a DSP, as shown in a functional block 2250.

In addition, it is also noted that some of the adaptation/compensation may be performed, in part, using a DSP and also performed, in part, using a device to which a feedback signal is provided. The present invention is adaptable to perform hybrid adaptation/compensation.

Figure 23:
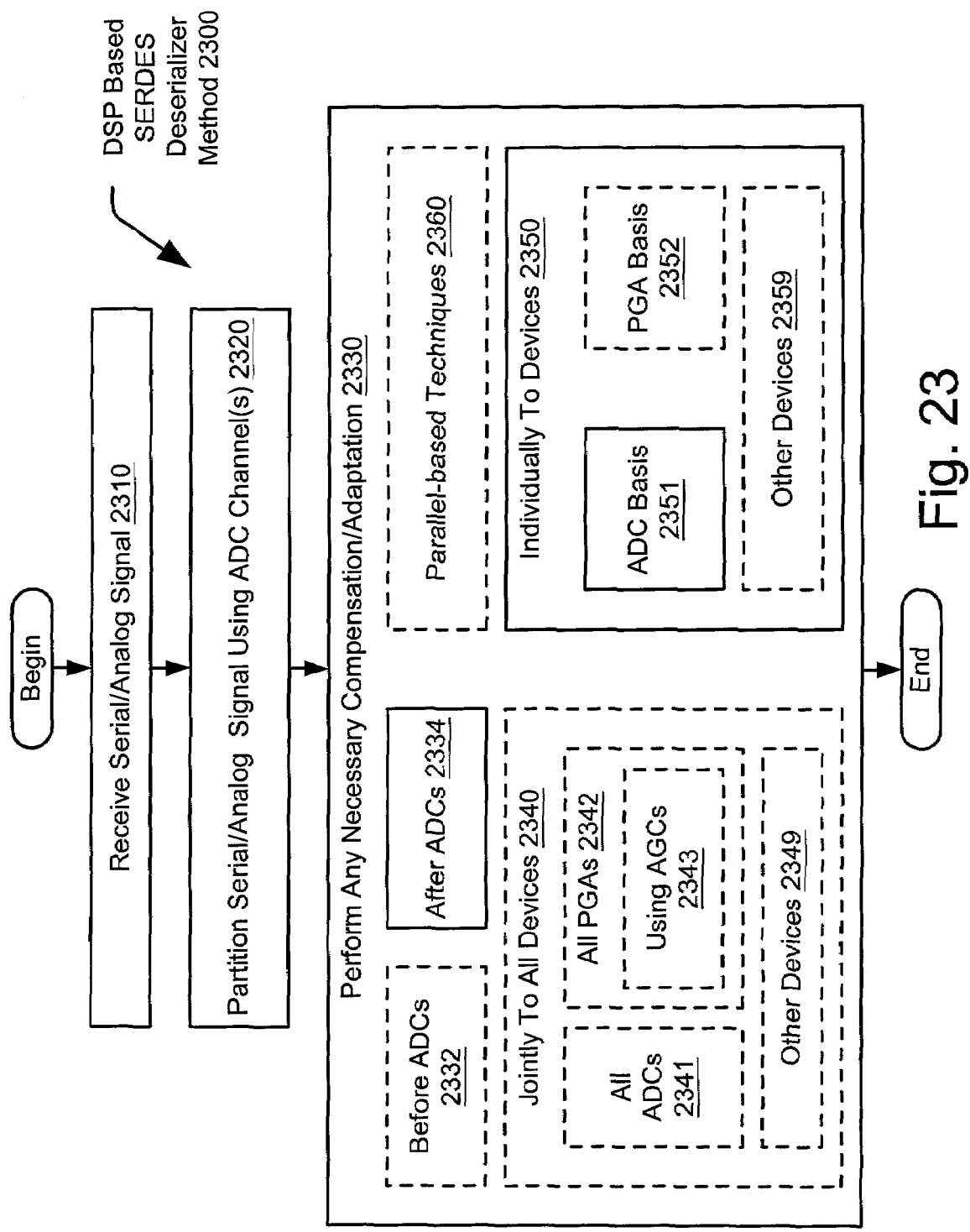
FIG. 23 is a functional block diagram illustrating another embodiment of a DSP based SERDES de-serializer method that is performed according to the present invention.

FIG. 23 is a functional block diagram illustrating another embodiment of a DSP based SERDES de-serializer method 2300 that is performed according to the present invention. In a block 2310, a serial/analog signal is received. Then, in a block 2320, the serial/analog signal is partitioned using a number of ADC channels. An ADC array, having a number of ADCs, is used to multiplex the various channels into which the signal is partitioned.

Then, in a block 2330, any necessary adaptation/compensation is performed. The necessary adaptation/compensation may be performed after one or more ADCs, as shown in a functional block 2334, and it may be performed individually to all of the devices, as shown in a functional block 2350. In the ADC array context, the necessary adaptation/compensation is performed on an ADC basis as shown in a functional block 2351. Alternatively, the necessary adaptation/compensation may also be performed before any ADCs, as shown in a functional block 2332.

The present invention is operable to perform the DSP based SERDES de-serializer method 2300 in a manner that any necessary adaptation/compensation may be performed to any number of devices, such as one a to one or more PGA basis (as shown in a functional block 2352), and it may also be performed individually to any other type of device 2359. The PGA basis 2352 may be performed using AGCs in certain embodiments. Alternatively, parallel based techniques 2360 may also be performed in doing the necessary adaptation/compensation. In addition, the necessary adaptation/compensation may also be performed jointly to all devices as if they are they were a single entity or device. This may be performed to all ADCs 2341, to all PGAs 2342 (perhaps using a number of AGCs as shown in a functional block 243), or alternatively to any other number of devices 2349 that are configured to operate as a single entity.

Figure 24:
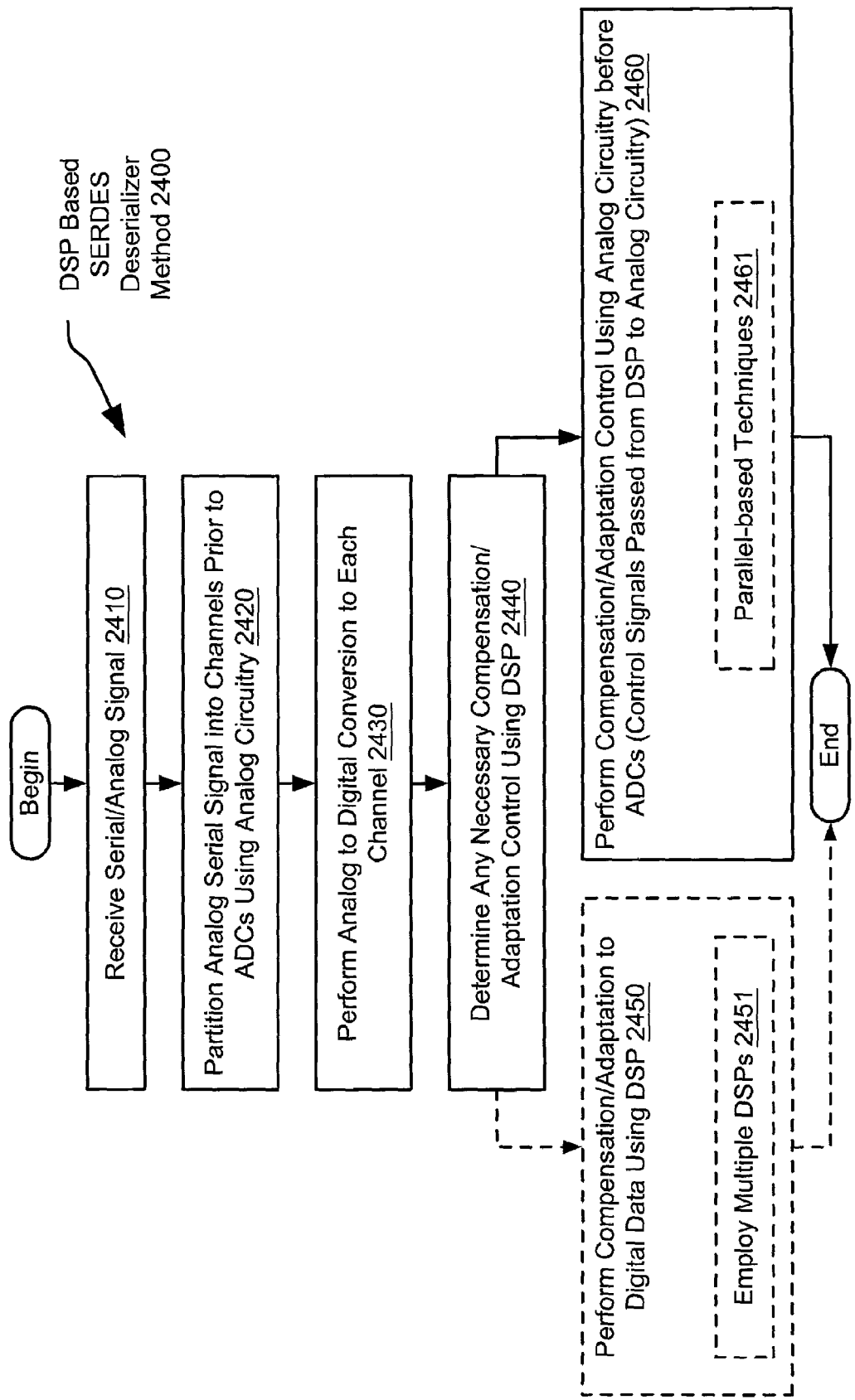
FIG. 24 is a functional block diagram illustrating another embodiment of a DSP based SERDES de-serializer method that is performed according to the present invention.

FIG. 24 is a functional block diagram illustrating another embodiment of a DSP based SERDES de-serializer method 2400 that is performed according to the present invention. In a block 2410, a serial/analog signal is received. Then, in a block 2420, the analog/serial signal is partitioned into a number of channels prior to performing any analog to digital conversion (prior to any ADCs) using analog circuitry. Then, in a block 2430, the analog to digital conversion is performed on each channel having one portion of the now-partitioned serial/analog signal.

In a block 2440, it is determined whether there is any necessary adaptation/compensation control needs to be performed using a DSP, after analyzing the now digital data in each of the various channels. In certain embodiments, the necessary adaptation/compensation control may be determined whether it should or can be performed before or after the analog to digital conversion of the serial/analog, channeled data. Then, in a block 2460, the compensation/determination is performed using analog circuitry that is situated before the ADCs of the various channels. The control signals, to each of the various ADCs, are passed from the DSP to the analog circuitry. If desired, the control to the analog circuitry is delivered using parallel based techniques.

Alternatively, the compensation/determination is performed using a DSP, as shown in a block 2450; the compensation/determination is performed by performing mathematical manipulation of the now-digital data. In addition, any number of multiple DSPs may also be employed, as shown in a functional block 2451.

Figure 25:
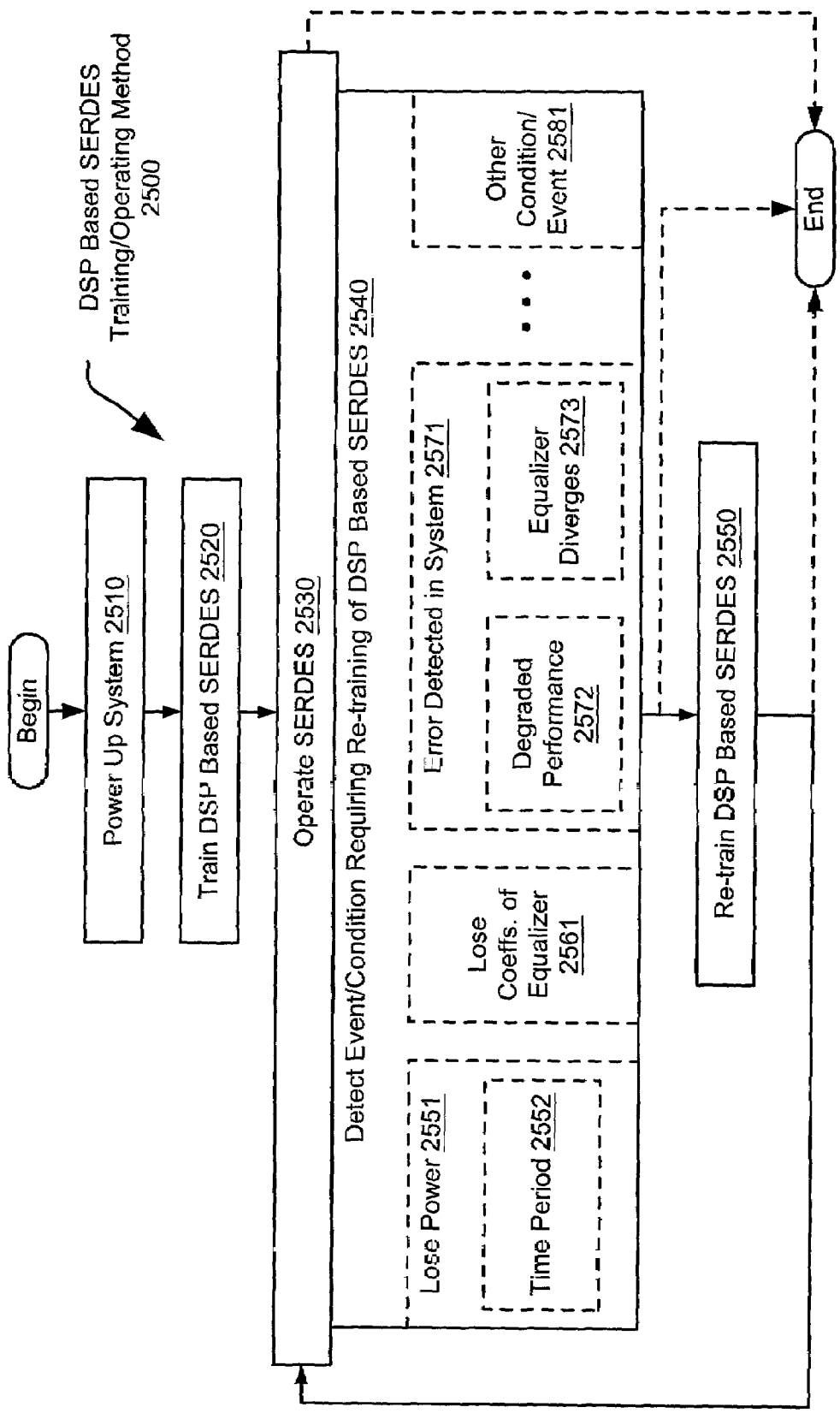
FIG. 25 is a functional block diagram illustrating an embodiment of a DSP based SERDES training/operating method that is performed according to the present invention.

FIG. 25 is a functional block diagram illustrating an embodiment of a DSP based SERDES training/operating method that is performed according to the present invention. In a block 2510, a system is powered up. The system includes at least one DSP based SERDES. In a block 2520, the DSP based SERDES is trained. The training includes calculating the coefficients of any equalization requirements, accommodating any ADCs, PGAs, or other circuitries that are employed in the system to deal with many of the deficiencies that may be present, as described above in many of the various embodiments, including gain, phase, offset, timing, and other deficiencies. Once the system is trained, the system may run indefinitely, for days, months, years, and so on. As shown in a block 2530, the DSP based SERDES is in an operation mode offering very high-speed operation of a SERDES that benefits from the advantages of DSP based parallel techniques in any of the embodiments described above and within the scope and spirit of the invention.

Then, once the DSP based SERDES is in an operational mode, any number of events and/or conditions may occur that would initiate a re-training of the DSP based SERDES. If no such event and/or condition occurs, then the DSP based SERDES will simply run indefinitely, as mentioned above. However, some situations necessitate the re-training of the DSP based SERDES to achieve desirable operation once again.

One such example that may be used to initiate the retraining of the DSP based SERDES includes a power loss in the system, as shown in a functional block 2551. This power loss may be determined as having been for a predetermined duration, as indicated in a functional block 2552. If desired, brief or nearly instantaneous power losses may be ignored, as desired in certain embodiments. Alternatively, after power losses of certain duration, an abbreviated re-training may be performed. In such situations, those system operational parameters that have a low likelihood of changing may be ignored, yet those parameters that are more volatile may be re-calculated, and those parts of the system may then be retrained, as shown in a functional block 2550. Then, once the DSP based SERDES is re-trained, the method returns to the operating mode of the DSP based SERDES, as shown in the functional block 2530. Alternatively, the method 2500 may end. The ending may be user controlled, or as controlled by the DSP based SERDES.

Another such example that may be used to initiate the retaining of the DSP based SERDES includes a loss of the coefficients of an equalizer that is employed in the system, as shown in a functional block 2561. Any number of techniques may be employed to detect a loss of the coefficients of any equalizer. Then, once the DSP based SERDES is re-trained, the method returns to the operating mode of the DSP based SERDES, as shown in the functional block 2530. Alternatively, the method 2500 may end. The ending may be user controlled, or as controlled by the DSP based SERDES.

Another such example that may be used to initiate the retraining of the DSP based SERDES includes a detection of an error in the system, as shown in a functional block 2571. Any number of error detection techniques, as understood by those persons having skill in the art, may be employed to detect an error in the system. The error detection may include degraded system performance (functional block 2572), where there is evidence of some change in the system that has contributed to compromised performance. Another situation is where the equalizer ceases to provide proper operation because the equalizer has diverged (functional block 2573), and it no longer converges or properly operates. Then, once the DSP based SERDES is re-trained, the method returns to the operating mode of the DSP based SERDES, as shown in the functional block 2530. Alternatively, the method 2500 may end. The ending may be user controlled, or as controlled by the DSP based SERDES.

Moreover, any other event and/or condition (functional block 2581) may be used to initiate the re-training of the DSP based SERDES. Examples of some other events and/or conditions include seemingly changed operating conditions, including environmental changes (including temperature, humidity) that have substantially altered the performance of the overall system.

Figure 26:
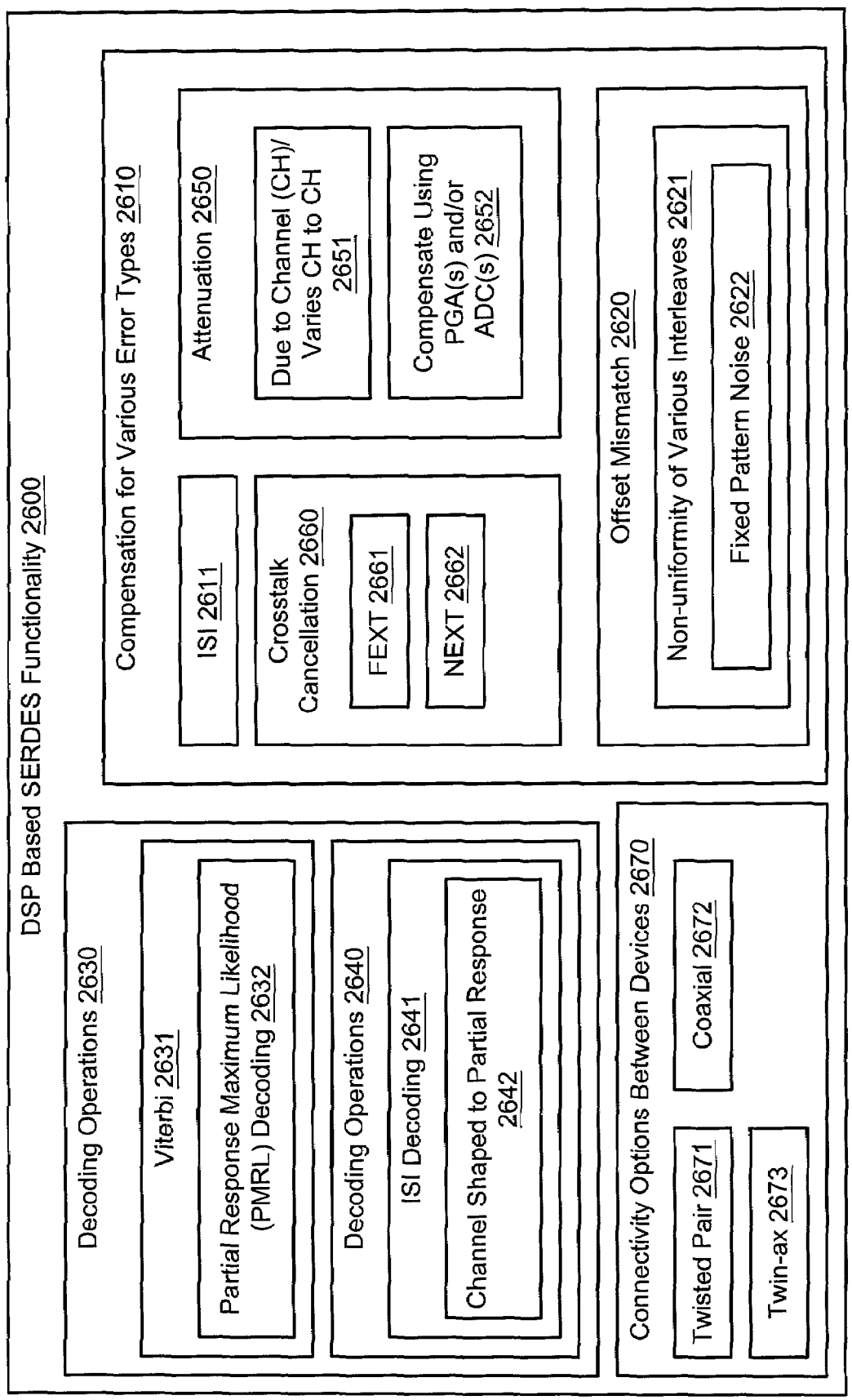
FIG. 26 is a diagram illustrating functionality that may be supported in any of the various embodiments of a DSP based SERDES that is built according to the present invention.

FIG. 26 is a diagram illustrating functionality 2600 that may be supported in any of the various embodiments of a DSP based SERDES that is built according to the present invention. The present invention is operable to perform a variety of decoding operations 2630 on digital data that is generated within any of the various embodiments described herein. For example, this decoding may be performed using Viterbi decoding 2631. The Viterbi decoding itself may also perform partial response maximum likelihood (PRML) decoding 2632. The decoding operations 2630 may also include decoding ISI 2641; the ISI itself may be generated from a channel that has been shaped by a partial response 2642 that is not a perfectly accurate characterization of the channel's response.

Moreover, it is noted that the SERDES based interfacing between devices may be performed using alternatively means as well, as shown by the connectivity options between devices 2670. For example, there may be other possibilities in which at least two devices may be communicatively coupled that may benefit from the present invention. Two devices may be communicatively coupled via twisted pair cabling 2671, coaxial cabling 2672, and/or twin-ax cabling 2673, among others.

Generically speaking, the compensation that may be performed according to the present invention includes a number of compensation types, many of which have been described herein. The present invention is able to compensate for various types of errors 2610, including ISI 2611, and attenuation 2650. The attenuation 2650 may be generated due to the variations among various channels (CHs) 2651, and it may be compensated using one or more PGAs and/or one or more ADCs 2652. Those persons having skill in the art will appreciate how the use of such devices may be used to compensate for such degradation of attenuation 2650.

Moreover, the present invention is operable to compensate for various types of crosstalk using crosstalk cancellation 2660. The crosstalk cancellation 2660 may be employed using a crosstalk canceller within any of the various transmitters, receivers, and/or transceivers that may be arranged and employed according to the present invention. The crosstalk cancellation 2660 may be performed to overcome the effects of NEXT 2662 and/or FEXT 2661.

In addition, various offsets mismatches 2620 of the different interleaved paths may need compensation, and the present invention is operable to overcome these effects as well. These offset mismatches 2620 may result due to non-uniformities of various interleaves 2621 in the various embodiments of the present invention. The non-uniformities of various interleaves 2621 may result in fixed pattern noise that must be addressed and may be substantially eliminated using the DSP compensation and correction techniques performed according to the present invention.

Various embodiments and aspects of the present invention have been described above. Some of the aspects are geared towards data communications applications. Those persons having skill in the art will recognize the extendibility of the present invention to any application where operational parameters and knowledge of the type of an incoming signal, the channel type, the channel response and other information may be discerned may also benefit from the various aspects of the present invention.

In view of the above detailed description of the invention and associated drawings, other modifications and variations will now become apparent to those skilled in the art. It should also be apparent that such other modifications and variations may be effected without departing from the spirit and scope of the invention.

What is claimed is:

1. A digital signal processing based serializer/de-serializer, comprising:
a receiver that includes an analog to digital converter and a digital signal processor, the digital signal processor is operably coupled to an output of the analog to digital converter;
wherein the analog to digital converter samples modulated serial data to generate digital samples of the modulated serial data; and
the digital signal processor adaptively determines compensation operations to be performed by the receiver on the digital samples of the modulated serial data so that the digital samples of the modulated serial data may be properly characterized to extract digital data contained therein, wherein a selected compensation operation of the compensation operations is selectively operable to be performed by the digital signal processor or by at least one additional module within receiver that is coupled to the digital signal processor.

2. The digital signal processing based serializer/de-serializer of claim 1, wherein the digital signal processing based serializer/de-serializer interfaces two devices communicatively coupled via at least one of a twisted pair cable, a coaxial cable, and a twin-ax cable.

3. The digital signal processing based serializer/de-serializer of claim 1, wherein the digital signal processing based serializer/de-serializer interfaces a first printed circuit board to a second printed circuit board.

4. The digital signal processing based serializer/de-serializer of claim 1, wherein the digital signal processing based serializer/de-serializer interfaces a first integrated circuit to a second integrated circuit.

5. The digital signal processing based serializer/de-serializer of claim 4, wherein the plurality of integrated circuits are situated on a printed circuit board.

6. The digital signal processing based serializer/de-serializer of claim 1, wherein at least one of the analog serial data and the digital data comprises fixed pattern noise.

7. The digital signal processing based serializer/de-serializer of claim 6, wherein the digital signal processor determines compensation to be performed to substantially eliminate the fixed pattern noise.

8. The digital signal processing based serializer/de-serializer of claim 6, wherein the fixed pattern noise is introduced during the digital sampling of the analog serial data by the analog to digital converter to generate the digital data.

9. The digital signal processing based serializer/de-serializer of claim 1, wherein the digital signal processor determines a compensation operation to be performed on the analog serial data.

10. The digital signal processing based serializer/de-serializer of claim 9, further comprising a programmable gain amplifier, communicatively coupled to the analog to digital converter; and
wherein the compensation operation comprises adjusting the gain of the programmable gain amplifier.

11. The digital signal processing based serializer/de-serializer of claim 10, further comprising an automatic gain control circuitry; and
wherein the automatic gain control circuitry adjusts the gain of the programmable gain amplifier.

12. The digital signal processing based serializer/de-serializer of claim 1, wherein the digital signal processor determines a compensation operation to be performed on the digital data.

13. The digital signal processing based serializer/de-serializer of claim 1, wherein the digital signal processing based serializer/de-serializer is implemented in a data communications application.

14. The digital signal processing based serializer/de-serializer of claim 1, further comprising a memory that comprises a plurality of compensation options;
wherein the digital signal processor selects at least one compensation option from the plurality of compensation options to ensure the proper characteristic of the digital data.

15. The digital signal processing based serializer/de-serializer of claim 1, wherein the proper characteristic of the digital data comprises at least one of a gain, a phase, and an offset.

16. The digital signal processing based serializer/de-serializer of claim 1, further comprising a transmitter and an interconnection; and
wherein the interconnection communicatively couples the transmitter and the receiver;
the transmitter transmits the serial data to the receiver via the interconnection;
the interconnection comprises a response that introduces an error into the serial data;
the digital signal processor determines the error introduced into the serial data by the response of the interconnection.

17. The digital signal processing based serializer/de-serializer of claim 1, wherein the proper characteristic of the digital data comprises at least one of a gain, a phase, and an offset; and
the digital signal processor determines at least one of an error in gain, an error in phase, and an error in offset that is introduced during the digital sampling of the incoming, serial data signal by the analog to digital converter.

18. The digital signal processing based serializer/de-serializer of claim 1, wherein the compensation determined by the digital signal processor comprises a compensation operation that comprises adjusting an operational parameter of the analog to digital converter.

19. The digital signal processing based serializer/de-serializer of claim 1, further comprising an analog circuitry located before and communicatively coupled to the analog to digital converter; and
wherein the compensation determined by the digital signal processor comprises a compensation operation that comprises adjusting an operational parameter of the analog circuitry.

20. The digital signal processing based serializer/de-serializer of claim 1, wherein the analog to digital converter comprises a plurality of analog to digital converters; and
each analog to digital converter within the plurality of analog to digital converters performs digital sampling of the incoming, serial data signal.

21. The digital signal processing based serializer/de-serializer of claim 20, each analog to digital converter within the plurality of analog to digital converters performs digital sampling of a clock cycle of the analog serial data at a different time.

22. The digital signal processing based serializer/de-serializer of claim 21, wherein the compensation determined by the digital signal processor comprises a compensation operation that comprises adjusting a first operational parameter of a first analog to digital converter within the plurality of analog to digital converters and a second operational parameter of a second analog to digital converter within the plurality of analog to digital converters.

23. The digital signal processing based serializer/de-serializer of claim 22, wherein the first operational parameter and the second operational parameter comprise a common operational parameter.

24. The digital signal processing based serializer/de-serializer of claim 22, wherein at least one of the first operational parameter and the second operational parameter comprises at least one of a gain, a phase, and an offset.

25. The digital signal processing based serializer/de-serializer of claim 1, wherein the analog to digital converter comprises a plurality of analog to digital converters;
the analog serial data is partitioned into a plurality of channels; and
each channel of the plurality of channels communicatively couples to one analog to analog to digital converter within the plurality of analog to digital converters.

26. The digital signal processing based serializer/de-serializer of claim 25, further comprising a plurality of programmable gain amplifiers;
the analog serial data is simultaneously fed to each programmable gain amplifier within the plurality of programmable gain amplifiers;
the outputs of the plurality of programmable gain amplifiers form the plurality of channels.

27. The digital signal processing based serializer/de-serializer of claim 1, wherein the analog to digital converter comprises a plurality of analog to digital converters;
the analog serial data is simultaneously fed to each analog to digital converter within the plurality of analog to digital converters.

28. The digital signal processing based serializer/de-serializer of claim 1, further comprising a precursor filter and an equalizer;
wherein the precursor filter is communicatively coupled to the analog to digital converter; and
the equalizer is communicatively coupled to the analog to digital converter.

29. The digital signal processing based serializer/de-serializer of claim 28, wherein the equalizer comprises at least one of a feed forward equalizer, a feedback equalizer, and a decision feedback equalizer.

30. The digital signal processing based serializer/de-serializer of claim 1, further comprising a decoder that is operable to decode the digital samples of the modulated serial data.

31. The digital signal processing based serializer/de-serializer of claim 30, wherein the decoder comprises at least one of a Viterbi decoder, a convolutional decoder, a block code decoder, and a trellis decoder.

32. The digital signal processing based serializer/de-serializer of claim 31, wherein the Viterbi decoder decodes inter-symbol interference within the modulated serial data.

33. The digital signal processing based serializer/de-serializer of claim 31, wherein the Viterbi decoder comprises a partial response maximum likelihood decoder.

34. The digital signal processing based serializer/de-serializer of claim 1, wherein the digital signal processing based serializer/de-serializer is operable to perform data communications at a speed higher than one Giga-bit per second.

35. The digital signal processing based serializer/de-serializer of claim 1, wherein the digital signal processing based serializer/de-serializer employs parallel processing compensation techniques.

36. The digital signal processing based serializer/de-serializer of claim 1, further comprising at least one additional digital signal processor that operates cooperatively with the digital signal processor.

37. The digital signal processing based serializer/de-serializer of claim 1, wherein the digital signal processor is operable to perform digital signal processing on the digital data to ensure the proper characteristic of the digital data.

38. The digital signal processing based serializer/de-serializer of claim 1, further comprising a crosstalk canceller communicatively coupled to the analog to digital converter; and
wherein the crosstalk canceller is operable to substantially eliminate at least one of near-end crosstalk and far-end crosstalk within the modulated serial data.

39. The digital signal processing based serializer/de-serializer of claim 1, wherein the receiver further comprises an analog front-end that comprises a plurality of interleaves; and
the digital signal processor performs adaptive compensation to overcome impairment generated by non-uniformity among the plurality of interleaves.

40. The digital signal processing based serializer/de-serializer of claim 39, wherein the analog front-end comprises a plurality of programmable gain amplifiers; and
the digital signal processor performs adaptive compensation to overcome impairment generated by non-uniformity among the programmable gain amplifiers.

41. The digital signal processing based serializer/de-serializer of claim 39, wherein the analog front-end comprises a plurality of analog to digital converters; and
the digital signal processor performs adaptive compensation to overcome impairment generated by non-uniformity among the plurality of analog to digital converters.

42. A transceiver, comprising:
a receiver comprising a plurality of analog to digital converters and a digital signal processor; and
wherein each analog to digital converter within the plurality of analog to digital converters digitally samples analog serial signal to generate digital data arranged across a plurality of channels, each channel of the plurality of channels extends from one analog to digital converter within the plurality of analog to digital converters; and
the digital signal processor adaptively determines a parallel based compensation and a parallel based operation to be performed to ensure a proper characteristic of the digital data, wherein the parallel based operation is selectively operable to be performed by the digital signal processor or by at least one additional module within receiver that is coupled to the digital signal processor.

43. The transceiver of claim 42, wherein the parallel based operation comprises adjusting an operational parameter of at least one analog to digital converter within the plurality of analog to digital converters.

44. The transceiver of claim 43, wherein operational parameter comprises at least one of a gain, an offset, and a phase.

45. The transceiver of claim 43, wherein the adjusting of the operational parameter comprises employing timing recovery.

46. The transceiver of claim 42, wherein proper characteristic of the digital data comprises at least one of a gain, a phase, and an offset.

47. The transceiver of claim 42, wherein the digital sampling of the analog serial signal introduces an error into the digital data.

48. The transceiver of claim 47, wherein the error comprises at least one of an error of gain, an error of phase, and an error of offset.

49. The transceiver of claim 47, wherein the error comprises fixed pattern noise.

50. The transceiver of claim 42, wherein the transceiver receives the analog serial signal via an interconnection; and
wherein the interconnection introduces an error into the analog serial signal.

51. The transceiver of claim 50, wherein the error comprises at least one of an error of inter-symbol interference, attenuation, crosstalk, and noise.

52. The transceiver of claim 42, wherein the analog serial signal is simultaneously fed to each analog to digital converter within the plurality of analog to digital converters.

53. The transceiver of claim 52, wherein the digital signal processor provides parallel based control individually to each analog to digital converter within the plurality of analog to digital converters.

54. The transceiver of claim 52, wherein the digital signal processor simultaneously provides a single control to each analog to digital converter within the plurality of analog to digital converters.

55. The transceiver of claim 42, wherein the analog serial signal is partitioned into a plurality of channels before being fed to the plurality of analog to digital converters.

56. The transceiver of claim 42, further comprising a plurality of programmable gain amplifiers;
wherein the analog serial signal is simultaneously fed to each programmable gain amplifier within the plurality of programmable gain amplifiers; and
each programmable gain amplifier within the plurality of programmable gain amplifiers communicatively couples to one analog to digital converter within the plurality of analog to digital converters.

57. The transceiver of claim 56, wherein the gain of at least one programmable gain amplifier within the plurality of programmable gain amplifiers is adjusted using automatic gain control.

58. The transceiver of claim 42, further comprising an equalizer.

59. The transceiver of claim 58, wherein the equalizer comprises at least one of a feed forward equalizer, a feedback equalizer, and a decision feedback equalizer.

60. The transceiver of claim 42, further comprising a decoder.

61. The transceiver of claim 60, wherein the decoder comprises at least one of a Viterbi decoder, a convolutional decoder, a block code decoder, and a trellis decoder.

62. The transceiver of claim 42, wherein the transceiver is operable to perform data communications at a speed higher than one Giga-bit per second.

63. The transceiver of claim 42, wherein the transceiver employs parallel processing compensation techniques.

64. The transceiver of claim 42, further comprising at least one additional digital signal processor that operates cooperatively with the digital signal processor.

65. The transceiver of claim 42, wherein the transceiver comprises further comprising at least one additional digital signal processor that operates cooperatively with the digital signal processor.

66. The transceiver of claim 42, wherein the transceiver is contained within a first board; and the integrated circuit is operable to perform serializer/deserializer data communications with a second board.

67. The transceiver of claim 42, wherein the transceiver is contained within an integrated circuit; and the integrated circuit is operable to perform serializer/deserializer data communications with a board.

68. The transceiver of claim 42, wherein the transceiver is contained within a first integrated circuit; and the integrated circuit is operable to perform serializer/deserializer data communications with a second integrated circuit.

69. The transceiver of claim 42, wherein the digital signal processor determines the parallel based compensation and the parallel based operation to be performed to ensure the proper characteristic of the digital data; and the digital signal processor performs the parallel based operation employing digital signal processing to the digital data.

70. The transceiver of claim 42, wherein the digital signal processor is operable to compensate for at least one of near-end crosstalk and far-end crosstalk within the analog serial signal.

71. The transceiver of claim 42, further comprising a crosstalk canceller communicatively coupled to the analog to digital converter; and wherein the crosstalk canceller is operable to substantially eliminate at least one of near-end crosstalk and far-end crosstalk within the analog serial signal.

72. The transceiver of claim 42, further comprising a decoder that is operable to decode the digital data.

73. The transceiver of claim 72, wherein the decoder comprises at least one of a Viterbi decoder, a convolutional decoder, a block code decoder, and a trellis decoder.

74. The transceiver of claim 73, wherein the Viterbi decoder decodes inter-symbol interference within the modulated serial data.

75. The transceiver of claim 73, wherein the Viterbi decoder comprises a partial response maximum likelihood decoder.

76. The transceiver of claim 42, wherein the transceiver further comprises an analog front-end that comprises a plurality of interleaves; and the digital signal processor performs adaptive compensation to overcome impairment generated by non-uniformity among the plurality of interleaves.

77. The transceiver of claim 76, wherein the analog front-end comprises a plurality of programmable gain amplifiers; and the digital signal processor performs adaptive compensation to overcome impairment generated by non-uniformity among the programmable gain amplifiers.

78. The transceiver of claim 76, wherein the analog front-end comprises a plurality of analog to digital converters; and the digital signal processor performs adaptive compensation to overcome impairment generated by non-uniformity among the plurality of analog to digital converters.

79. The transceiver of claim 42, further comprising wherein the transceiver interfaces to at least one additional device via at least one of a twisted pair cable, a coaxial cable, and a twin-ax cable.

80. A transceiver, comprising:

a receiver comprising a plurality of analog to digital converters and a digital signal processor; and wherein each analog to digital converter within the plurality of analog to digital converters sequentially samples analog serial signal to generate digital data arranged across a plurality of channels;

each channel of the plurality of channels extends from one analog to digital converter within the plurality of analog to digital converters;

the digital signal processor comprises at least one of a feedback equalizer and a decision feedback equalizer that is operable to adaptively identify error information that is used to determine a parallel based compensation and a parallel based operation to be performed to ensure a proper characteristic of the digital data;

the parallel based operation comprises adjusting an operational parameter of at least one analog to digital converter within the plurality of analog to digital converters; and the digital signal processor communicates feedback control individually to each analog to digital converter within the plurality of analog to digital converters.

81. The transceiver of claim 80, wherein operational parameter comprises at least one of a sampling rate, an offset, and a phase.

82. The transceiver of claim 80, wherein the adjusting of the operational parameter comprises employing timing recovery.

83. The transceiver of claim 80, wherein the analog serial signal comprises a plurality of band periods; and the sequential digital sampling of the analog serial signal, as performed by the plurality of analog to digital converters, spans the plurality of band periods.

84. The transceiver of claim 80, wherein the sequential digital sampling of the analog serial signal introduces an error into the digital data.

85. The transceiver of claim 84, wherein the error comprises at least one of an error of gain, an error of phase, and an error of offset.

86. The transceiver of claim 84, wherein the error comprises fixed pattern noise.

87. The transceiver of claim 80, wherein the transceiver receives the analog serial signal via an interconnection; and the interconnection introduces an error into the analog serial signal.

88. The transceiver of claim 87, wherein the error comprises at least one of an error of inter-symbol interference, attenuation, crosstalk, and noise.

89. The transceiver of claim 80, wherein the analog serial signal is partitioned into a plurality of channels before being fed to the plurality of analog to digital converters.

90. The transceiver of claim 80, further comprising a plurality of programmable gain amplifiers;

wherein the analog serial signal is simultaneously fed to each programmable gain amplifier within the plurality of programmable gain amplifiers; and each programmable gain amplifier within the plurality of programmable gain amplifiers communicatively couples to one analog to digital converter within the plurality of analog to digital converters.

91. The transceiver of claim 90, wherein the gain of at least one programmable gain amplifier within the plurality of programmable gain amplifiers is adjusted using automatic gain control.

92. The transceiver of claim 80, further comprising an equalizer.

93. The transceiver of claim 92, wherein the equalizer comprises at least one of a feed forward equalizer, a feedback equalizer, and a decision feedback equalizer.

94. The transceiver of claim 80, further comprising a decoder.

95. The transceiver of claim 94, wherein the decoder comprises at least one of a Viterbi decoder, a convolutional decoder, a block code decoder, and a trellis decoder.

96. The transceiver of claim 80, wherein the transceiver is operable to perform data communications at a speed higher than one Giga-bit per second.

97. The transceiver of claim 80, wherein the transceiver employs parallel processing compensation techniques.

98. The transceiver of claim 80, further comprising at least one additional digital signal processor that operates cooperatively with the digital signal processor.

99. The transceiver of claim 80, wherein the transceiver comprises further comprising at least one additional digital signal processor that operates cooperatively with the digital signal processor.

100. The transceiver of claim 80, wherein the transceiver is contained within a first board; and
the integrated circuit is operable to perform serializer/de-serializer data communications with a second board.

101. The transceiver of claim 80, wherein the transceiver is contained within an integrated circuit; and
the integrated circuit is operable to perform serializer/de-serializer data communications with a board.

102. The transceiver of claim 80, wherein the transceiver is contained within a first integrated circuit; and
the integrated circuit is operable to perform serializer/de-serializer data communications with a second integrated circuit.

103. The transceiver of claim 80, wherein the digital signal processor determines the parallel based compensation and the parallel based operation to be performed to ensure the proper characteristic of the digital data; and
the digital signal processor performs the parallel based operation employing digital signal processing to the digital data.

104. The transceiver of claim 80, further comprising a crosstalk canceller communicatively coupled to one analog to digital converter within the plurality of analog to digital converters; and
wherein the crosstalk canceller is operable to substantially eliminate at least one of near-end crosstalk and far-end crosstalk within the analog serial signal.

105. The transceiver of claim 80, further comprising a decoder that is operable to decode the digital data.

106. The transceiver of claim 105, wherein the decoder comprises at least one of a Viterbi decoder, a convolutional decoder, a block code decoder, and a trellis decoder.

107. The transceiver of claim 106, wherein the Viterbi decoder decodes inter-symbol interference within the modulated serial data.

108. The transceiver of claim 106, wherein the Viterbi decoder comprises a partial response maximum likelihood decoder.

109. The transceiver of claim 80, wherein the transceiver further comprises an analog front-end that comprises a plurality of interleaves; and
the digital signal processor performs adaptive compensation to overcome impairment generated by non-uniformity among the plurality of interleaves.

110. The transceiver of claim 109, wherein the analog front-end comprises a plurality of programmable gain amplifiers; and
the digital signal processor performs adaptive compensation to overcome impairment generated by non-uniformity among the programmable gain amplifiers.

111. The transceiver of claim 109, wherein the analog front-end comprises a plurality of analog to digital converters; and
the digital signal processor performs adaptive compensation to overcome impairment generated by non-uniformity among the plurality of analog to digital converters.

112. The transceiver of claim 80, further comprising wherein the transceiver interfaces to at least one additional device via at least one of a twisted pair cable, a coaxial cable, and a twin-ax cable.

113. A method to perform digital signal processing based de-serialization of analog serial signal, the method comprising:
receiving analog serial signal;
digitally sampling the analog serial signal to generate digital data;
analyzing the digital data to determine whether any compensation is required to ensure a proper characteristic of the digital data by employing digital signal processing techniques;
adaptively identifying a compensation operation when it is determined that compensation is required, the compensation operation being selected to ensure the proper characteristic; and
selectively providing compensation control to a device that is operable to perform the compensation operation, the device is selected as being a device that is operable to analyze the digital data, a device that is operable adaptively to identify the compensation operation, a device that is operable to process the analog serial signal, or another device that is operable to process the digital data.

114. The method of claim 113, wherein the compensation operation comprises a parallel based compensation operation.

115. The method of claim 113, wherein the compensation control comprises a parallel based compensation control.

116. The method of claim 113, wherein a digital signal processor analyzes the digital data.

117. The method of claim 113, further comprising identifying an error within the digital data.

118. The method of claim 117, wherein at least one of a feedback equalizer and a decision feedback equalizer identifies the error.

119. The method of claim 113, wherein the digitally sampling of the analog serial signal to generate digital data is performed using a plurality of analog to digital converters.

120. The method of claim 119, wherein the compensation control is provided individually to each analog to digital converter within the plurality of analog to digital converters.

121. The method of claim 113, wherein the device that is operable to perform the compensation operation comprises at least one of an analog to digital converter, a programmable gain amplifier, and a digital signal processor.

122. The method of claim 113, wherein an analog to digital converter performs the digital sampling of the analog serial signal to generate the digital data;
the device that is operable to perform the compensation operation comprises analog circuitry that is situated before the analog to digital converter; and
the analog serial signal passes through both the analog circuitry and the analog to digital converter.

123. The method of claim 113, wherein an analog to digital converter performs the digital sampling of the analog serial signal to generate the digital data;

the device that is operable to perform the compensation operation comprises digital signal processing circuitry that is situated after the analog to digital converter; and the analog serial signal passes through both the analog to digital converter and the digital signal processing circuitry.

124. The method of claim 113, wherein an analog to digital converter performs the digital sampling of the analog serial signal to generate the digital data;

the device that is operable to perform the compensation operation comprises both analog circuitry that is situated before the analog to digital converter and digital signal processing circuitry that is situated after the analog to digital converter;

the analog serial signal passes through the analog circuitry and the analog to digital converter;

the digital data passes through the digital signal processing circuitry.

125. The method of claim 113, further comprising pre-computing a plurality of possible compensation operation options before identifying the compensation operation; and selecting at least one compensation operation option from the plurality of possible compensation operation options.

126. The method of claim 113, further comprising partitioning the analog serial signal into a plurality of channels before digitally sampling the analog serial signal to generate digital data.

127. The method of claim 113, further comprising partitioning the analog serial signal into a plurality of channels during the digital sampling of the analog serial signal that generates the digital data.

128. The method of claim 113, further comprising compensating for at least one of near-end crosstalk and far-end crosstalk within the analog serial signal.

129. A method to perform digital signal processing based de-serialization of analog serial signal, the method comprising:

pre-computing a plurality of possible compensation operation options;

receiving analog serial signal;

digitally, sequentially sampling the analog serial signal to generate digital data using a plurality of interleaved analog to digital converters;

analyzing the digital data, using a digital signal processor, to adaptively determine whether any compensation is required to ensure a proper characteristic of the digital data by employing digital signal processing techniques;

selecting a compensation operation when it is determined that compensation is required, the compensation operation being selected to ensure the proper characteristic, the compensation operation being selected from the plurality of possible compensation operation options;

providing compensation control to a device that is operable to perform the compensation operation; and wherein the compensation, when required, is implemented by adjusting an operational characteristic of at least one analog to digital converter within the plurality of interleaved analog to digital converters.

130. The method of claim 129, wherein the compensation, when required, is implemented by also adjusting an operational characteristic of at least one of an analog circuitry and a digital signal processor.

131. The method of claim 130, wherein the analog circuitry that is situated before the plurality of interleaved analog to digital converters.

132. The method of claim 130, wherein digital signal processor is situated after the plurality of interleaved analog to digital converters.

133. The method of claim 129, further comprising compensating for at least one of near-end crosstalk and far-end crosstalk within the analog serial signal.

134. A digital signal processing based serializer/de-serializer, comprising:

a receiver that includes an analog to digital converter and a digital signal processor that is operably coupled to an output of the analog to digital converter;

wherein the analog to digital converter samples modulated serial data to generate digital samples of the modulated serial data;

the modulated serial data is provided to the receiver by a serializer/de-serializer transmitter across at least one of a trace on a printed circuit board and a backplane; and the digital signal processor demodulates the digital samples to extract the digital data contained therein, wherein the digital signal processor is selectively operable to perform at least one compensation operation on the digital samples or direct at least one additional module within receiver that is coupled to the digital signal processor to perform at least one compensation operation on the digital samples.

135. The digital signal processing based serializer/de-serializer of claim 134, wherein the digital signal processor adaptively determines compensation operations to be performed by the receiver on the digital samples of the modulated serial data so that the digital samples of the modulated serial data may be properly characterized to extract digital data contained therein.

136. The digital signal processing based serializer/de-serializer of claim 134, wherein the digital signal processing based serializer/de-serializer interfaces a first printed circuit board to a second printed circuit board.

137. The digital signal processing based serializer/de-serializer of claim 134, wherein the digital signal processing based serializer/de-serializer interfaces a first integrated circuit to a second integrated circuit.

138. The digital signal processing based serializer/de-serializer of claim 137, wherein the plurality of integrated circuits are situated on a printed circuit board.

139. The digital signal processing based serializer/de-serializer of claim 134, wherein at least one of the analog serial data and the digital data comprises fixed pattern noise.

140. The digital signal processing based serializer/de-serializer of claim 139, wherein the digital signal processor determines compensation to be performed to substantially eliminate the fixed pattern noise.

141. The digital signal processing based serializer/de-serializer of claim 139, wherein the fixed pattern noise is introduced during the digital sampling of the analog serial data by the analog to digital converter to generate the digital data.

142. The digital signal processing based serializer/de-serializer of claim 134, wherein the digital signal processor determines a compensation operation to be performed on the analog serial data.

143. The digital signal processing based serializer/de-serializer of claim 142, further comprising a programmable gain amplifier, communicatively coupled to the analog to digital converter; and wherein the compensation operation comprises adjusting the gain of the programmable gain amplifier.

144. The digital signal processing based serializer/de-serializer of claim 143, further comprising an automatic gain control circuitry; and
   wherein the automatic gain control circuitry adjusts the gain of the programmable gain amplifier.

145. The digital signal processing based serializer/de-serializer of claim 134, wherein the digital signal processor determines a compensation operation to be performed on the digital data.

146. The digital signal processing based serializer/de-serializer of claim 134, wherein the digital signal processing based serializer/de-serializer is implemented in a data communications application.

147. The digital signal processing based serializer/de-serializer of claim 134, further comprising a memory that comprises a plurality of compensation options;
   wherein the digital signal processor selects at least one compensation option from the plurality of compensation options to ensure the proper characteristic of the digital data.

148. The digital signal processing based serializer/de-serializer of claim 134, wherein the proper characteristic of the digital data comprises at least one of a gain, a phase, and an offset.

149. The digital signal processing based serializer/de-serializer of claim 134, further comprising a transmitter and an interconnection; and
   wherein the interconnection communicatively couples the transmitter and the receiver;
   the transmitter transmits the serial data to the receiver via the interconnection;
   the interconnection comprises a response that introduces an error into the serial data;
   the digital signal processor determines the error introduced into the serial data by the response of the interconnection.

150. The digital signal processing based serializer/de-serializer of claim 134, wherein the proper characteristic of the digital data comprises at least one of a gain, a phase, and an offset; and
   the digital signal processor determines at least one of an error in gain, an error in phase, and an error in offset that is introduced during the digital sampling of the incoming, serial data signal by the analog to digital converter.

151. The digital signal processing based serializer/de-serializer of claim 134, wherein the compensation determined by the digital signal processor comprises a compensation operation that comprises adjusting an operational parameter of the analog to digital converter.

152. The digital signal processing based serializer/de-serializer of claim 134, further comprising an analog circuitry located before and communicatively coupled to the analog to digital converter; and
   wherein the compensation determined by the digital signal processor comprises a compensation operation that comprises adjusting an operational parameter of the analog circuitry.

153. The digital signal processing based serializer/de-serializer of claim 134, wherein the analog to digital converter comprises a plurality of analog to digital converters; and
   each analog to digital converter within the plurality of analog to digital converters performs digital sampling of the incoming, serial data signal.

154. The digital signal processing based serializer/de-serializer of claim 153, each analog to digital converter within the plurality of analog to digital converters performs digital sampling of a clock cycle of the analog serial data at a different time.

155. The digital signal processing based serializer/de-serializer of claim 154, wherein the compensation determined by the digital signal processor comprises a compensation operation that comprises adjusting a first operational parameter of a first analog to digital converter within the plurality of analog to digital converters and a second operational parameter of a second analog to digital converter within the plurality of analog to digital converters.

156. The digital signal processing based serializer/de-serializer of claim 155, wherein the first operational parameter and the second operational parameter comprise a common operational parameter.

157. The digital signal processing based serializer/de-serializer of claim 155, wherein at least one of the first operational parameter and the second operational parameter comprises at least one of a gain, a phase, and an offset.

158. The digital signal processing based serializer/de-serializer of claim 134, wherein the analog to digital converter comprises a plurality of analog to digital converters;
   the analog serial data is partitioned into a plurality of channels; and
   each channel of the plurality of channels communicatively couples to one analog to analog to digital converter within the plurality of analog to digital converters.

159. The digital signal processing based serializer/de-serializer of claim 158, further comprising a plurality of programmable gain amplifiers;
   the analog serial data is simultaneously fed to each programmable gain amplifier within the plurality of programmable gain amplifiers;
   the outputs of the plurality of programmable gain amplifiers form the plurality of channels.

160. The digital signal processing based serializer/de-serializer of claim 134, wherein the analog to digital converter comprises a plurality of analog to digital converters;
   the analog serial data is simultaneously fed to each analog to digital converter within the plurality of analog to digital converters.

161. The digital signal processing based serializer/de-serializer of claim 134, further comprising a precursor filter and an equalizer;
   wherein the precursor filter is communicatively coupled to the analog to digital converter; and
   the equalizer is communicatively coupled to the analog to digital converter.

162. The digital signal processing based serializer/de-serializer of claim 161, wherein the equalizer comprises at least one of a feed forward equalizer, a feedback equalizer, and a decision feedback equalizer.

163. The digital signal processing based serializer/de-serializer of claim 134, further comprising a decoder that is operable to decode the digital samples of the modulated serial data.

164. The digital signal processing based serializer/de-serializer of claim 163, wherein the decoder comprises at least one of a Viterbi decoder, a convolutional decoder, a block code decoder, and a trellis decoder.

165. The digital signal processing based serializer/de-serializer of claim 164, wherein the Viterbi decoder decodes inter-symbol interference within the modulated serial data.

166. The digital signal processing based serializer/de-serializer of claim 164, wherein the Viterbi decoder comprises a partial response maximum likelihood decoder.

167. The digital signal processing based serializer/de-serializer of claim 134, wherein the digital signal processing based serializer/de-serializer is operable to perform data communications at a speed higher than one Giga-bit per second.

168. The digital signal processing based serializer/de-serializer of claim 134, wherein the digital signal processing based serializer/de-serializer employs parallel processing compensation techniques.

169. The digital signal processing based serializer/de-serializer of claim 134, further comprising at least one additional digital signal processor that operates cooperatively with the digital signal processor.

170. The digital signal processing based serializer/de-serializer of claim 134, wherein the digital signal processor is operable to perform digital signal processing on the digital data to ensure the proper characteristic of the digital data.

171. The digital signal processing based serializer/de-serializer of claim 134, further comprising a crosstalk canceller communicatively coupled to the analog to digital converter; and
  wherein the crosstalk canceller is operable to substantially eliminate at least one of near-end crosstalk and far-end crosstalk within the modulated serial data.

172. The digital signal processing based serializer/de-serializer of claim 134, wherein the receiver further comprises an analog front-end that comprises a plurality of interleaves; and
  the digital signal processor performs adaptive compensation to overcome impairment generated by non-uniformity among the plurality of interleaves.

173. The digital signal processing based serializer/de-serializer of claim 172, wherein the analog front-end comprises a plurality of programmable gain amplifiers; and
  the digital signal processor performs adaptive compensation to overcome impairment generated by non-uniformity among the programmable gain amplifiers.

174. The digital signal processing based serializer/de-serializer of claim 172, wherein the analog front-end comprises a plurality of analog to digital converters; and
  the digital signal processor performs adaptive compensation to overcome impairment generated by non-uniformity among the plurality of analog to digital converters.

175. A transceiver, comprising:
  a serializer/de-serializer receiver, that receives modulated serial data from a serializer/de-serializer transmitter, that includes a plurality of interleaved analog to digital converters and a digital signal processor, the digital signal processor being communicatively coupled to an output of the plurality of interleaved analog to digital converters;
  the plurality of interleaved analog to digital converters operate cooperatively to sample the modulated serial data to generate digital samples of the modulated serial data; and
  the digital signal processor demodulates the digital samples to extract digital data contained therein, and wherein:
  the digital signal processor is operable adaptively to determine a compensation operation to be performed on the modulated serial data or the digital samples so that the digital data contained within the digital samples may be properly extracted; and
  the compensation operation is selectively operable to be performed by the digital signal processor or by at least one additional module that is coupled to the digital signal processor.

176. A transceiver, comprising:
  a serializer/de-serializer receiver, that receives modulated serial data from a serializer/de-serializer transmitter, that includes a plurality of interleaved analog to digital converters and a digital signal processor, the digital signal processor being communicatively coupled to an output of the plurality of interleaved analog to digital converters;
  the plurality of interleaved analog to digital converters operate cooperatively to sample the modulated serial data to generate digital samples of the modulated serial data;
  the digital signal processor employs parallel processing techniques to compensate for non-uniformity among interleaves of the plurality of interleaved analog to digital converters, wherein a compensation operation corresponding to the parallel processing techniques is performed by the plurality of interleaved analog to digital converters as directed by the digital signal processor; and
  the digital signal processor demodulates the digital samples using parallel processing techniques to extract digital data contained therein.

177. A transceiver, comprising:
  a serializer/de-serializer receiver that includes a plurality of interleaved analog to digital converters and a digital signal processor, the digital signal processor being communicatively coupled to an output of the plurality of interleaved analog to digital converters;
  the plurality of interleaved analog to digital converters operate cooperatively to sample modulated serial data to generate digital samples of the modulated serial data;
  the digital signal processor employs parallel processing techniques to compensate for non-uniformity among interleaves of the plurality of interleaved analog to digital converters, wherein a parallel based operation corresponding to the parallel processing techniques is selectively operable to be performed by the digital signal processor or by the plurality of interleaved analog to digital converters as directed by the digital signal processor;
  the modulated serial data is provided to the serializer/de-serializer receiver by a serializer/de-serializer transmitter across at least one of a trace on a printed circuit board and a backplane; and
  the digital signal processor demodulates the digital samples using parallel processing techniques to extract digital data contained therein.

178. A transceiver, comprising:
  a serializer/de-serializer receiver that includes a plurality of interleaved analog to digital converters and a digital signal processor, the digital signal processor being communicatively coupled to an output of the plurality of interleaved analog to digital converters;
  the plurality of interleaved analog to digital converters operate cooperatively to sample modulated serial data to generate digital samples of the modulated serial data;
  the modulated serial data is provided to the serializer/de-serializer receiver by a serializer/de-serializer transmitter across at least one of a trace on a printed circuit board and a backplane;
  the digital signal processor is operable adaptively to determine a compensation operation to be performed on the modulated serial data or digital samples so that digital data contained within the digital samples may be properly extracted;

the compensation operation is selectively operable to be performed by the digital signal processor or by at least one additional module that is coupled to the digital signal processor; and the digital signal processor demodulates the digital samples to extract the digital data contained therein.

179. A transceiver, comprising:

a serializer/de-serializer receiver, that receives the modulated serial data from a serializer/de-serializer transmitter, that includes an analog to digital converter and a digital signal processor, the digital signal processor being communicatively coupled to an output of the analog to digital converter;

the analog to digital converter samples modulated serial data to generate digital samples of the modulated serial data;

the digital signal processor is operable adaptively to determine a compensation operation to be performed on the modulated serial data or digital samples so that digital data contained within the digital samples may be properly extracted;

the compensation operation is selectively operable to be performed by the digital signal processor or by at least one additional module that is coupled to the digital signal processor; and the digital signal processor demodulates the digital samples using parallel processing techniques to extract the digital data contained therein.

180. A transceiver, comprising:

a serializer/de-serializer receiver that includes an analog to digital converter and a digital signal processor, the digital signal processor being communicatively coupled to an output of the analog to digital converter; and wherein:

the analog to digital converter samples modulated serial data to generate digital samples of the modulated serial data;

the modulated serial data is provided to the serializer/de-serializer receiver by a serializer/de-serializer transmitter across at least one of a trace on a printed circuit board and a backplane;

the digital signal processor demodulates the digital samples using parallel processing techniques to extract the digital data contained therein; and the digital signal processor is operable adaptively to determine a compensation operation to be performed by the analog to digital converter so that digital data contained within the digital samples, that are generated from the modulated serial data, may be properly extracted from the digital samples.

181. A transceiver, comprising:

a serializer/de-serializer receiver, that receives modulated serial data from a serializer/de-serializer transmitter, that includes a plurality of interleaved analog to digital converters and a digital signal processor, the digital signal processor being communicatively coupled to an output of the plurality of interleaved analog to digital converters; and wherein:

the plurality of interleaved analog to digital converters operate cooperatively to sample the modulated serial data to generate digital samples of the modulated serial data;

the digital signal processor demodulates the digital samples using parallel processing techniques to extract the digital data contained therein; and the digital signal processor is operable adaptively to determine a compensation operation to be performed by the plurality of interleaved analog to digital converters so that digital data contained within the digital samples, that are generated from the modulated serial data, may be properly extracted there from.

182. A transceiver, comprising:

a serializer/de-serializer receiver including a digital signal processor being communicatively coupled to an output of the plurality of interleaved analog to digital converters; and wherein:

the plurality of interleaved analog to digital converters operate cooperatively to sample modulated serial data to generate digital samples of the modulated serial data;

the modulated serial data is provided to the serializer/de-serializer receiver by a serializer/de-serializer transmitter across at least one of a trace on a printed circuit board and a backplane;

the digital signal processor demodulates the digital samples using parallel processing techniques to extract the digital data contained therein; and a parallel based operation corresponding to the parallel processing techniques is selectively operable to be performed by the digital signal processor on the digital samples or by the plurality of interleaved analog to digital converters on the modulated serial data as directed by the digital signal processor so that digital data contained within the digital samples may be properly extracted there from by the digital signal processor.

183. A transceiver, comprising:

a serializer/de-serializer receiver, that receives modulated serial data from a serializer/de-serializer transmitter, that includes a plurality of interleaved analog to digital converters and a digital signal processor, the digital signal processor being communicatively coupled to an output of the plurality of interleaved analog to digital converters; and wherein:

the plurality of interleaved analog to digital converters operate cooperatively to sample the modulated serial data to generate digital samples of the modulated serial data;

the digital signal processor compensates for non-uniformity among interleaves of the plurality of interleaved analog to digital converters;

the digital signal processor demodulates the digital samples to extract the digital data contained therein; and a compensation operation is selectively operable to be performed by the digital signal processor on the digital samples or by the plurality of interleaved analog to digital converters on the modulated serial data so that digital data contained within the digital samples may be properly extracted there from by the digital signal processor.

184. A transceiver, comprising:

a serializer/de-serializer receiver that includes a plurality of interleaved analog to digital converters and a digital signal processor, the digital signal processor being communicatively coupled to an output of the plurality of interleaved analog to digital converters; and wherein:

the plurality of interleaved analog to digital converters operate cooperatively to sample modulated serial data to generate digital samples of the modulated serial data;

the digital signal processor compensates for non-uniformity among interleaves of the plurality of interleaved analog to digital converters;

the modulated serial data is provided to the serializer/de-serializer receiver by a serializer/de-serializer transmitter across at least one of a trace on a printed circuit board and a backplane;

the digital signal processor demodulates the digital samples to extract the digital data contained therein; and a compensation operation is selectively operable to be performed by the digital signal processor on the digital samples or by the plurality of interleaved analog to digital converters on the modulated serial data so that digital data contained within the digital samples may be properly extracted there from by the digital signal processor.

* * * * *